(12) United States Patent
Carver et al.

(10) Patent No.: US 10,903,015 B2
(45) Date of Patent: *Jan. 26, 2021

(54) CAPACITIVE ENERGY STORAGE DEVICE

(71) Applicant: Carver Scientific, Inc., Baton Rouge, LA (US)

(72) Inventors: David Reginald Carver, Baton Rouge, LA (US); Bradford Wesley Fulfer, Baton Rouge, LA (US); Chase Andrepont, Prairieville, LA (US); Sean Claudius Hall, Baton Rouge, LA (US); Sean William Reynolds, Baton Rouge, LA (US)

(73) Assignee: Carver Scientific, Inc., Baton Rouge, LA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/517,307

(22) Filed: Jul. 19, 2019

(65) Prior Publication Data
US 2019/0341194 A1    Nov. 7, 2019

Related U.S. Application Data

(63) Continuation of application No. 15/828,226, filed on Nov. 30, 2017, now Pat. No. 10,403,440.
(Continued)

(51) Int. Cl.
*H01G 4/38* (2006.01)
*H01G 4/012* (2006.01)
(Continued)

(52) U.S. Cl.
CPC ............. *H01G 4/385* (2013.01); *G11C 11/24* (2013.01); *H01G 4/012* (2013.01); *H01G 4/06* (2013.01);
(Continued)

(58) Field of Classification Search
CPC ............ H01G 4/385; H01G 4/38; H01G 4/06; H01G 4/012; H02J 7/345; B60L 11/005; G11C 11/24
See application file for complete search history.

(56) References Cited

U.S. PATENT DOCUMENTS 2,145,710 A    1/1939    Clark
2,778,762 A    1/1957    Eisler
(Continued)

FOREIGN PATENT DOCUMENTS

CA    2 908 178 A1    10/2014
CN    102438938        5/2012
(Continued)

OTHER PUBLICATIONS

"Aluminum Electrolytic Capacitors (Radial Lead Type)," Panasonic Mar. 2016, 3 pages.
(Continued)

*Primary Examiner* — David M Sinclair
(74) *Attorney, Agent, or Firm* — Klarquist Sparkman, LLP

(57) ABSTRACT

Capacitive energy storage devices (CESDs) are disclosed, along with methods of making and using the CESDs. A CESD includes an array of electrodes with spaces between the electrodes. A dielectric material occupies spaces between the electrodes; regions of the dielectric material located between adjacent electrodes define capacitive elements. The disclosed CESDs are useful as energy storage devices and/or memory storage devices.

20 Claims, 29 Drawing Sheets

Related U.S. Application Data

(60) Provisional application No. 62/458,426, filed on Feb. 13, 2017, provisional application No. 62/429,651, filed on Dec. 2, 2016.

(51) Int. Cl.
| | |
|---|---|
| *H01G 4/224* | (2006.01) |
| *H02J 7/34* | (2006.01) |
| *H01G 4/242* | (2006.01) |
| *H01G 4/232* | (2006.01) |
| *H01G 4/33* | (2006.01) |
| *G11C 11/24* | (2006.01) |
| *H01G 4/06* | (2006.01) |

(52) U.S. Cl.
CPC ............ *H01G 4/224* (2013.01); *H01G 4/232* (2013.01); *H01G 4/242* (2013.01); *H01G 4/33* (2013.01); *H02J 7/345* (2013.01)

(56) References Cited

U.S. PATENT DOCUMENTS

| | | | |
|---|---|---|---|
| 2,789,990 A | 4/1957 | Bullock | |
| 2,798,990 A | 7/1957 | Davis | |
| 2,939,059 A | 5/1960 | Gravley | |
| 3,288,728 A | 11/1966 | Gorham | |
| 3,342,754 A | 9/1967 | Gorham | |
| 3,397,085 A | 8/1968 | Cariou et al. | |
| 3,535,602 A | 10/1970 | Hrach et al. | |
| 3,616,314 A | 10/1971 | Settineri et al. | |
| 3,907,748 A | 9/1975 | Marvel et al. | |
| 4,333,418 A | 6/1982 | Nagel et al. | |
| 4,359,327 A | 11/1982 | Armand et al. | |
| 4,500,562 A | 2/1985 | Jahn et al. | |
| 4,532,369 A | 7/1985 | Harner | |
| 4,638,407 A | 1/1987 | Lundsgaard | |
| 4,649,468 A | 3/1987 | Cubbison | |
| 4,675,462 A | 6/1987 | Ungarelli et al. | |
| 4,734,533 A | 3/1988 | Ungarelli et al. | |
| 4,748,542 A | 5/1988 | Lundsgaard | |
| 4,769,505 A | 9/1988 | Lee et al. | |
| 4,795,838 A | 1/1989 | Bornengo et al. | |
| 4,806,702 A | 2/1989 | Lee et al. | |
| 4,816,608 A | 3/1989 | Bornengo et al. | |
| 4,849,559 A | 7/1989 | Lee et al. | |
| 4,853,488 A | 8/1989 | Ungarelli et al. | |
| 4,886,923 A | 12/1989 | Ungarelli et al. | |
| 4,942,061 A | 7/1990 | Domes | |
| 4,963,429 A | 10/1990 | Norian et al. | |
| 5,079,674 A | 1/1992 | Malaspina | |
| 5,110,903 A | 5/1992 | Lee et al. | |
| 5,144,529 A | 9/1992 | Takahashi | |
| 5,226,291 A | 11/1993 | Drnevich et al. | |
| 5,305,178 A | 4/1994 | Binder et al. | |
| 5,410,504 A | 4/1995 | Ward | |
| 5,636,100 A | 6/1997 | Zheng et al. | |
| 5,783,933 A | 7/1998 | Bailly | |
| 5,790,368 A | 8/1998 | Naito | |
| 6,096,234 A | 8/2000 | Nakanishi et al. | |
| 6,124,821 A | 9/2000 | Pezzini et al. | |
| 6,307,735 B1 | 10/2001 | Saito et al. | |
| 6,341,056 B1 | 1/2002 | Allman et al. | |
| 6,602,741 B1 | 8/2003 | Kudoh et al. | |
| 6,674,635 B1 | 1/2004 | Fife et al. | |
| 6,724,611 B1* | 4/2004 | Mosley | H01G 4/228 257/E27.116 |
| 6,765,778 B1 | 7/2004 | Du et al. | |
| 6,819,542 B2 | 11/2004 | Tsai et al. | |
| 6,956,417 B2 | 10/2005 | Bernstein et al. | |
| 6,999,297 B1* | 2/2006 | Klee | H01L 28/40 257/E21.008 |
| 7,033,406 B2 | 4/2006 | Weir et al. | |
| 7,117,044 B2 | 10/2006 | Kocher et al. | |
| 7,164,197 B2 | 1/2007 | Mao et al. | |
| 7,170,260 B2 | 1/2007 | Thrap | |
| 7,190,016 B2 | 3/2007 | Cahalen et al. | |
| 7,197,360 B1 | 3/2007 | Moulder et al. | |
| 7,279,777 B2 | 10/2007 | Bai et al. | |
| 7,327,551 B2 | 2/2008 | Chien et al. | |
| 7,342,755 B1 | 3/2008 | Horvat et al. | |
| 7,429,317 B2 | 9/2008 | Paul, II | |
| 7,446,365 B1 | 11/2008 | Heshami et al. | |
| 7,471,500 B1 | 12/2008 | Chen et al. | |
| 7,495,887 B2 | 2/2009 | Cox | |
| 7,542,265 B2 | 6/2009 | Tan et al. | |
| 7,560,796 B2 | 7/2009 | Shin et al. | |
| 7,561,407 B1 | 7/2009 | Chen et al. | |
| 7,781,358 B2 | 8/2010 | Hackenberger et al. | |
| 8,114,752 B2 | 2/2012 | Liang et al. | |
| 8,164,881 B2 | 4/2012 | Hu et al. | |
| 8,207,592 B2 | 6/2012 | Quinn | |
| 8,223,058 B2 | 7/2012 | Kobayashi et al. | |
| 8,252,487 B2 | 8/2012 | Dierichs et al. | |
| 8,270,209 B2 | 9/2012 | Herr et al. | |
| 8,289,676 B2 | 10/2012 | Giannantonio et al. | |
| 8,382,042 B2 | 2/2013 | Sanderson et al. | |
| 8,432,663 B2 | 4/2013 | Carver | |
| 8,525,487 B1 | 9/2013 | Stevenson | |
| 8,633,289 B2 | 1/2014 | Carver et al. | |
| 8,687,403 B1 | 4/2014 | Derhacobian et al. | |
| 8,750,024 B2 | 6/2014 | Bratkovski et al. | |
| 8,791,444 B2 | 7/2014 | Chin et al. | |
| 8,792,275 B2 | 7/2014 | Shih et al. | |
| 8,836,079 B2 | 9/2014 | Li et al. | |
| 8,940,850 B2 | 1/2015 | Carver et al. | |
| 9,011,627 B2 | 4/2015 | Carver | |
| 9,087,645 B2 | 7/2015 | Holme et al. | |
| 9,214,280 B2 | 12/2015 | Carver et al. | |
| 9,214,281 B2 | 12/2015 | Carver et al. | |
| 9,362,553 B2 | 6/2016 | Lahiri et al. | |
| 9,531,198 B2 | 12/2016 | Carver | |
| 10,403,440 B2* | 9/2019 | Carver | G11C 11/24 |
| 2002/0045107 A1* | 4/2002 | Holscher | H01L 21/76808 430/5 |
| 2002/0159306 A1 | 10/2002 | Hasegawa et al. | |
| 2003/0234415 A1* | 12/2003 | Chien | H01L 23/5223 257/303 |
| 2004/0140487 A1* | 7/2004 | Furumiya | H01L 23/5222 257/211 |
| 2004/0210289 A1 | 10/2004 | Wang et al. | |
| 2005/0029515 A1 | 2/2005 | Nagai et al. | |
| 2005/0058009 A1 | 3/2005 | Yang et al. | |
| 2005/0107870 A1 | 5/2005 | Wang et al. | |
| 2005/0143846 A1 | 6/2005 | Kocher et al. | |
| 2005/0181523 A1 | 8/2005 | Kijima | |
| 2005/0186437 A1 | 8/2005 | Pramanik | |
| 2006/0034035 A1 | 2/2006 | Maruo et al. | |
| 2006/0065045 A1 | 3/2006 | Borwick, III et al. | |
| 2006/0074164 A1 | 4/2006 | Slenes et al. | |
| 2006/0157770 A1* | 7/2006 | Park | H01G 4/30 257/303 |
| 2006/0182973 A1 | 8/2006 | Lee et al. | |
| 2006/0191443 A1 | 8/2006 | Yamaguchi et al. | |
| 2007/0108490 A1 | 5/2007 | Tan et al. | |
| 2007/0109716 A1* | 5/2007 | Martin | H01G 4/228 361/303 |
| 2007/0117886 A1 | 5/2007 | Tan et al. | |
| 2007/0232017 A1 | 10/2007 | Baniecki et al. | |
| 2007/0291439 A1 | 12/2007 | Yeh | |
| 2008/0007227 A1 | 1/2008 | Noda | |
| 2008/0011378 A1 | 1/2008 | Kozicki et al. | |
| 2008/0171230 A1 | 7/2008 | Zou et al. | |
| 2008/0180876 A1 | 7/2008 | Shimanouchi et al. | |
| 2008/0293864 A1 | 11/2008 | Tan et al. | |
| 2008/0304205 A1 | 12/2008 | Bang | |
| 2008/0316678 A1 | 12/2008 | Ehrenberg et al. | |
| 2009/0090999 A1 | 4/2009 | Carver | |
| 2009/0141423 A1 | 6/2009 | Lai | |
| 2009/0243536 A1 | 10/2009 | Whitehouse et al. | |
| 2009/0312474 A1 | 12/2009 | Tan et al. | |
| 2010/0002362 A1 | 1/2010 | Clelland et al. | |
| 2010/0033899 A1 | 2/2010 | Koh et al. | |

(56) References Cited

U.S. PATENT DOCUMENTS

| | | | |
|---|---|---|---|
| 2010/0044771 A1* | 2/2010 | Ahn | H01L 21/02194 257/315 |
| 2010/0079926 A1 | 4/2010 | Tan et al. | |
| 2010/0164067 A1 | 9/2010 | Sugisaki et al. | |
| 2010/0295153 A1* | 11/2010 | Chu | H01L 23/5223 257/532 |
| 2010/0302707 A1 | 12/2010 | Tan et al. | |
| 2010/0309605 A1* | 12/2010 | Lin | H01L 28/86 361/306.3 |
| 2011/0108950 A1* | 5/2011 | Jou | H01G 4/005 257/532 |
| 2011/0254132 A1 | 10/2011 | Cho | |
| 2012/0081022 A1 | 4/2012 | Moussakov et al. | |
| 2012/0081833 A1 | 4/2012 | Cao et al. | |
| 2012/0092806 A1 | 4/2012 | Hua et al. | |
| 2012/0127122 A1 | 5/2012 | Lim | |
| 2012/0154975 A1* | 6/2012 | Oakes | H01G 4/33 361/301.4 |
| 2012/0241085 A1 | 9/2012 | Carver | |
| 2012/0262841 A1 | 10/2012 | Terashima et al. | |
| 2012/0300360 A1 | 11/2012 | Take et al. | |
| 2013/0224397 A1 | 8/2013 | Carver | |
| 2013/0229157 A1 | 9/2013 | Carver | |
| 2013/0335880 A1 | 12/2013 | Masuda | |
| 2014/0049872 A1 | 2/2014 | Huang et al. | |
| 2014/0071732 A1 | 3/2014 | Khalili Amiri et al. | |
| 2014/0295101 A1 | 10/2014 | Carver | |
| 2015/0000090 A1 | 1/2015 | Carver | |
| 2015/0000833 A1 | 1/2015 | Carver | |
| 2015/0017342 A1 | 1/2015 | Carver | |
| 2015/0019802 A1 | 1/2015 | Kamal et al. | |
| 2015/0028279 A1 | 1/2015 | Hopstaken et al. | |
| 2015/0131198 A1 | 5/2015 | Carver et al. | |
| 2015/0131205 A1 | 5/2015 | Amaratunga et al. | |
| 2015/0206658 A1 | 7/2015 | Carver | |
| 2015/0206659 A1 | 7/2015 | Carver | |
| 2015/0235769 A1 | 8/2015 | Carver et al. | |
| 2015/0263754 A1 | 9/2015 | Srinivas et al. | |
| 2015/0270710 A1 | 9/2015 | Carver | |
| 2015/0370952 A1 | 12/2015 | Wang et al. | |
| 2016/0064153 A1 | 3/2016 | Carver et al. | |
| 2016/0071852 A1 | 3/2016 | Domingues Dos Santos et al. | |
| 2017/0133077 A1 | 5/2017 | Carver et al. | |

FOREIGN PATENT DOCUMENTS

| | | |
|---|---|---|
| DE | 10 2012 222704 | 6/2014 |
| EP | 1 251 530 | 10/2002 |
| EP | 1 786 006 | 5/2007 |
| EP | 2 264 727 | 12/2010 |
| EP | 2 278 675 | 1/2011 |
| GB | 811295 | 4/1959 |
| JP | S 54145000 A | 11/1979 |
| JP | S6157096 A | 3/1986 |
| JP | S62190828 A | 8/1987 |
| JP | 2001-086657 A | 3/2001 |
| JP | 2003-011270 | 1/2003 |
| JP | 2007-106875 A | 4/2007 |
| JP | 2007-329997 A | 12/2007 |
| JP | 2008-211060 A | 9/2008 |
| JP | 2008-281685 A | 11/2008 |
| JP | 2009/059990 | 3/2009 |
| JP | 2010177571 | 8/2010 |
| JP | 2011-029442 A | 2/2011 |
| JP | 2012080099 | 4/2012 |
| JP | 2012-222299 A | 11/2012 |
| WO | WO 2005/083726 A1 | 9/2005 |
| WO | WO 2008/082045 A1 | 7/2008 |
| WO | WO 2009/046341 A1 | 4/2009 |
| WO | WO 2009/061532 | 5/2009 |
| WO | WO 2014/035456 A2 | 3/2014 |
| WO | WO 2014/074122 A2 | 5/2014 |
| WO | WO 2014/161007 A2 | 10/2014 |

OTHER PUBLICATIONS

"Boost Converter," https://en.wikipedia.org/wiki/Boost_converter, 7pp., accessed Nov. 12, 2015.

"Buck Converter," <https://en.wikipedia.org/wiki/Buck_converter, 16pp., accessed Nov. 12, 2015.

"Carver EESD Product Overviews," Carver Scientific, Inc., 2017, 1 page.

"Charge pump," https://en.wikipedia.org/wiki/Charge_pump, 4pp., accessed Nov. 12, 2015.

"Electric Double Layer Capacitors (Gold Capacitor), Series: HL," Panasonic, Jan. 2015, 1 page.

"Electric Double Layer Capacitors (Stacked Coin Type), Series: SG," Panasonic, Aug. 2016, 14 pages.

"Gold Capacitors—Electric Double Layer Capacitors" Product Catalog, Panasonic, A, 14 pages.

"Sample and hold," <http://en.wikipedia.org/wiki/Sample_and_hold, 3 pp., accessed Nov. 12, 2015.

Definition for dielectric materials: http://whatis.techtarget.com/definition/dielectric-material (downloaded Jul. 28, 2014).

Extended European Search Report issued for European Application No. 08835074.9 (dated Jul. 4, 2016).

Extended European Search Report issued for European Application No. 12888103.4 dated Jun. 9, 2016 (8 pages).

Extended European Search Report issued for European Application No. 14774940.2 (dated Feb. 24, 2017).

Final Office Action from the U.S. Patent and Trademark Office for U.S. Appl. No. 12/245,665 (dated Aug. 15, 2012).

Final Office Action from the U.S. Patent and Trademark Office for U.S. Appl. No. 14/490,873 (dated Jun. 4, 2015).

Ihn et al., "Dielectric functions of Cd(1-x)Mg(x)Te Alloy Films by Using Spectroscopic Ellipsometry," *Journal of Korean Physical Society*, vol. 43, No. 4, pp. 634-637 (2003).

*Intel and Micron Produce Breakthrough Memory Techonology*, Intel Corporation, 7 pp., Jul. 28, 2015.

International Preliminary Report on Patentability and Written Opinion for PCT/US2014/033102 (dated Oct. 8, 2015).

International Search Report and Written Opinion from International Application No. PCT/US2008/078808, dated Feb. 25, 2009.

International Search Report and Written Opinion issued for International Application No. PCT/US2012/072337 (dated Mar. 5, 2013).

International Search Report issued for International Application No. PCT/US2014/033102 (dated Oct. 8, 2014).

International Search Report and Written Opinion issued for International Application No. PCT/US2015/065679, dated Mar. 21, 2016.

International Search Report and Written Opinion issued for International Application No. PCT/US2016/060453, dated Mar. 9, 2017.

International Search Report and Written Opinion of the International Searching Authority for PCT Patent Application No. PCT/US2017/064043 dated May 2, 2018.

International Search Report and Written Opinion, dated Dec. 20, 2016, issued in corresponding International Application No. PCT/US2015/065677.

Japanese Office Action (English-language translation) issued by JPO for JP 2015-540650 (dated Sep. 6, 2016).

Notification of Reexamination (with English-language translation) from the State Intellectual Property Office of the People's Republic of China for Application No. CN 200880119265.6, dated Nov. 15, 2014 (19 pages).

Notification of the Decision of Rejection (with English-language translation) from the State Intellectual Property Office of the People's Republic of China for Application No. CN 200880119265.6, dated Feb. 5, 2013 (20 pages).

Office Action (English-language translation) from the Japanese Patent Office for Application No. 2010-528177, dated Nov. 19, 2012 (9 pages).

Office Action (with English-language translation) from the State Intellectual Property Office of the People's Republic of China for Application No. CN 200880119265.6, dated Jul. 20, 2011 (9 pages).

(56) References Cited

OTHER PUBLICATIONS

Office Action (with English-language translation) from the State Intellectual Property Office of the People's Republic of China for Application No. CN 200880119265.6, dated May 11, 2012 (18 pages).
Office Action from the U.S. Patent and Trademark Office for U.S. Appl. No. 14/156,457 (dated Aug. 1, 2014).
Office Action from the U.S. Patent and Trademark Office for U.S. Appl. No. 12/245,665 (dated Dec. 7, 2011).
Office Action from the U.S. Patent and Trademark Office for U.S. Appl. No. 13/853,712 (dated Sep. 17, 2014).
Office Action from the U.S. Patent and Trademark Office for U.S. Appl. No. 14/490,873 (dated Jan. 15, 2015).
Office Action from the U.S. Patent and Trademark Office for U.S. Appl. No. 14/490,873 (dated Jun. 4, 2015).
Office Action from the U.S. Patent and Trademark Office for U.S. Appl. No. 14/574,175 (dated Nov. 17, 2017).
Office Action from the U.S. Patent and Trademark Office for U.S. Appl. No. 14/780,270 (dated Feb. 24, 2017).
Office Action from the U.S. Patent and Trademark Office for U.S. Appl. No. 14/668,768 (dated May 25, 2017).
Office Action from the U.S. Patent and Trademark Office for U.S. Appl. No. 14/668,779 (dated May 19, 2017).
Wang et al., "On the energy conversion and efficiency of a dielectric electroactive polymer generator," *Applied Physics Letters*, Jul. 16, 2012, 101(3): 33904.
Written Opinion for Singapore Application No. 11201503442V, dated Nov. 16, 2015.
Office Action, dated Aug. 27, 2019, issued in Japan Patent Application No. 2017-528416.
Office Action, dated Aug. 27, 2019, issued in Japan Patent Application No. 2017-530171.
Office Action, dated Oct. 23, 2019, issued in U.S. Appl. No. 16/517,266.
Office Action, dated Sep. 25, 2019, issued in U.S. Appl. No. 16/517,347.

* cited by examiner

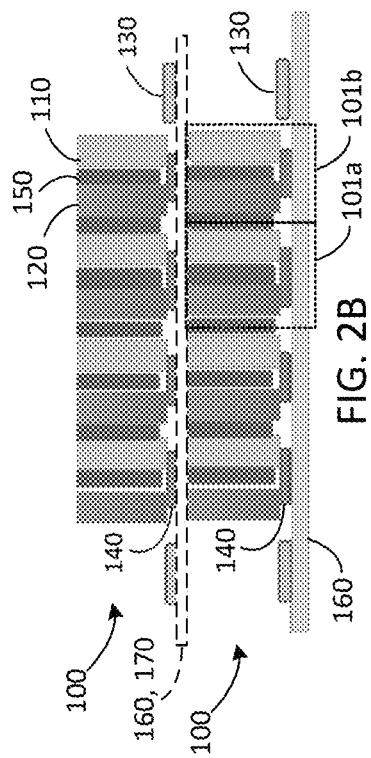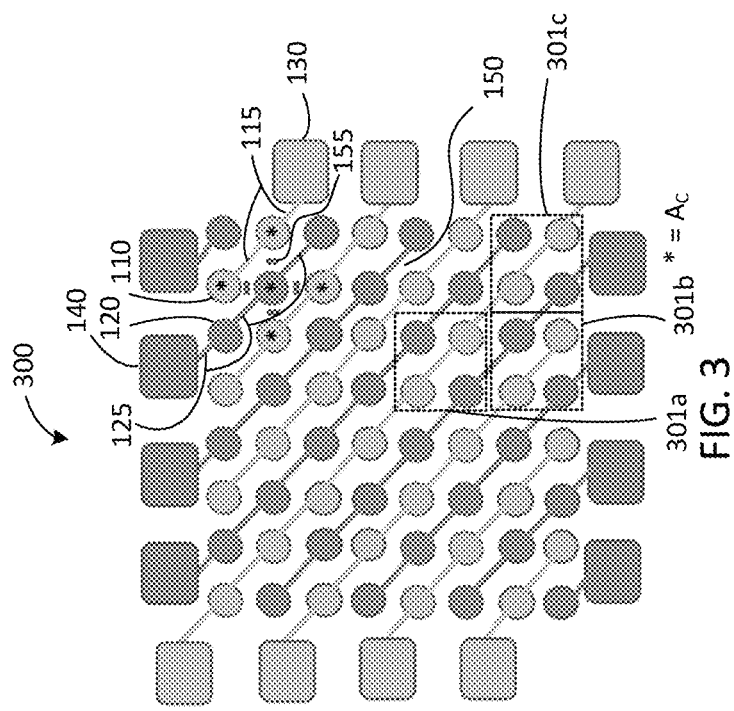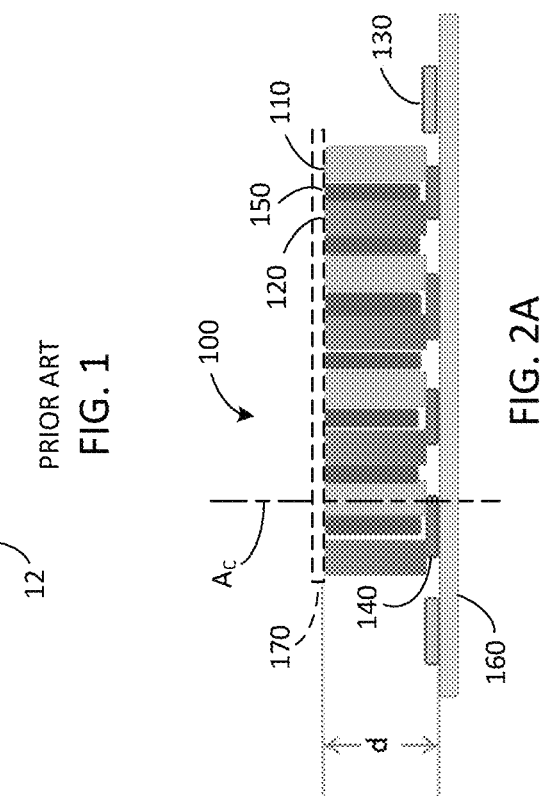

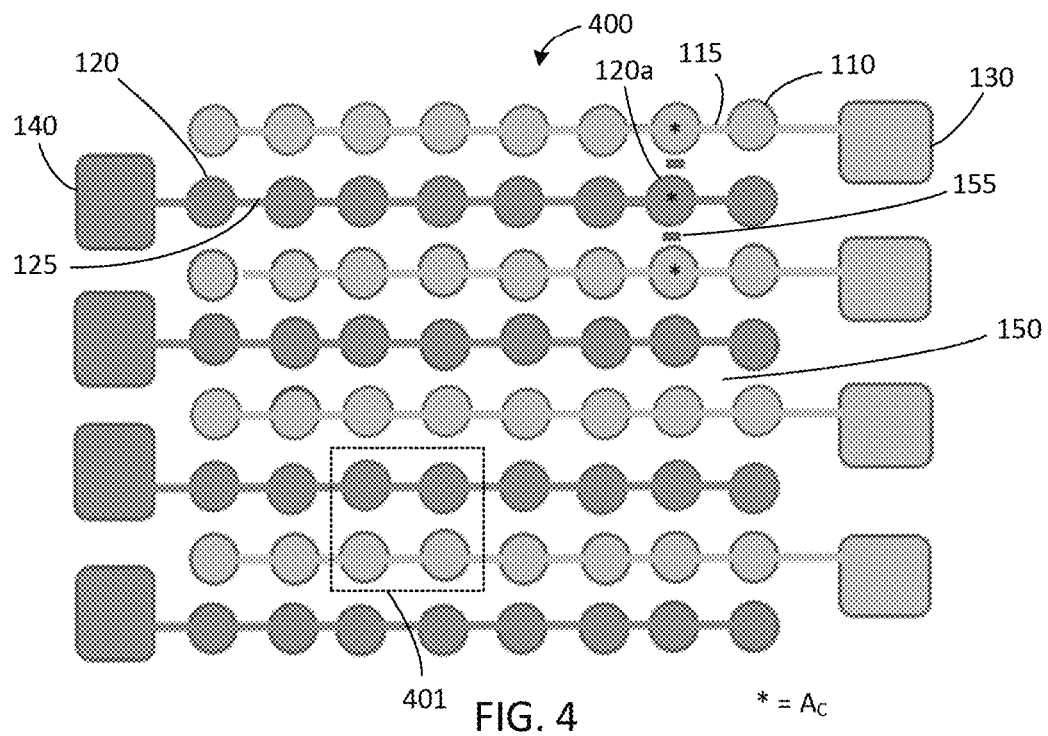
FIG. 4     * = $A_C$
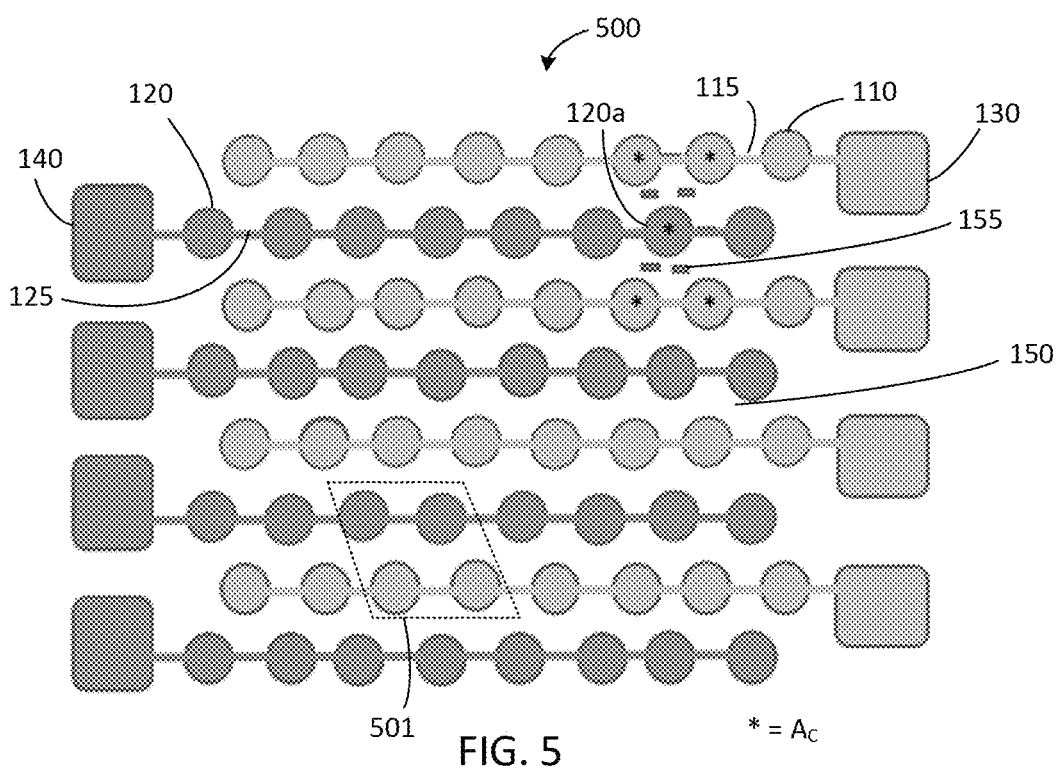
FIG. 5     * = $A_C$

* = $A_C$

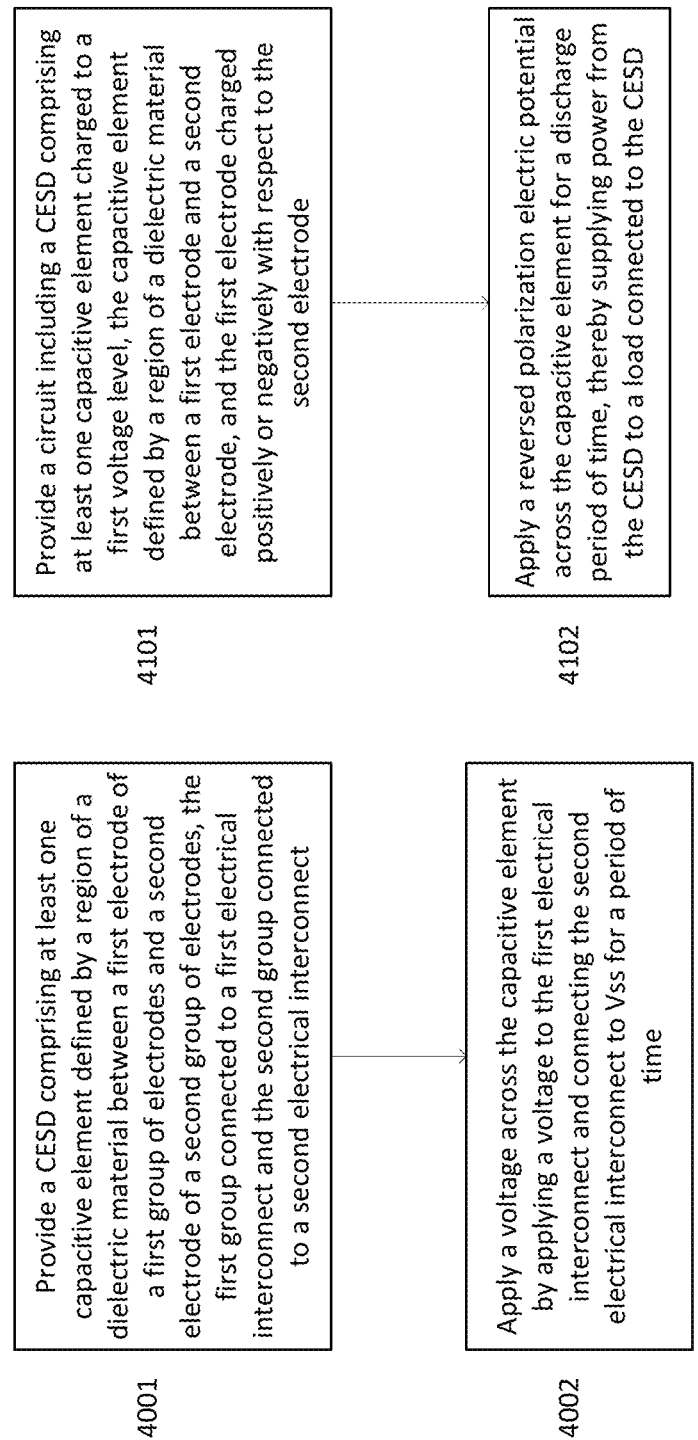

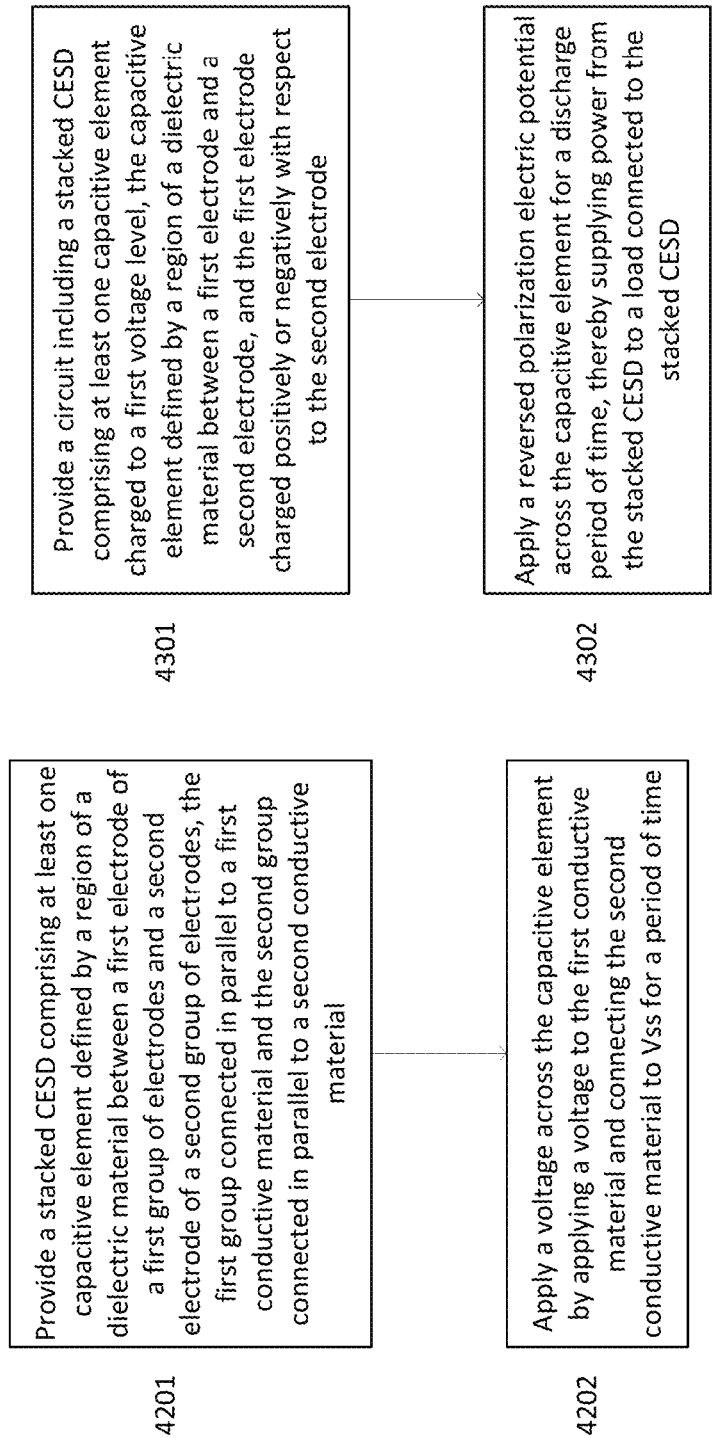

CAPACITIVE ENERGY STORAGE DEVICE

CROSS REFERENCE TO RELATED APPLICATIONS

This application is a continuation of U.S. application Ser. No. 15/828,226, filed Nov. 30, 2017, now U.S. Pat. No. 10,403,440, which claims the benefit of U.S. Provisional Application No. 62/429,651, filed Dec. 2, 2016, and U.S. Provisional Application No. 62/458,426, filed Feb. 13, 2017, each of which is incorporated by reference herein in its entirety.

FIELD

This disclosure concerns embodiments of a capacitive energy storage device and methods for making and using the device.

BACKGROUND

Use of capacitors as energy storage and/or memory storage devices entails the storage of electrical energy in the form of charge using conductive electrodes. As a method of energy storage, electrostatic capacitors have excelled at the speed with which they can accumulate and discharge energy. In general the charge and discharge mechanisms for traditional electrostatic energy storage in a dielectric material is in a time-domain regime of picoseconds to hundreds of microseconds. Utilization of the storage of charge by a capacitive element in computer memory storage is the basis of much of the memory storage for both flash memory (ROM, Read Only Memory) and DRAM (Dynamic Random Access Memory).

A need exists for capacitive energy storage devices that include a plurality of capacitive elements and have the versatility to be used as energy storage and/or memory storage devices.

SUMMARY

Embodiments of capacitive energy storage devices (CESDs) are disclosed, along with methods of making and using the CESDs. A CESD includes a planar array of electrodes with spaces between the electrodes, the array comprising n groups of electrodes in one or more planes, where n is an integer greater than or equal to 2. A dielectric material occupies spaces between the electrodes and contacts the electrodes, wherein regions of the dielectric material located between adjacent electrodes define capacitive elements.

In one embodiment, the CESD is a stacked CESD and the array comprises n groups of spaced-apart parallel electrodes forming n stacked parallel planes of parallel electrodes, each electrode having a central axis parallel to the plane in which the electrode is located. The parallel electrodes in each plane may be rotated from 0-90° relative to the parallel electrodes in each adjacent plane. In any or all of the foregoing embodiments, the CESD may have a quadrilateral configuration defining four side edges, wherein each electrode has an end protruding from one side edge of the CESD, and the CESD further comprises a conductive material applied to two or more side edges of the CESD and in contact with the ends of electrodes protruding from the side edges to which the conductive material is applied. In any or all of the foregoing embodiments, the electrodes may comprise wires having sinuous curves or wires including periodic protrusions along a length of the wire.

In an independent embodiment, the array comprises aligned rows of electrodes, each row constituting a group of electrodes. In another independent embodiment, the array comprises staggered rows of electrodes, each row constituting a group of electrodes. In an independent embodiment, the array comprises staggered rows of the electrodes, each row further comprising a row electrical interconnect connecting a group of alternating electrodes in the row in series, and groups of staggered electrodes not connected by the row electrical interconnect are connected in columns by column electrical interconnects, the column electrical interconnects being offset from the central axes of the staggered electrodes, wherein there is a vertical spatial separation at each intersection where a row electrical interconnect crosses a column electrical interconnect. In another independent embodiment, the array comprises a grid pattern of rows and columns of electrodes, wherein each row comprises electrodes of a row group alternating with electrodes of a plurality of column groups; each row group further comprises a row electrical interconnect connecting each electrode of the row group in series; and each column group further comprises a column electrical interconnect connecting each electrode of the column group in series, wherein there is a vertical spatial separation at each intersection where a row electrical interconnect crosses a column electrical interconnect. In any of the foregoing embodiments, the CESD may further include (i) an insulative layer disposed between the row electrical interconnects and the column electrical interconnects such that the row electrical interconnects are above the insulative layer and the column electrical interconnects are below the insulative layer; and (ii) a via defined by the insulative layer for each electrode of the row group, the via connecting the electrode to the row electrical interconnect.

In some embodiments, a CESD comprises a unit cell, the unit cell comprising (i) a plurality of electrodes at least forming a shape of a polygon with an electrode at each vertex of the polygon; (ii) a number of electrical interconnects equal to a number of electrodes in the unit cell, each electrical interconnect connected to a single electrode in the unit cell, wherein there is a vertical spatial separation at each intersection of two or more electrical interconnects; and (iii) a dielectric material occupying spaces between the electrodes, wherein regions of the dielectric material located between adjacent electrodes define capacitive elements. The unit cell may further include an electrode at a center of the polygon. In any or all of the foregoing embodiments, the CESD may further include an insulative layer disposed between intersecting electrical interconnects, and a via defined by the insulative layer to connect an electrical interconnect above the insulative layer to an electrode below the electrical interconnect and insulative layer. In some embodiments, the CESD comprises an array of the unit cells. Collinear electrodes of a corresponding position in two or more unit cells may be connected in series through an electrical interconnect.

In any or all of the above embodiments, the electrodes may have a central axis-to-central axis spacing between adjacent electrodes within a range of 5 nm to 5 mm. In any or all of the above embodiments in which each electrode has a central axis $A_C$ perpendicular to the plane, (i) each electrode may have a height along the central axis of from 5 nm to 12000 μm; (ii) each electrode in a group of electrodes may have substantially the same height along the central axis;

(iii) each electrode in the array may have substantially the same height along the central axis; or (iv) any combination of (i), (ii), and (iii).

In an independent embodiment, a CESD includes two or more electrodes disposed in a co-spiral arrangement with spaces between the electrodes, wherein the two or more electrodes do not intersect one another; and a dielectric material occupying the spaces between the electrodes. In another independent embodiment, a CESD includes a first electrode; a second electrode wrapped in a spiral configuration around the first electrode, wherein there is a space between the first electrode and the second electrode; a dielectric material occupying the space between the first electrode and the second electrode and in contact with the first electrode and the second electrode; and optionally a third electrode having a tubular configuration surrounding the first and second electrodes, wherein there is a space between the third tubular electrode and the second electrode, the space filled with the dielectric material, wherein regions of the dielectric material located between the electrodes define capacitive elements. Additional layers of alternating polarity can be optionally constructed as described.

In another independent embodiment, a stacked CESD includes a first electrode, a second parallel to and spaced apart from the first electrode, thereby forming a space between the first and second electrodes, and a stacked arrangement of alternating layers of a dielectric material and a conductive material disposed parallel to the first and second electrodes and occupying the space between the first and second electrodes. The stacked arrangement includes x layers of a dielectric material, wherein (i) x is an integer greater than or equal to two, (ii) a first layer of the dielectric material is in direct contact with the first electrode, and (iii) layer x of the dielectric material is in direct contact with the second electrode; and y layers of a conductive material, wherein $y=x-1$ and a layer of the conductive material is positioned between each pair of adjacent layers of the dielectric material. In an independent embodiment, the stacked CESD is a tubular stacked CESD wherein (i) the first electrode has a cylindrical configuration, an inwardly facing surface, an outwardly facing surface, and an outer diameter; (ii) the second electrode has a cylindrical configuration, an inwardly facing surface, an outwardly facing surface, and an inner diameter that is greater than the outer diameter of the first electrode; and (iii) the stacked arrangement is disposed between the outwardly facing surface of the first electrode and the inwardly facing surface of the second electrode in concentric alternating layers of the dielectric material and the conductive material.

A method for making a CESD includes forming an array of electrodes at least partially embedded within or in contact with a dielectric material with spaces between the electrodes, the array of electrodes comprising n groups of electrodes arranged in one or more planes, where n is an integer greater than or equal to 2. In one embodiment, the array of electrodes is formed and the dielectric material is disposed in the spaces between the electrodes. In an independent embodiment, a layer of dielectric material is formed, and electrodes are at least partially embedded in the dielectric material or placed in contact with the dielectric material to form the array of electrodes. In an independent embodiment, a method for making a CESD includes (a) providing a first electrode; (b) forming a stacked arrangement of alternating layers of a dielectric material and a conductive material by (i) applying a layer of a dielectric material to a surface of the first electrode, (ii) applying a layer of a conductive material onto the layer of the dielectric material, and (iii) applying a subsequent layer of the dielectric material onto the layer of the conductive material; and (c) applying a second electrode in contact with an outermost layer of the stacked arrangement; the method may further include sequentially repeating steps (ii) and (iii) to provide additional alternating layers of the dielectric material and the conductive material, the additional alternating layers terminating with a layer of the dielectric material such that the stacked arrangement includes x layers of the dielectric material alternating with y layers of the conductive material, wherein x is an integer greater than or equal to 2 and $y=x-1$.

Embodiments of the disclosed CESDs are useful as energy storage devices and/or memory storage devices. In some embodiments, a method of using a CESD includes providing a CESD as disclosed herein and applying a voltage across a capacitive element disposed between two adjacent electrodes, wherein the capacitive element is a region of the dielectric material located between the adjacent electrodes, thereby charging the capacitive element to a voltage V1. In some embodiments, the method further includes supplying energy from the CESD to a load by providing a circuit including the CESD and a load connected to the CESD, wherein the capacitive element is charged to the voltage V1, and applying a reversed polarization electric potential across the capacitive element for a discharge period of time, wherein the reversed polarization electric potential is less than the voltage V1 and less than a voltage that would be generated by the capacitive element in a high impedance state, thereby supplying power from the capacitive element to the load.

In some embodiments, the CESD is a memory device, and the capacitive element has a logic state determined by the voltage applied across the capacitive element. In one embodiment, using the memory device comprising the CESD includes writing to the memory device by applying a voltage across a capacitive element disposed between an electrode of a first group of electrodes and an adjacent electrode of a second group of electrodes, wherein the capacitive element is a region of the dielectric material located between the electrode of the first group and the adjacent electrode of the second group, thereby charging the capacitive element to a voltage V1. The method may further include reading the memory device by connecting one of a first electrical interconnect connected to the first group of electrodes and a second electrical interconnect connected to the second group of electrodes to a high impedance sensor, connecting the other of the first electrical interconnect and the second electrical interconnect to Vss, and reading the voltage V1 of the capacitive element with the high impedance sensor. A memory device comprising a CESD may be refreshed by (i) charging a capacitive element in the CESD to a voltage V1, wherein the voltage V1 discharges, at least in part, due to leakage over time; (ii) subsequently determining a capacitance C of the capacitive element; (iii) determining, based on the capacitance C, the voltage V1; and (iv) recharging the capacitive element to the voltage V1.

In any or all of the above embodiments, the dielectric material may be a fluid having a viscosity greater than or equal to 0.5 cP. In any or all of the above embodiments, the dielectric material may be an electroentropic dielectric material that has a relative permittivity greater than 3.9. In any or all of the above embodiments, the conductive material may be a carbonaceous material, a metal, a conductive polymer, or a combination thereof.

The foregoing and other objects, features, and advantages of the invention will become more apparent from the following detailed description, which proceeds with reference to the accompanying figures.

BRIEF DESCRIPTION OF THE DRAWINGS

In the following drawings, unless otherwise specified, any apparent gaps between elements (e.g., between electrodes and dielectric material) are shown for clarity purposes only and are not present in the actual device.

FIG. 1 is a cross-sectional side view of a multilayer capacitor.

FIG. 2A is a cross-sectional side view of an exemplary capacitive energy storage device (CESD).

FIG. 2B is a cross-sectional side view of two CESDs according to FIG. 2A arranged in a stack.

FIG. 3 is a top plan view of a CESD comprising an array of electrodes arranged in an aligned grid pattern, each diagonal row constituting a group of electrodes.

FIG. 4 is a top plan view of a CESD comprising an array of electrodes arranged in an aligned grid pattern, each row constituting a group of electrodes.

FIG. 5 is a top plan view of a CESD comprising an array of electrodes arranged staggered rows, each row constituting a group of electrodes.

In FIG. 26C, there is a plane/plane offset of the electrodes; in FIG. 26D, the electrodes are vertically aligned.

FIG. 40 is a flow diagram of a generalized method of charging a CESD as disclosed herein.

FIG. 41 is a flow diagram of a generalized method of supplying energy from a CESD as disclosed herein to a load.

FIG. 42 is a flow diagram of a generalized method of charging a stacked CESD as disclosed herein.

FIG. 43 is a flow diagram of a generalized method of supplying energy from a stacked CESD as disclosed herein to a load.

DETAILED DESCRIPTION

Figure 6:
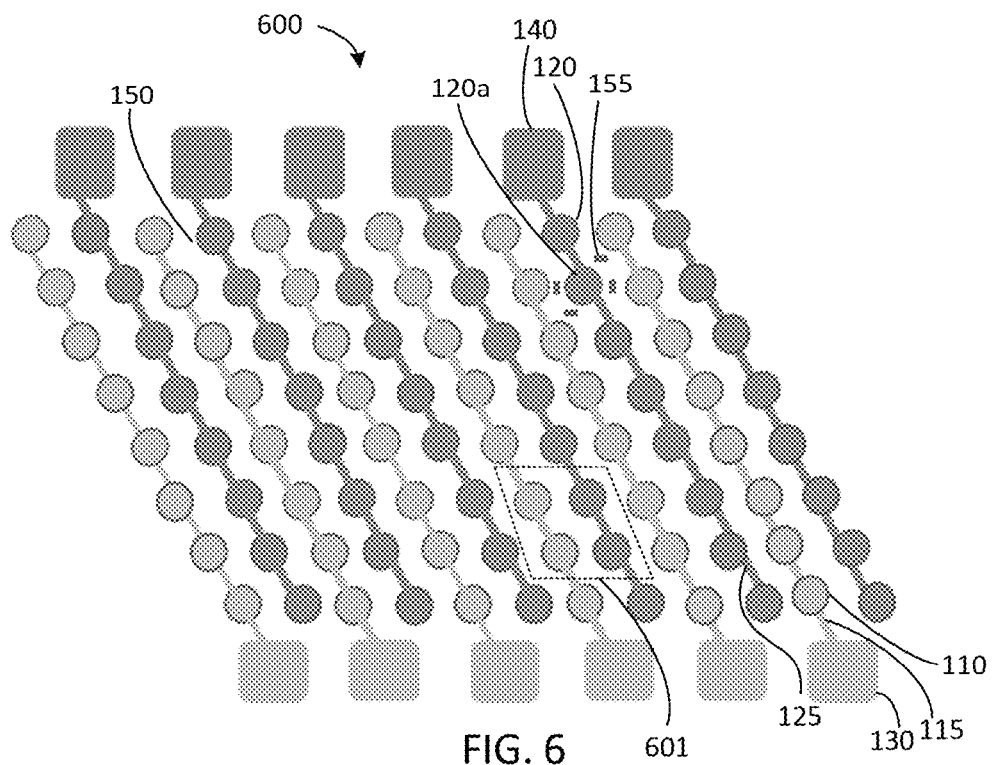
FIG. 6 is a top plan view of a CESD comprising an array of electrodes arranged in offset diagonal rows, each row constituting a group of electrodes.

Embodiments of capacitive energy storage devices (CESDs) and methods of making and uses using such devices are disclosed. Embodiments of the disclosed devices include a plurality of electrodes and a plurality of capacitive elements. The CESDs can be used as energy storage devices and/or as ROM and/or RAM memory devices for retention of information in digital format. The CESDs disclosed herein have increased ability to store charge and also discharge the stored electrical energy to provide a greater energy density (energy per unit volume) and specific energy (energy per unit mass) than previously known and manufactured devices.

I. Definitions

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, voltages, temperatures, times, and so forth, as used in the specification or claims are to be understood as being modified by the term "about." Accordingly, unless otherwise indicated, implicitly or explicitly, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

In order to facilitate review of the various embodiments of the disclosure, the following explanations of specific terms are provided:

Array: An orderly arrangement, e.g., of rows, columns, or a regularly repeating pattern.

Capacitance: The ability of a body to store an electrical charge. Capacitance is defined as $$C = \frac{Q}{V},$$

where Q is charge (coulombs) and V is potential (volts). Capacitance is typically expressed in farads, where 1 F=1 C/V.

Capacitive element: As used herein, the term "capacitive element" refers to a region of a dielectric material located between two adjacent electrodes that are not serially connected.

CESD: Capacitive energy storage device.

Coplanar: The term "coplanar" is an adjective describing two or more objects, each object having at least one surface located on a common geometric plane. Thus, electrodes that are disposed on a single planar substrate or carrier are coplanar. Similarly, electrical interconnects that are disposed on a common insulative layer, disposed atop a plurality of coplanar electrodes of substantially the same height, and/or occupy the same geometric plane in space are coplanar.

Figure 18:
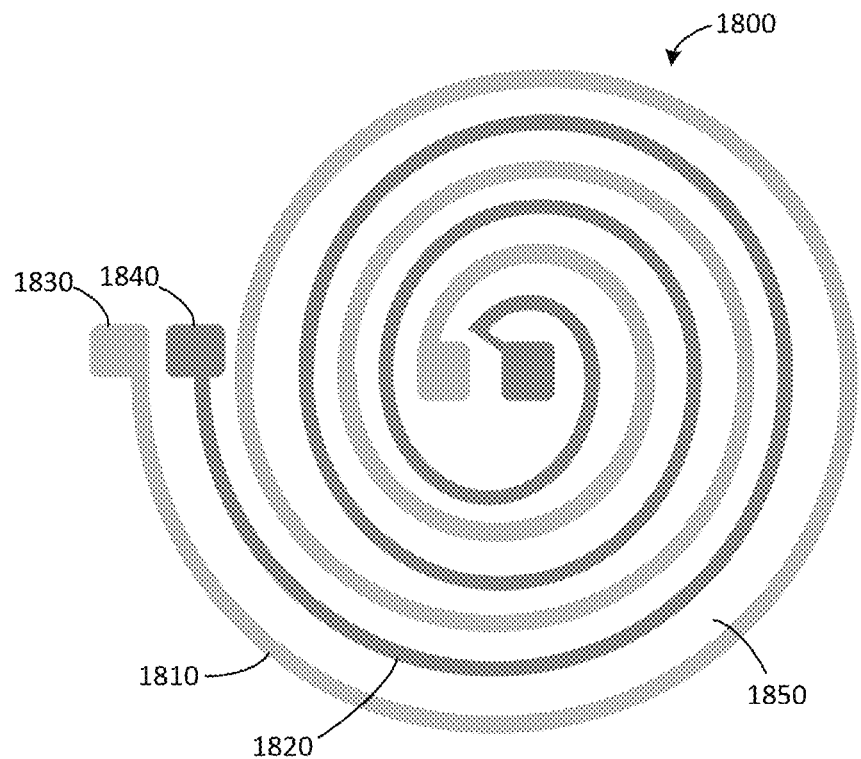
FIG. 18 is a top plan view of a CESD comprising two or more electrodes in a co-spiral arrangement.

Co-spiral: As used herein, the term "co-spiral" refers to two or more intermingled spirals. When referring to a co-spiral of two or more electrodes, the electrodes are electrically independent (i.e., the individual electrodes do not intersect one another). A co-spiral arrangement of electrodes may be formed, for example, by laying two wire- or line-type electrodes side-by-side with a space between the two electrodes, and then arranging the two electrodes together into a spiral shape such that the rings of the spiral alternate between the first electrode and the second electrode, and such that the electrodes do not intersect one another, e.g., as shown in FIG. 18. The co-spiral is planar when the electrodes are arranged into a co-spiral on a planar surface. The term "co-spiral" encompasses spirals having a substantially circular elliptical, polygonal, or irregular spiral shape.

Dielectric material: An electrical insulator that can be polarized by an applied electric field.

Electrical interconnect: An electrically conductive line used to connect a plurality of electrodes in series.

Electrically insulative material or insulator: An insulator is a material having internal electric charges that do not flow freely, and therefore the material conducts little or no electric current. Recognizing that perfect insulators do not exist, as used herein, the term "electrically insulative material" refers to a material that is primarily insulative, i.e., a material that has a threshold breakdown field that exceeds an electric field applied across the material during normal use as a capacitor, thus avoiding electrical breakdown during normal use.

Electrode: As used herein, the term "electrode" refers to an electrical conductor (e.g., a metal) or to a "composite" electrode comprising an electrical conductor and a nonconductive material on the surface of the electrical conductor. Exemplary electrodes include metals, electrically insulated metals, carbonized polymers, conductive carbon, and electrically conductive polymers.

Entropic material: A material in which energy is stored via entropic changes of the material. In some examples, the entropic changes are driven by electrical means, and the material is referred to as an Electroentropic™ material. In other examples, the entropic changes are driven by magnetic fields, and the material is referred to as a Magnetoentropic™ material. Entropic changes include atomic, molecular, secondary, and/or tertiary structure changes, such as intramolecular movement of polymers and/or intermolecular movement of charged or polar molecular species within the material. Embodiments of the disclosed entropic materials comprise a plurality of polymeric molecules, particularly polymeric molecules including one or more polar functional groups and/or ionizable functional groups.

Graphene: an extremely electrically conductive form of elemental carbon that is composed of a singe flat sheet of carbon atoms arranged in a repeating hexagonal lattice. (https://www.merriam-webster.com/dictionary/graphene).

Graphitic carbon: Graphitic carbon comprises carbon in the allotropic form of graphite, irrespective of the presence of structural defects and the percentage of the graphite structure. Graphitic carbon has at least some domains exhibiting three-dimensional hexagonal crystalline long-range order as detected by diffraction methods (*IUPAC Compendium of Chemical Terminology*, 2nd ed. (the "Gold Book"), compiled by A. D. McNaught and A. Wilkinson, Blackwell Scientific Publications, Oxford (1997). XML on-line corrected version: http://goldbook.iupac.org (2006-) created by M. Nic, et al.; updates compiled by A. Jenkins. ISBN 0-9678550-9-8. doi:10.1351/goldbook, updated Feb. 24, 2014, version 2.3.3).

Graphitized carbon: As defined by IUPAC, graphitized carbon is a graphitic carbon with more or less perfect three-dimensional hexagonal crystalline order prepared from nongraphitic carbon by graphitization heat treatment, i.e., heat treatment at a temperature within a range of 2500-3300 K (Ibid.). As used herein, the term partially graphitized carbon refers to graphitic carbon with a graphite-type structure content within a range of from 20 to 99% by weight, such as from 50 to 99% or from 80-95% by weight.

Insulative or nonconductive layer/coating: As used herein, the terms "insulative layer," "insulative coating," "nonconductive layer," and "nonconductive coating" refer to a layer or coating of a material that is electrically insulative from an Ohmic conductivity standpoint, i.e., the material has an Ohmic conductivity less than $1 \times 10^{-1}$ S/m (Siemens per meter).

Parylene: Polymerized p-xylylene, also known as a Puralene™ polymer (Carver Scientific, Inc.), or polymerized substituted p-xylylene. Poly(p-xylylene) satisfies the formula:

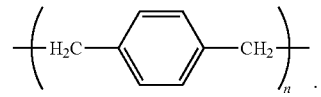

Permittivity: As used herein, the term "permittivity" refers to the ability of a material to become polarized, thereby changing the "dielectric constant" of its volume of space to a higher value than that of a vacuum. The relative permittivity of a material is a measurement of its static dielectric constant divided by the dielectric constant of a vacuum as shown in Eq. 2.

$$e_r = \frac{e_s}{e_0} \qquad \text{Eq. 2}$$

where: er=relative permittivity, es=measured permittivity, and eo=electrical permittivity of vacuum ($8.8542 \times 10^{-12}$ F/m). A vacuum has a relative permittivity of 1, whereas water has a relativity permittivity of 80.1 (at 20° C.) and an organic coating typically has a relative permittivity of 3-8. Generally speaking, the term "high permittivity" refers to a material having a relative permittivity of at least 3.3. As used herein, the term "high permittivity" also refers to a material having a permittivity enhanced by at least 10% using a permittivity enhancement technique, such as immersion in an electric field.

Perturbing charge: A charge applied to an electroentropic energy device, the charge having a magnitude effective to cause a change in the voltage of the device without changing the capacitance of the device.

Polar: The term "polar" refers to a compound, or a functional group within a compound, in which electrons are not equally shared between the atoms i.e., areas of positive and negative charges are at least partially permanently separated.

Polymer/polymeric molecule: A molecule of repeating structural units (e.g., monomers) formed via a chemical reaction, i.e., polymerization. A biopolymer is a polymer occurring within a living organism, e.g., a protein, cellulose, or DNA.

RAM: Random-access memory.

ROM: Read-only memory.

Sinuous: Having periodic curves, serpentine.

Unit cell: As used herein, the term "unit cell" refers to a minimum number of electrodes to form a CESD. A dielectric material occupies spaces between the electrodes.

Via: A via (or vertical interconnect access) is electrical connection that goes through the plane of a layer. As used herein, a via refers to an electrical connection that extends through an insulative layer to provide an electrical connection between an electrode and a conductive line.

Vss: Voltage source supply. As used herein, Vss usually refers to the more negative supply voltage for a circuit including a CESD. In some instances, Vss is ground. However, Vss is used to indicate a voltage that is different from the voltage source and can be either higher or lower in voltage than the voltage source. When one electrode (or group of electrodes in a CESD is connected to a voltage source, another electrode (or group of electrodes) is connected to Vss, where Vss has a different voltage than the voltage source, thereby providing a voltage difference across a capacitive element in the CESD.

II. Capacitive Energy Storage Devices (CESDs)

In some embodiments, a capacitive energy storage device (CESD) comprises at least two electrodes with a space between the two electrodes, and a dielectric material disposed in the space between the two electrodes and in contact with the two electrodes. The CESD may comprise an array of electrodes with spaces between the electrodes, the array of electrodes comprising n groups of electrodes in one or more planes, where n is an integer greater than or equal to 2.

The electrodes may have virtually any geometric cross-sectional configuration, including, but not limited to, a circular cylindrical configuration, an elliptic cylindrical configuration, a polygonal cylindrical configuration, a spherical configuration, a hemispherical configuration, or the electrode may have a flat configuration where the electrode is flat in two dimensions. In certain embodiments as discussed in detail below, the electrodes may comprise wires having sinuous curves or wires including periodic protrusions along a length of the wire. In one embodiment, the electrodes have a right circular cylindrical configuration. A cylindrical configuration can be used to increase effective surface area between electrodes. In an independent embodiment, the electrode has a spherical or hemispherical configuration. In some embodiments, the electrode configuration may affect permittivity of the dielectric. Without wishing to be bound by a particular theory of operation, a curved electric field may be able to store more energy than a linear electric field. The electrodes may have a regular (e.g., smooth) or irregular (e.g., rough) surface. In some embodiments, a randomly irregular or rough electrode surface provides fast charge and discharge for at least some portion of a charge/discharge cycle. Without wishing to be bound to a particular theory of operation, a rough surface may provide a faster charge/discharge due to increased surface area relative to an electrode with a regular, smooth surface.

The electrodes are constructed of a conductive material. Suitable conductive materials include, but are not limited to, conductive carbon, a conductive organic material other than carbon, a conductive metal, or a semiconductor. In some embodiments, the electrodes are anodized (i.e., have a durable, corrosion-resistant, anodic oxide surface film). In other embodiments, the electrodes are coated with an insulative coating such as, for example, polyp-xylylene).

In some embodiments, the central-to-central axis spacing between adjacent electrodes is within a range of 1 nm to 5 mm, such as a spacing from 0.03 µm to 1 mm, from 0.5 µm to 100 µm, from 0.1 µm to 50 µm, from 1 µm to 500 µm, or from 10 µm to 2000 µm. Thus, a CESD may include from 4 to $4 \times 10^{12}$ electrodes/cm$^2$, such as from 100 to $1 \times 10^9$ electrodes/cm$^2$, from $1 \times 10^4$ to $1 \times 10^9$ electrodes/cm$^2$, or from $2 \times 10^5$ to $5 \times 10^6$ electrodes/cm$^2$. The electrode spacing may depend, in part, upon the electric field (E-field) that is desired, the dielectric material used, and/or the presence of an anodized film or insulative coating on the electrodes. In some embodiments, an applied E-field in the range of from 0.0001 V/µm to 1000 V/µm or more, based on an average thickness of the dielectric material, is utilized. In certain embodiments, the applied E-field is within a range of 0.001 V/µm to 1000 V/µm, 0.001 V/µm to 100 V/µm, 100 V/µm to 1000 V/µm, or 1 V/µm to 5 V/µm depending on the intended use of the CESD. When the electrodes include an insulative coating, very low E-fields due to the blocking effect of the insulative layer can be used with slightly conductive dielectric materials. Alternatively, transmissive pores in the insulative dielectric can be used to transmit the E-field through the bulk of the insulative coating to the higher permittivity dielectric. Either larger or smaller spacing of the electrodes (depending on the desired usable voltage of the device) is possible when they are anodized or coated with an insulative layer. Much higher voltages can be realized in such embodiments. In some examples, voltages in the range of 25 V or greater have been used without an applied insulative coating on the electrodes. Most metals develop a thin non-conductive oxide layer when exposed to atmospheric oxygen. When electrodes have an applied insulative coating, voltages of 100 V or more, such as ≥150 V, ≥200 V, ≥250 V, ≥400 V, or even ≥650 V may be applied.

FIG. 1 is a cross-sectional view of a conventional capacitor 10 comprising a plurality of electrodes 11, 12 in a parallel configuration. Edge connectors 13, 14 are for external electrical connections. A nonconductive dielectric material 15 is between the electrodes 11, 12. Any apparent gaps between elements of the capacitor are shown for clarity purposes only and are not present in the actual device. Typical capacitors made in this manner include multilayer ceramic capacitors (MLCCs), which are used for electronics.

In contrast, some embodiments of the disclosed capacitive energy storage devices include an array of electrodes in a planar arrangement with spaces between the electrodes and a dielectric material occupying spaces between the electrodes. The CESD may be formed on a single planar surface. This is advantageous for manufacture since the single plane facilitates geometric and mechanical alignment of closely-spaced electrodes. If the electrodes are not accurately aligned, then they would contact each other and make a short circuit or cause unwanted internal discharge of the stored energy. Although two planes of electrodes at the micron or nanometer scale can be aligned or registered accurately, it is difficult to make large-scale production of such devices. The geometric nature of some embodiments of the disclosed CESDs helps alleviate those alignment problems, as only a single planar substrate is used during manufacture. Nonetheless, other arrangements where electrodes are formed on two or more different planes and then aligned with the dielectric between the planes is feasible, particularly in cases where there are fewer electrodes and/or greater spacing between electrodes are also within the scope of this disclosure. In such embodiments, the edge connectors also may be on two or more different planes.

Exemplary CESDs are illustrated in the figures. It is to be understood that in CESDs including more than two electrodes, the number of electrodes depicted in the figures is representative only and does not indicate a minimum or maximum number of electrodes in the CESD. In several figures, one or more "unit cells" are indicated with dotted lines. The unit cell is the smallest configuration for that CESD.

FIG. 2A is a cross-sectional side view of an exemplary CESD 100 comprising a plurality of electrodes 110, 120 in a substantially planar array (i.e., an ordered arrangement) with spaces between the electrodes, each electrode having a central axis $A_C$ perpendicular to the plane. Edge connectors 130, 140 are for external electrical connections to the electrodes. A dielectric material 150 occupies the spaces between the electrodes 110, 120 and contacts the electrodes. The electrodes 110, 120 are at least partially embedded in or in contact with the dielectric material 150. The electrodes 110, 120 may be completely embedded in the dielectric material 150. Regions of the dielectric material located between adjacent electrodes define capacitive elements. Any apparent gaps between elements of the CESD are shown for clarity purposes only and are not present in the actual device.

The plurality of electrodes may be disposed on a substrate, or optionally removable carrier layer, 160 (the CESD may be formed on a carrier layer, which is subsequently removed). The CESD 100 further comprises a plurality of electrical interconnects (not shown in FIG. 2) each electrical interconnect connecting two or more electrodes in series. Electrodes connected by a single electrical interconnect constitute a group of electrodes. In some embodiments, the CESD further includes an upper sealing layer or additional dielectric, 170. The CESD includes at least two groups of electrodes, but may include hundreds or even thousands of individual electrodes or groups of electrodes. The CESD includes a number of electrical interconnects equal to the number of groups of electrodes. Thus, the CESD also includes at least two electrical interconnects, but may include hundreds or even thousands of electrical interconnects.

As shown in FIG. 2B, two or more CESDs 100 may be vertically stacked to form a CESD stack. A CESD stack may include tens, hundreds, or even thousands of layered CESDs. Some embodiments of the disclosed CESDs have a thickness ranging from 0.005 μm to 150 μm. Thus, a CESD stack having a thickness of just 1 cm can include from 2-2,000,000 layers, such as from 50-1,000,000 layers, 50-100,000 layers, 500-50,000 layers, 1,000-10,000 layers, or 1,000-7,000 layers. In one embodiment, each CESD in the stack includes a substrate 160, such as a non-conductive substrate. In an independent embodiment, a sealing layer 170 is disposed between each pair of adjacent CESDs in a stack; advantageously the sealing layer is an insulative layer, such as polyp-xylylene) or additional dielectric material. Although FIG. 2B shows a particular number of electrodes, it is understood that a CESD may have more or fewer electrodes than shown. Dotted lines show an interior unit cell 101a, and an edge or exterior unit cell 101b, each including two electrodes and dielectric material between the electrodes. Any apparent gaps between elements of the CESD are shown for clarity purposes only and are not present in the actual device.

The electrodes 110, 120 may have any desired height along the central axis. In some embodiments, the electrodes have a height of from 1 nm to 12000 μm, such as a height of 5 nm to 12000 μm, 0.01 μm to 10 mm, 0.01 μm to 1 mm, 0.03 μm to 1 mm, 0.03 μm to 100 μm, a 0.03 μm to 10 μm, 0.5 μm to 10 μm, or 1 μm to 10 μm. In certain embodiments, each electrode in a group of electrodes has substantially the same height (i.e., the height of each individual electrode in the group varies by less than 5% from an average height of the electrodes in the group). In any of the foregoing embodiments, each electrode in the array of electrodes may have substantially the same height. The dielectric material occupying the spaces between the electrodes may have an average thickness ranging from 10% to 5000% of the average height of the electrodes, such as an average thickness ranging from 10-1500%, from 90-1500%, from 10-500%, or from 90-500% of the average electrode height. In some embodiments, the average dielectric material thickness is substantially the same (i.e., varies by less than 5%) as the average electrode height.

As discussed above, the electrode spacing may depend, in part, upon the electric field (E-field) that is desired, the dielectric material used, and/or the presence of an anodized film or insulative coating on the electrodes. In general, the E-field will be perpendicular to the central axes of the electrodes. Thus, if the electrodes are disposed on a substrate such that the central axes are perpendicular to the substrate, the E-field will be substantially parallel to the substrate. In other embodiments utilizing rounded or curved surfaces, the E-field may have a substantially curved shape in perspective to a perpendicular point on the surface of the substrate or electrode.

Exemplary substrates are nonconductive or comprise a nonconductive or insulative layer (e.g., a polyp-xylylene) layer) in contact with the electrodes. In some embodiments, the substrate is constructed of a material other than silicon, such as a nonconductive polymer. In some embodiments, the substrate 160 is a removable carrier and is removed after the CESD is assembled. In some examples, a removable carrier comprises a water-soluble polymer.

The electrical interconnects are conductive lines connecting two or more electrodes in series. The electrical interconnects may be constructed of a conductive material, such as conductive carbon, a conductive organic material other than carbon, or a conductive metal. In some embodiments, the electrical interconnects are metal wires. Electrical connections to the electrodes may be direct or indirect. Direct connections can be made by methods well known to those who work in the fields of microelectronics and lithography. Connections can be made, for example, using standard wire-bonding machinery or conductive adhesives.

There are many possible electrode arrangements in a CESD, a few of which are described herein. The same numbering for individual components will be adhered to throughout FIGS. 3-14. In one exemplary embodiment shown in FIG. 3, a CESD 300 comprises an array of electrodes 110, 120 arranged in an aligned grid pattern such that the central axis $A_C$ (*) of each electrode is aligned with the central axes of immediately adjacent electrodes of neighboring rows and columns. Each diagonal row (as viewed from the top) constitutes a group of electrodes. As indicated by the dotted lines, four electrodes form a unit cell, e.g., cells 301a, 301b, 301c. When viewed in diagonal rows, it is seen that the central axes of the electrodes in any row are staggered, or offset, from the central axes of electrodes in immediately adjacent diagonal rows. All electrodes in each group of electrodes are connected in series by an electrical interconnect 115, 125. For example, labeled electrical interconnect 115 of FIG. 3 connects two electrodes 110 in series, and labeled electrical interconnect 125 connects three electrodes 120 in series. Each electrical interconnect has a terminal end coupled to an edge connector 130, 140, which is used to form external electrical connections for each group of electrodes. Each edge connector 130, 140 may be connected, for example, to a switch (not shown). The other terminal end of the electrical interconnect is connected to the electrode in the group that is farthest from the electrical interconnect. A dielectric material 150 occupies spaces between the electrodes 110, 120, and the electrodes are at least partially embedded in or in contact with the dielectric material. Regions of the dielectric material between adjacent electrodes of different groups (electrodes of neighboring diagonal rows) define capacitive elements 155. In the arrangement of FIG. 3, each interior electrode (i.e., an electrode that is not on the edge of the array) is surrounded by four electrodes from other groups. Hence, there are four capacitive elements 155 around each interior electrode. Advantageously, the diagonal arrangement of electrode groups allows the edge connectors 130, 140 to be spaced apart at twice the distance (center-to-center) of the electrodes 110, 120. Capacitive elements are not formed between two electrodes serially connected in a single row. Activating a row of electrodes 110 and an adjacent row of electrodes 120 will address all capacitive elements 155 located between the two activated rows. "Activating" means to (i) apply a voltage to an edge connector, (ii) connect the edge connector to Vss (e.g., ground), or (iii) connect the edge connector to a load. For example, a voltage may be applied to an edge connector 130 while an edge connector 140 of an adjacent row is connected to Vss, where Vss is different than the applied voltage, thereby creating a voltage difference across capacitive elements 155 located between electrodes 110 and 120 of the adjacent rows. It should be noted that there are two connections to a capacitor. Since the energy storage is related only to the amount of charge and capacitance of the device and therefore the voltage difference between the two connections. We will simplify the discussion by assuming the voltage of one connection to the capacitor is ground potential. We will therefore need to only discuss the voltage of the other connection to the capacitive devices. However, the descriptions and utility of the devices need not be limited to only ground potentials as is commonly known to those versed in electrical circuits.

In the arrangement of FIG. 4, a CESD 400 comprises an array of electrodes 110, 120 arranged in an aligned grid pattern such that the central axis (*) of each electrode is aligned with the central axes of immediately adjacent electrodes of neighboring rows. Each row constitutes a group of electrodes. As indicated by the dotted lines, four electrodes form a unit cell 401. The arrangement of aligned rows provides two capacitive elements 155 on opposing sides of each interior electrode (e.g., electrode 120a). A single capacitive element 155 is adjacent each edge electrode. Activating a row of electrodes 110 and an adjacent row of electrodes 120 will address all capacitive elements 155 located between the two activated rows.

FIG. 5 illustrates a CESD 500 in which the electrodes 110, 120 are arranged in an array of staggered rows, such that the central axis (*) of each electrode in a row is not aligned with the central axes of electrodes in neighboring rows. Each row constitutes a group of electrodes. As indicated by the dotted lines, four electrodes form a unit cell 501. Each interior electrode (e.g., electrode 120a) is adjacent to two electrodes in each of the neighboring rows. The arrangement of aligned rows provides four capacitive elements 155 around each interior electrode, with two capacitive elements on each of the opposing sides of the electrode. Activating a row of electrodes 110 and an adjacent row of electrodes 120 will address all capacitive elements 155 located between the two activated rows.

In the embodiment of FIG. 6, a CESD 600 comprises electrodes 110, 120 arranged in an array of offset diagonal rows, each row constituting a group of electrodes. As indicated by the dotted lines, four electrodes form a unit cell 601. Each interior electrode (e.g., electrode 120a) is adjacent to two electrodes in each of the neighboring diagonal rows. The arrangement provides four capacitive elements 155 around each interior electrode. Activating a row of electrodes 110 and an adjacent row of electrodes 120 will address all capacitive elements 155 located between the two activated rows.

Figure 7:
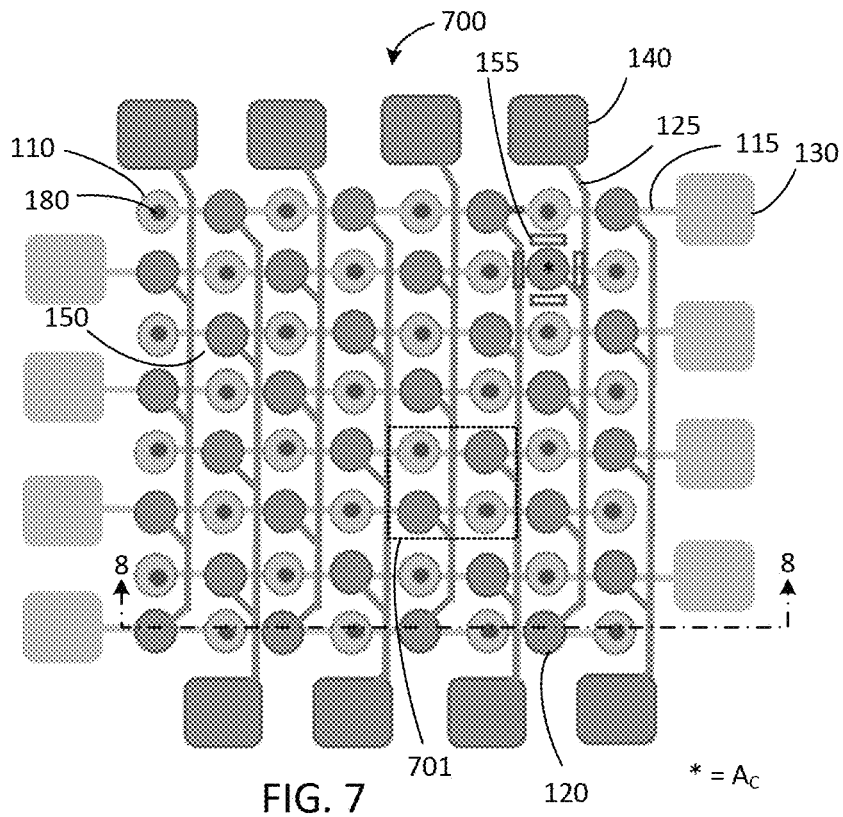
FIG. 7 is a top plan view of a CESD comprising an array of electrodes arranged in an aligned grid pattern, each row including electrodes constituting a row group alternating with electrodes of a plurality of column groups and each column including electrodes constituting a column group alternating with electrodes of a plurality of row groups; each interior electrode is surrounded by four capacitive elements.
Figure 8:
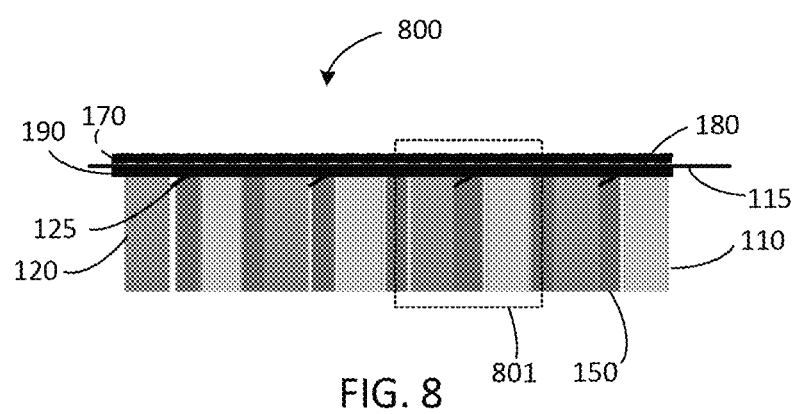
FIG. 8 is a cross-sectional side view of the CESD of FIG. 7 taken along line 8-8.
Figure 9:
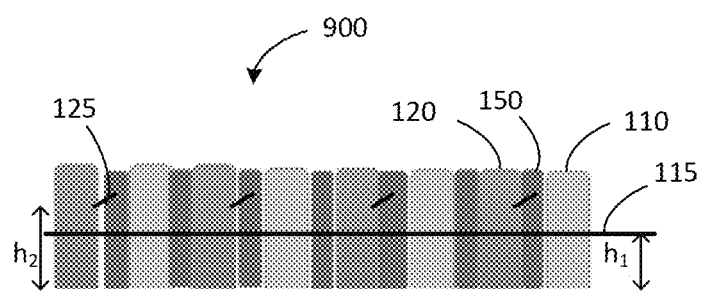
FIG. 9 is a cross-sectional side view of a CESD comprising an array of electrodes arranged in an aligned grid pattern, each row including electrodes constituting a row group alternating with electrodes of a plurality of column groups and each column including electrodes constituting a column group alternating with electrodes of a plurality of row groups; the row groups and column groups are connected by electrical interconnects positioned at different heights relative to a substrate or lower surface of the electrodes.

FIG. 7 shows a CESD 700 comprising an array of electrodes 110, 120 arranged in a grid pattern of aligned rows and columns. Each row comprises electrodes of a row group, i.e., electrodes 110, alternating with electrodes of a plurality of column groups. Each column constitutes electrodes of a column group, i.e., electrodes 120 alternating with electrodes of a plurality of row groups. As indicated by the dotted lines, four electrodes form a unit cell 701. Electrodes of each row group are connected in series with a row electrical interconnect 115. Electrodes 120 of each column group are connected in series with a column electrical interconnect 125. The arrangement provides four capacitive elements 155 around each interior electrode. In the embodiment shown in FIG. 7, the electrical interconnect 125 is offset from the central axes $A_C$ of electrodes 120 and has a branched configuration to connect to each electrode 120. Since the electrical interconnects 115, 125 cross one another, the interconnects are located in different planes in 3-dimensional space. The electrical interconnects are configured such that vertical spatial separation is present at each intersection where a row electrical interconnect 115 crosses a column electrical interconnect 125. In some embodiments, such as CESD 800 as shown in FIG. 8, an insulative layer 190 is disposed between the electrical interconnects 115 and 125 such that electrical interconnects 115 are above the insulative layer and electrical interconnects 125 are below the insulative layer. Electrodes 110 may be connected to the electrical interconnect 115 by a via 180 extending through the insulative layer. Alternatively, the insulative layer may be selectively removed above electrodes 110 so that the electrodes can be connected to the electrical interconnect. A unit cell 801 is indicated by the dotted lines. In an independent embodiment, electrodes 110 have a height sufficient to extend through the insulative layer (not shown). In another independent embodiment, CESD 900 as shown in FIG. 9, the row electrical interconnect 115 contacts electrodes 110 at a height $h_1$ above a lower surface of each electrode 110. The branched column electrical interconnect 125 contacts electrodes 120 at a height $h_2$ above a lower surface of each electrode 120, where $h_1 \neq h_2$. In any of the foregoing embodiments, a sealing layer 170 may be disposed above the uppermost electrical interconnect.

Advantageously, the configuration shown in FIGS. 7-9 allows addressing of capacitive elements adjacent to a single electrode. This feature provides tremendous versatility and capacity for energy and/or data storage. With reference to CESD 1000 of FIG. 10, a single edge row of electrodes 110 and a single interior column of electrodes 120 are activated, e.g., by applying a voltage to edge connector 130a while connecting edge connector 140g to Vss (e.g., ground). Although all electrodes connected to the edge connectors 130a and 140g are activated, only a single capacitive element 155 between an activated edge electrode and an activated interior electrode is addressed. All other regions of the dielectric material 150 are substantially unaffected.

Figure 11:
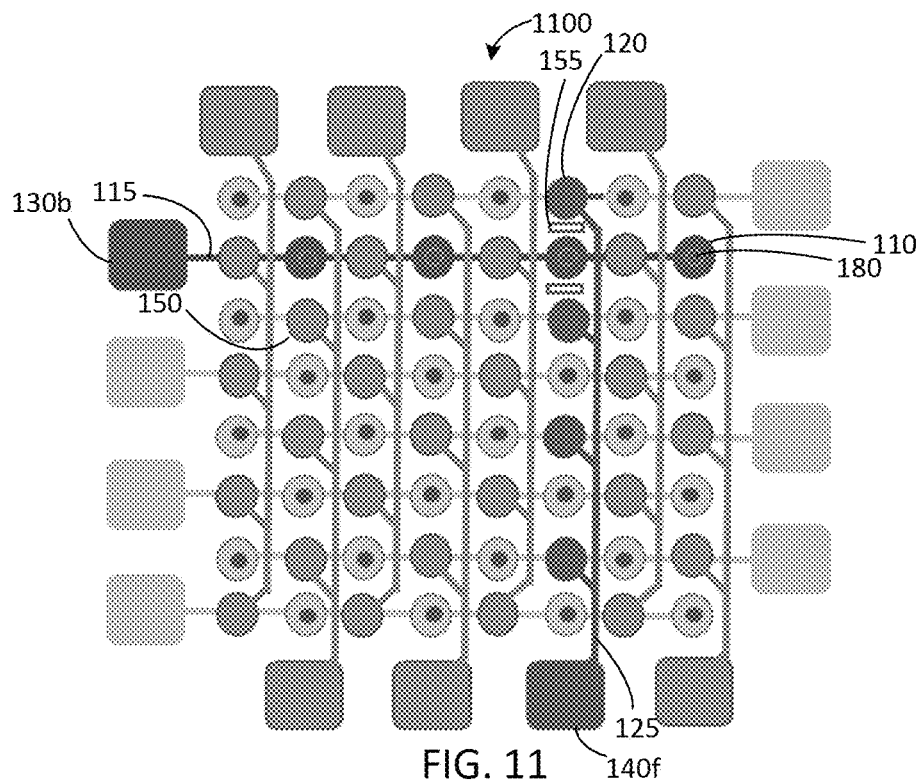
FIG. 11 illustrates activation of a single interior row group and a single interior column group of the CESD of FIG. 7, thereby accessing two capacitive elements on opposing sides of a row electrode.
Figure 12:
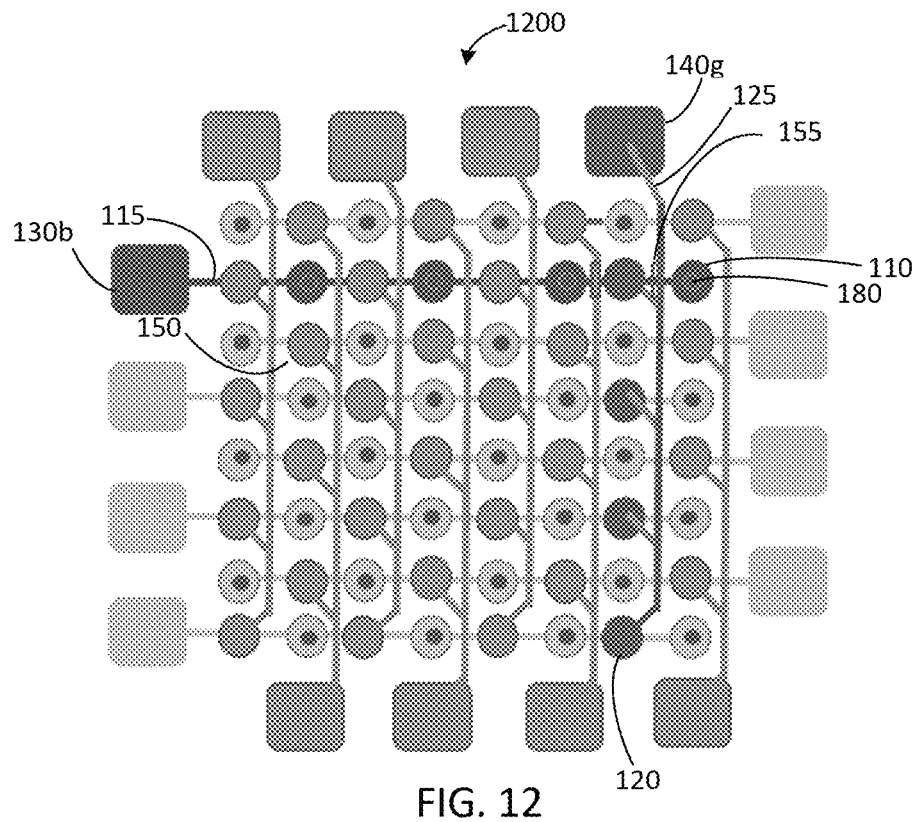
FIG. 12 illustrates activation of a single interior row group and a single interior column group of the CESD of FIG. 7, thereby accessing two capacitive elements on opposing sides of a column electrode.

FIG. 11 shows a CESD 1100 with activation of an interior row of electrodes 110 and an interior column of electrodes 120, e.g., by applying a voltage to edge connector 130b while connecting edge connector 140f to Vss. Two capacitive elements 155 located on opposing sides of an activated interior electrode 110 between two activated electrodes 120 are addressed. Selection of a different column edge connector, e.g., edge connector 140g (as illustrated with the CESD 1200 of FIG. 12), addresses two capacitive elements 155 on opposing sides of an activated interior electrode 120 between two activated electrodes 110. Thus, it can be seen that the capacitive elements adjacent to any single electrode can be addressed as desired by activation of one row and one column of electrodes.

Figure 13:
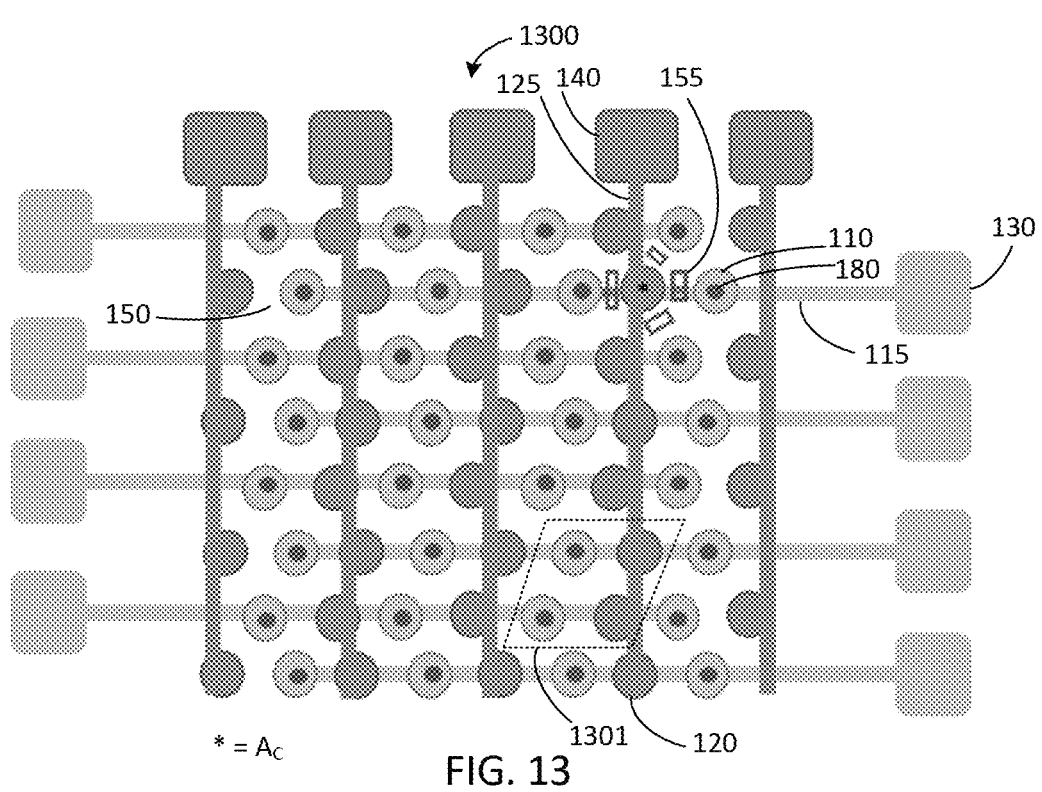
FIG. 13 is a top plan view of a CESD comprising an array of electrodes arranged in staggered rows, each row including electrodes constituting a row group alternating with electrodes of a plurality of column groups; each interior electrode is surrounded by four capacitive elements.

In the arrangement of FIG. 13, a CESD 1300 comprises an array of electrodes 110, 120 arranged in a grid pattern of staggered rows such that the central axis of each electrode in a row is not aligned with the central axes of electrodes in adjacent rows. Each row comprises electrodes of a row group, i.e., electrodes 110, alternating with electrodes of a plurality of column groups. As indicated by the dotted lines, four electrodes form a unit cell 1301. Electrodes 110 of each row group are connected in series with a row electrical interconnect 115. Staggered electrodes 120 in a column are connected in series with a column electrical interconnect 125. A vertical spatial separation is present at each intersection where a row electrical interconnect 115 crosses a column electrical interconnect 125. In some embodiments, an insulative layer (e.g., insulative layer 190 as shown in FIG. 8) is disposed between the electrical interconnects 115 and 125 such that electrical interconnects 115 are above the insulative layer and electrical interconnects 125 are below the insulative layer. Electrodes 110 may be connected to the electrical interconnect 115 by a via 180 extending through the insulative layer. The arrangement provides four capacitive elements 155 around each interior electrode.

Figure 14:
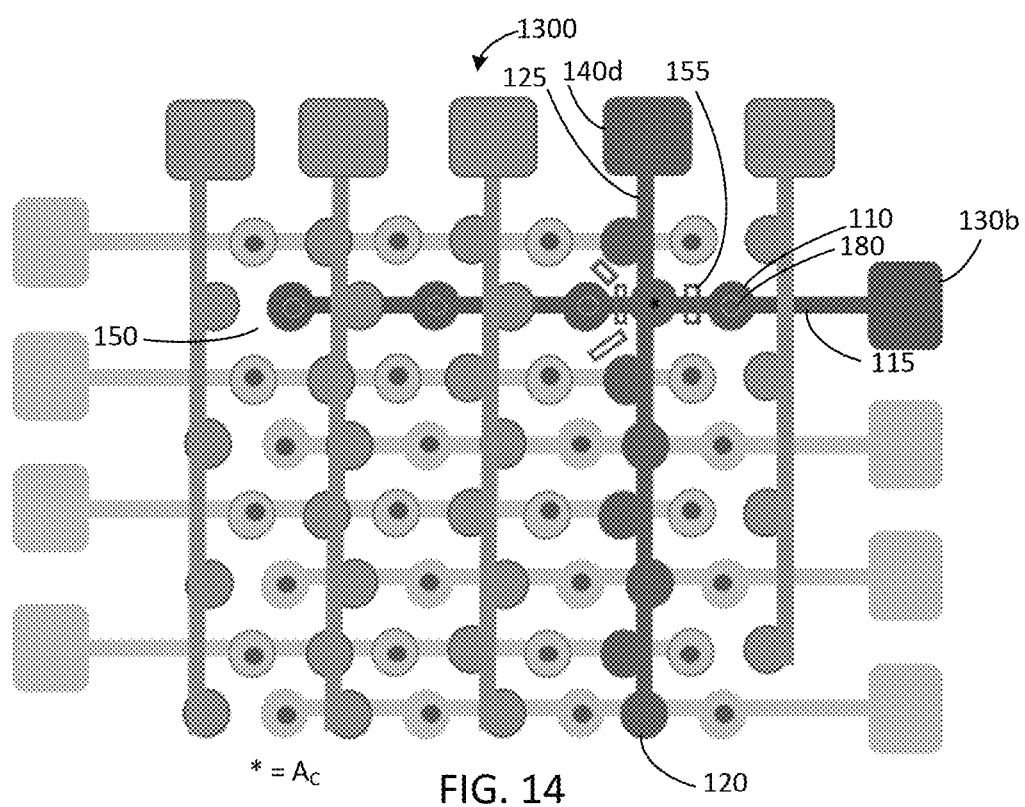
FIG. 14 illustrates activation of a single interior row group and a single interior column group of the CESD of FIG. 13, thereby accessing four capacitive elements.

FIG. 14 shows activation of an interior row of electrodes 110 and an interior column of electrodes 120 in the CESD 1300 of FIG. 13, e.g., by applying a voltage to edge connector 130b while connecting edge connector 140d to Vss. The staggered arrangement of electrodes addresses four capacitive elements 155 by activation of the interior row and interior column.

Figure 15:
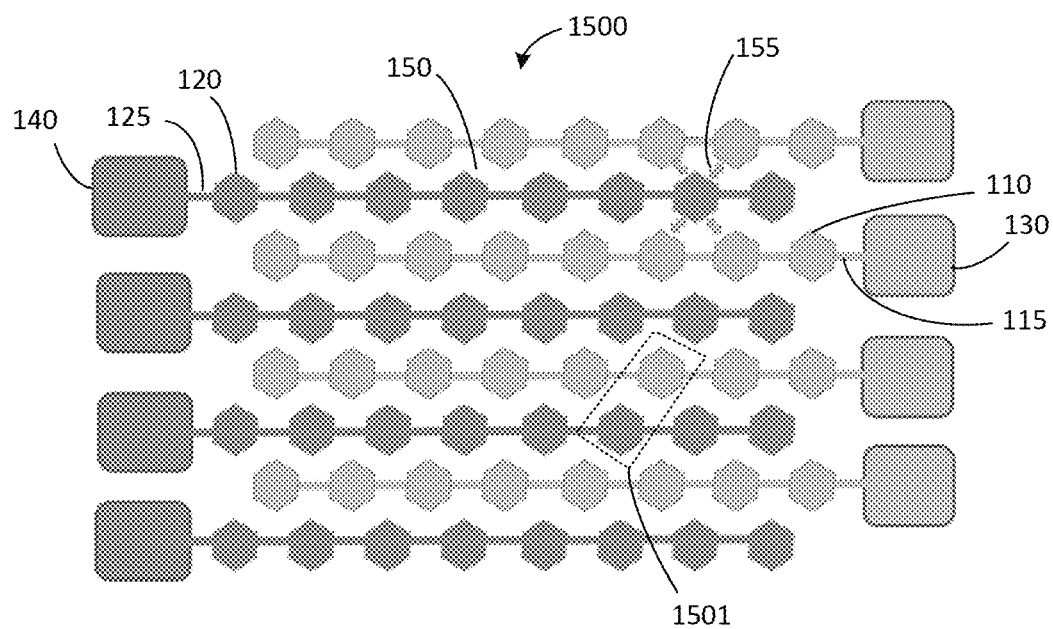
FIG. 15 is a top plan view of a CESD comprising an array of hexagonal electrodes arranged in staggered rows, each row constituting a group of electrodes.

Although electrodes 110, 120 are depicted as having a circular cross-section in FIGS. 3-14, the electrodes may have virtually any geometric configuration as previously discussed. FIG. 15 illustrates a CESD 1500 comprising an array of staggered rows of electrodes 110, 120 having a hexagonal cross-section. As indicated by the dotted lines, two electrodes form a unit cell 1501. The staggered rows and hexagonal configuration provide four capacitive elements 155 adjacent to each interior electrode.

Figure 16:
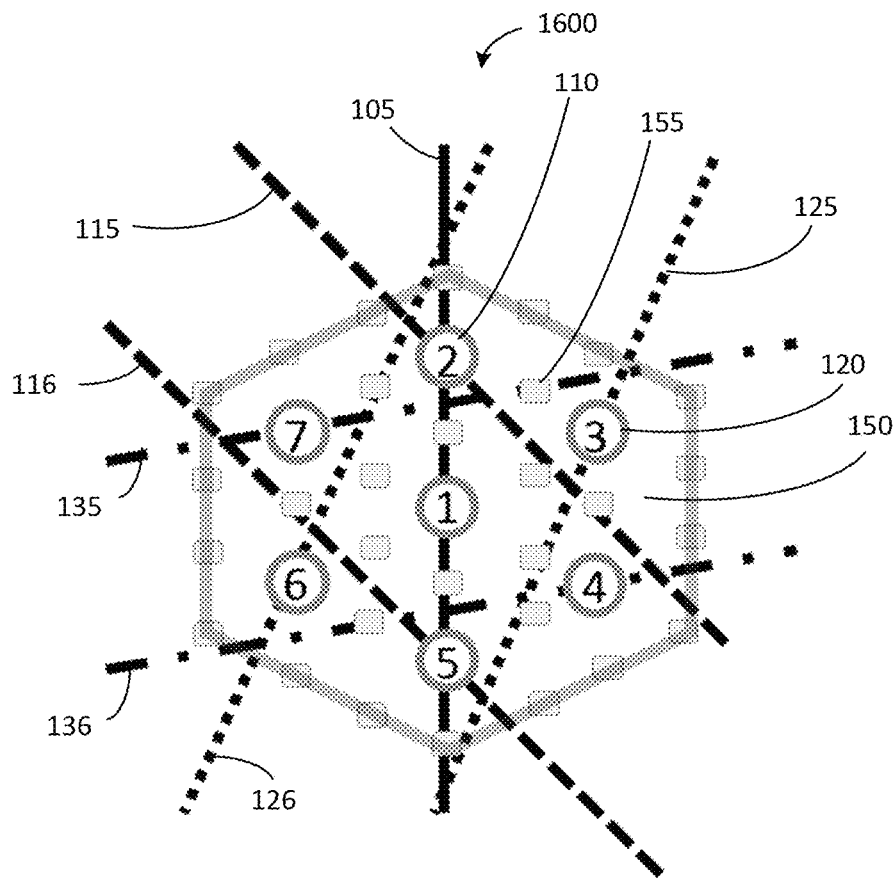
FIG. 16 is a top plan view of a CESD comprising a plurality of electrodes arranged in a polygonal unit cell configuration.
Figure 17:
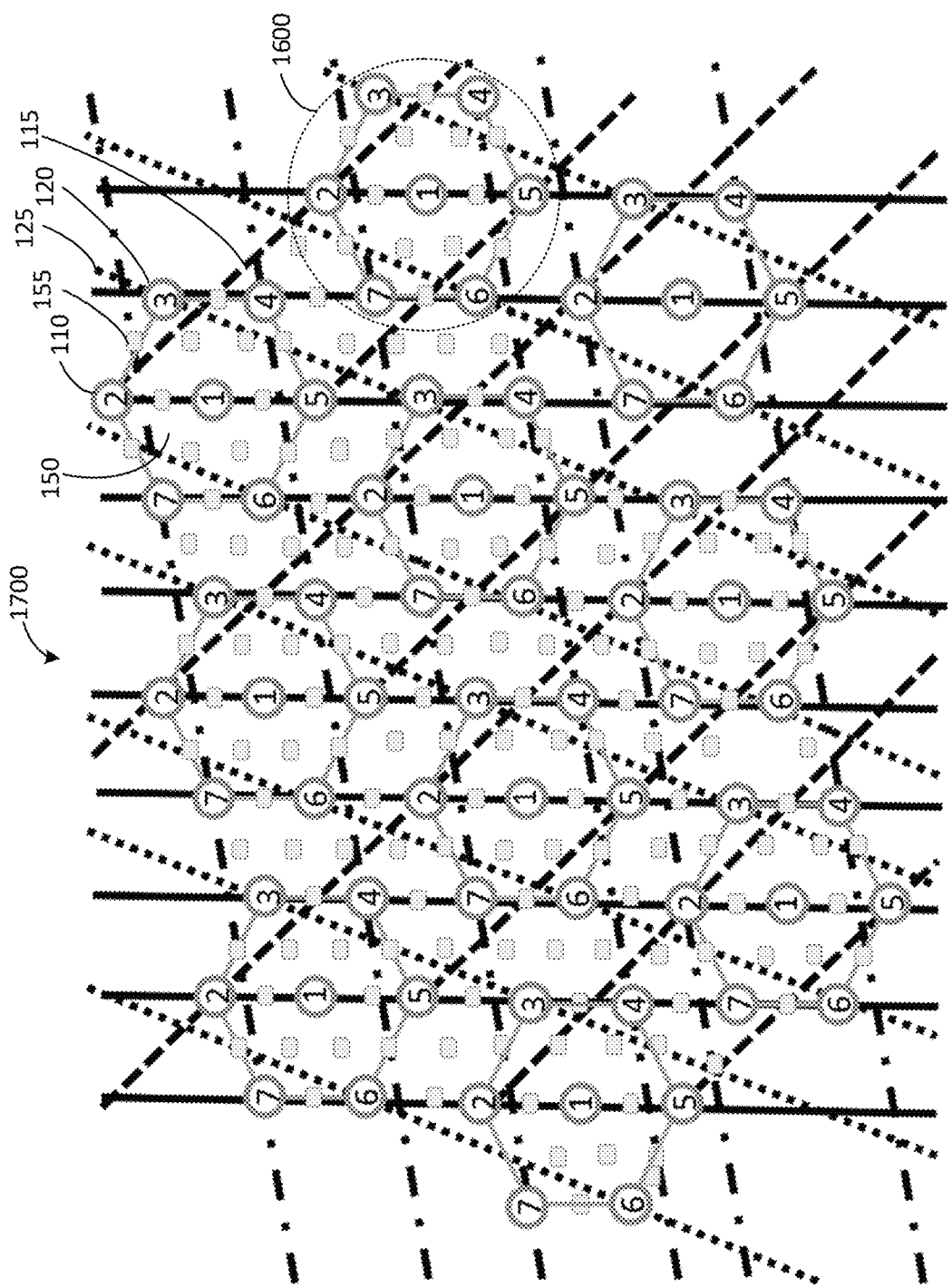
FIG. 17 is a top plan view of a CESD comprising a plurality of the polygonal unit cells of FIG. 16.

In some embodiments, a CESD comprises one or more polygonal unit cells of electrodes, each polygonal unit cell having five or more sides. An exemplary polygonal unit cell 1600 is shown in FIG. 16. FIG. 17 illustrates a CESD 1700 comprising an array of polygonal unit cells 1600. In some embodiments, the array is a planar array of polygonal unit cells 1600. Each polygonal unit cell 1600 comprises a plurality of electrodes at least forming the shape of a polygon with an electrode at each vertex of the polygon. In the exemplary polygonal unit cell of FIG. 16, six electrodes (electrodes numbered 2-7) are arranged at the vertices of a hexagon. A person of ordinary skill in the art understands that other geometric arrangements are possible. For example, five electrodes may be arranged at the vertices of a pentagon, eight electrodes may be arranged at the vertices of an octagon, and so on. In some embodiments, an additional electrode (electrode numbered 1) is positioned at or near the center of the polygon. The polygonal unit cell 1600 comprises a number of electrical interconnects (e.g., interconnects 105, 115, 116, 125, 126, 135, 136) equal to the number of electrodes in the unit cell, each electrical interconnect connected to a single electrode in the polygonal unit cell. A dielectric material 150 occupies spaces between the electrodes, wherein regions of the dielectric material located between adjacent electrodes define capacitive elements 155. There is a vertical spatial separation at each intersection of two or more electrical interconnects. For example, with reference to FIG. 16, there is a vertical spatial separation at the intersection of electrical interconnects 115, 125. Electrical interconnects that do not intersect each other, however, may occupy the same plane. Thus, electrical interconnects 115, 116 may occupy the same plane, whereas electrical interconnects 125, 126 occupy another plane vertically separated from the electrical interconnects 115, 116. The polygonal unit cell may include insulative layers separating intersecting electrical interconnects with vias through the insulative layers to connect electrodes to the corresponding electrical interconnects, similar to the embodiment shown in FIG. 8. Optionally, a sealing layer (not shown) may be disposed above the uppermost electrical interconnect. In the exemplary unit cell of FIG. 16, the electrical interconnects 105, 115/116, 125/126, and 135/136 are disposed in four planes, respectively, and insulative layers may be disposed between the planes. It should be noted that although electrical interconnect 105 is aligned with the electrodes numbered 1, 2, and 5 in FIG. 16, the electrical interconnect 105 is connected only to the electrode numbered 1 at the polygon center, and is separated from the electrodes numbered 2 and 5 (e.g., by an insulative layer). The electrical interconnects may be connected (e.g., through edge connectors (not shown)) to external logic circuitry with switches so that the electrical interconnects can be selectively activated as desired, thereby addressing one or more capacitive elements in the array.

With further reference to FIG. 17, polygonal unit cells 1600 are arranged such that electrodes in the same position of a plurality of polygonal unit cells form a line. For example, the polygonal unit cells may be arranged in diagonal rows such that the electrodes at the 12 o'clock position (e.g., electrode 110) of two or more polygonal unit cells form a line. As viewed in columns, a center of one hexagonal unit cell is aligned with an edge of a polygonal unit cell in each of the adjacent rows. The collinear electrodes constitute a group of electrodes and are connected with a single electrical interconnect, e.g., electrical interconnect 115. Each capacitive element 155 is addressed individually by activating electrodes on opposing sides of the capacitive element. Each polygonal unit cell in the embodiment of FIG. 17 includes 7 electrodes and 21 capacitive elements (12 directly in the polygonal unit cell and 18 shared with adjacent cells), providing three capacitive elements per electrodes, each of which can be uniquely addressed. A person of ordinary skill in the art will understand that FIG. 17 shows just one exemplary embodiment of a CESD comprising a plurality of polygonal unit cells, and other polygonal unit cell geometries and arrangements are encompassed by this disclosure.

The polygonal unit cell arrangement exemplified in FIGS. 16 and 17 provides the CESD with tremendous density and capacity. In a case having an electrode center-to-center spacing of 1 μm, there are three capacitive elements per micron. Assuming an electrode height of 1 μm, the unit cell arrangement provides a stack density of $10^9$ electrodes/mm$^3$ or $10^{12}$ electrodes/cm$^3$, a capacitive element density of $3\times10^{12}$ elements/cm$^3$, and 3000 Gb/cm$^3$ or 375 GB/cm$^3$, with each capacitive element being one bit (2 logical states).

Advantageously, a CESD comprising an electroentropic dielectric material generates little or no heat during operation, thereby allowing formation and use of large CESD stacks, including stacks having hundreds or thousands of layers, each layer having hundreds or thousands of electrodes and capacitive elements. In some embodiments, no heat is detected during use of the stacked CESD, particularly when the applied voltage is no more than 20 V. In some embodiments, the applied voltage is greater than 0 V and ≤100 V, ≤75 V, ≤50 V, ≤20 V, ≤10V, or ≤5V, such as a voltage from 0.025-20 V, 0.1-10 V, 0.5-5 V, or 0.7-5 V. In contrast, a conventional stacked capacitor typically is limited to no more than seven layers of dielectric material, such as $SiO_2$, before heating due to the leakage current becomes excessive.

Table 1 provides exemplary dimensions and properties for several cells, including a "nominal" cell having linear dimensions of 1 µm, a larger electromagnetic pulse (EMP)-resistant cell, a large "energy collector and memory cell," a cell with maximum memory density, and a very large cell useful, for example, energy storage. For robustness, the EMP-resistant cell is assumed to have only 2 logic levels per cell. In Table 1, the term "cell" refers to the area of a single electrode with its associated capacitive elements; a "layer" is a horizontal plane of capacitive devices; layers may be stacked in the third dimension; a "unit cell" is the repeating unit for the capacitive array. In the exemplary configurations of Table 1, the unit cell is a hexagonal unit cell with an electrode in the center (e.g., as shown in FIG. 16).

density of from 1 to 1,000,000 $GB/cm^3$, from 1-10,000 $GB/cm^3$, or from 1-1,000 $GB/cm^3$.

In another embodiment, as shown in FIG. 18, a CESD 1800 comprises two or more electrodes 1810, 1820 disposed in a co-spiral arrangement with spaces between the electrodes. Advantageously, the co-spiral arrangement is a planar co-spiral arrangement wherein the electrodes are arranged on a planar substrate. The electrodes do not intersect one another. Each 360° loop of the electrodes 1810, 1820 may be considered as a unit cell. An edge connector 1830, 1840 is connected to each electrode 1810, 1820. A dielectric material 1850 occupies the spaces between the electrodes 1810, 1820. In some embodiments, the electrodes 1810, 1820 and dielectric material 1850 are disposed on a

TABLE 1

|  | Nominal | EMP-Resistant | Energy Collector and Memory | Maximum Memory Density | Large Cell |
|---|---|---|---|---|---|
| [1]Linear dimension of cell (µm) | 1 | 2.5 | 20 | 0.029 | 100 |
| [2]Cell area (µm²) | 0.835 | 5.22 | 334 | $7.02 \times 10^{-4}$ | 8350 |
| [3]Electrode height/dielectric thickness (µm) | 1 | 2.5 | 5 | 0.029 | 100 |
| Spacing between electrodes (µm) | 1 | 2.5 | 5 | 0.029 | 100 |
| [4]Optional Insulation layer thickness (µm) | 0.2 | 2 | 1 | 0.2 | 5 |
| [5]Electrical interconnect thickness (µm) | 0.05 | 0.05 | 0.05 | 0.05 | 0.05 |
| [6]Number of additional electrical interconnect layers | 2 | 2 | 2 | 2 | 2 |
| [7]Number of additional insulative layers | 1 | 1 | 1 | 1 | 1 |
| Vertical cell thickness with insulation (µm) | 1.5 | 6.6 | 7.1 | 0.529 | 110.1 |
| Number of layers per cm | 6667 | 1515 | 1408 | 18904 | 91 |
| Unit volume (µm³) | 1.25 | 34.4 | 2370 | $3.71 \times 10^{-4}$ | $9.19 \times 10^5$ |
| Cells per layer per cm² | $1.20 \times 10^8$ | $1.92 \times 10^7$ | $2.99 \times 10^5$ | $1.42 \times 10^{11}$ | $1.20 \times 10^4$ |
| Number of cells in 1 cm³ | $7.98 \times 10^{11}$ | $2.90 \times 10^{10}$ | $4.21 \times 10^8$ | $2.69 \times 10^{18}$ | $1.09 \times 10^6$ |
| Logic levels per cell | 8 | 2 | 4096 | 2 | 16 |
| [8]Logic levels per cell as binary word ($2^n$) | 3 | 1 | 12 | 1 | 4 |
| [9]Number of capacitive elements per cell | 3 | 3 | 3 | 3 | 3 |
| Bits per cm³ (Mb) | $7.18 \times 10^6$ | $8.71 \times 10^4$ | $1.52 \times 10^4$ | $8.07 \times 10^9$ | 13.1 |
| Bytes per cm³ (MB) | $8.98 \times 10^5$ | $1.09 \times 10^4$ | $1.90 \times 10^3$ | $1.01 \times 10^9$ | 1.63 |
| Bytes per cm³ (GB) | 898 | 1 | 2 | $1 \times 10^6$ | 0 |
| Bytes per cm³ (TB) | 0.90 | 0.01 | 0 | $1 \times 10^3$ | 0 |

[1]Electrode spacings are assumed to be equal in both the X and Y dimensions.
[2]The cell area is calculated as $6 * (1.5 * spacing)^2 * sqrt(3)/4/7$, where the area of the hexagon is $6 * (l)^2 * sqrt(3)/4/7$, i.e., the unit cell area divided by the number of electrodes (7), where l is 1.5 * (electrode spacing).
[3]The electrode height and dielectric thickness are assumed to be the same.
[4]The base layer of the cell (the insulative layer or substrate on which the electrodes are mounted) is assumed to be the same thickness as the insulation layers between each plane. The dielectric material, or no material at all, may be the only separation material between the planes of the layers. Thus, the insulation layer is completely optional. For example, if the bottoms of the conductive traces were anodized, then the separation of layers could be essentially zero.
[5]Additional electrical interconnects take up additional thickness on the insulative layers.
[6]The first layer of electrical interconnects in direct contact with the electrodes is not counted.
[7]An even number of electrode layers requires ((n/2) − 1) additional insulative layers; an odd number of electrode layers requires ((n − 1)/2) − 1) additional insulative layers.
[8]The number of logic levels per cell is greatly increased due to the lack of leakage in the capacitive elements. Four logic levels is equivalent to a 2-bit binary logic level device; thus 16 logic levels per cell gives the cell the same number of unique logic outputs as a 4-bit binary logic unit.
[9]The number of capacitive units per cell varies based upon the electrodes' configurations and interconnections. For a hexagonal unit cell with a center electrode, there are three capacitive elements per cell.

Thus, in some embodiments, a CESD 1700 according to FIG. 17 has a cell (electrode and surrounding area) density of from $1 \times 10^6$ to $2.7 \times 10^{18}$ cells/cm³, thereby providing the CESD with a memory density of from 1.5 to $1 \times 10^9$ MB/cm³. In some embodiments, the CESD has a cell density from $4 \times 10^8$ to $2.7 \times 10^{18}$ cells/cm³, from $4 \times 10^8$ to $3 \times 10^{16}$ cells/cm³, or from $4 \times 10^8$ to $8 \times 10^{11}$ cells/cm³, providing a memory substrate (not shown), such as a planar non-conductive substrate. In some embodiments, the electrodes 1810, 1820 are spaced equidistant from one another throughout the spiral arrangement. Although the exemplary arrangement of FIG. 18 shows a substantially circular spiral, the electrodes 1810, 1820 may be arranged in any co-spiral shape including, but not limited to, an elliptical, polygonal, or irregular co-spiral, as desired to occupy an available space in a device, for example, an integrated circuit. In some embodiments, the electrodes 1810, 1820 have a circular cross-section to maximize effective surface area.

Figure 19:
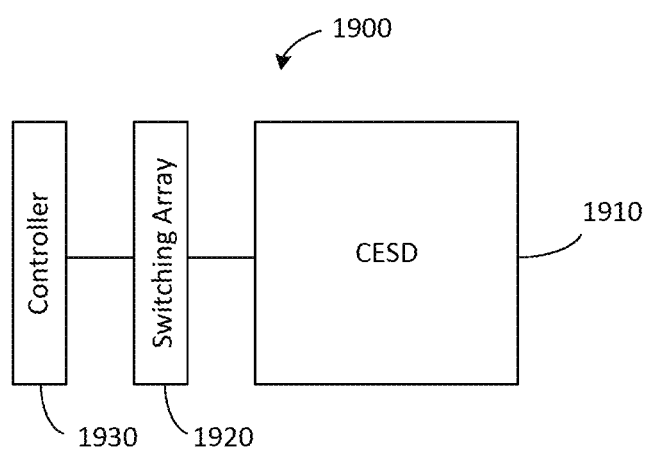
FIG. 19 is a simplified schematic diagram of a device comprising a CESD, a switching array, and a controller.

A device 1900 comprising a CESD may include a CESD 1910, which may be any of the CESDs as disclosed herein, a switching array 1920, and a controller 1930 including a logic circuit for controlling the switching array 1920 as shown in FIG. 19. The switching array 1920 is operable to activate groups of electrodes in the CESD 1900, thereby addressing one or more capacitive elements in the CESD, e.g., as described with respect to FIGS. 3-17.

Figure 20:
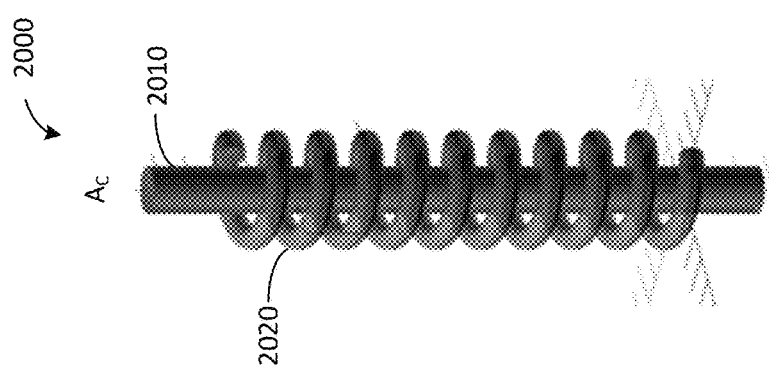
FIG. 20 is a perspective view of an exemplary tubular CESD having a first electrode and a second electrode in a spiral configuration around the first electrode.

FIG. 20 shows a tubular CESD 2000. The tubular CESD 2000, as illustrated in FIG. 20, comprises a first electrode 2010 and a second electrode 2020. Optionally, the first electrode 2010 may have an insulative coating on its outer surface. As shown, the first electrode 2010 has a right cylindrical configuration. However, the first electrode 2010 may have other configurations, such as a polygonal cylinder, an elliptical cylinder, etc. The second electrode 2020 has a spiral configuration and is wrapped around the first electrode 2010. The second electrode 2020 is adjacent to, but is not in direct contact with, the first electrode 2010. The first and second electrodes 2010, 2020 have opposite polarities during use. A dielectric material (not shown for the sake of clarity) fills spaces between electrodes 2010, 2020. In some embodiments, the spaces between electrodes 2010, 2020 are created by utilizing a coated wire as the second electrode 2020 and subsequently removing the coating by any suitable means (e.g., a laser or chemical dissolution) before filling the spaces with the dielectric material.

Figure 21:
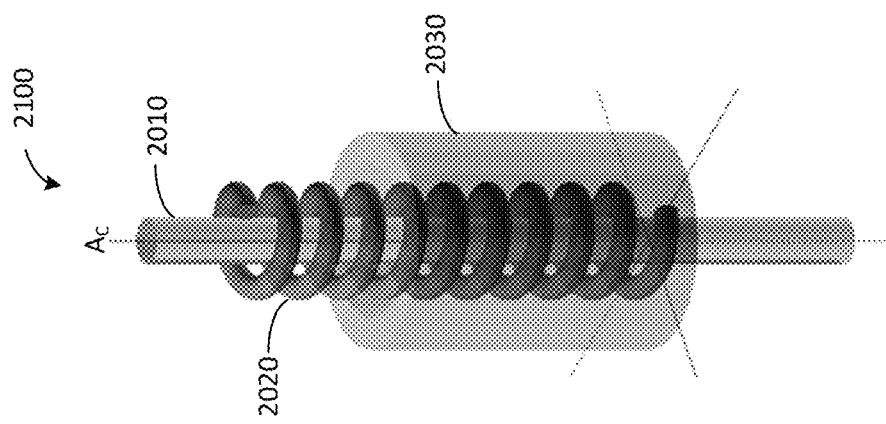
FIG. 21 is a perspective view of an exemplary tubular CESD having a first electrode, a second electrode in a spiral configuration around the first electrode, and a tubular third electrode surrounding the first and second electrodes.

FIG. 21 shows another embodiment of a tubular CESD 2100. The tubular stacked CESD 2100, as illustrated in FIG. 21, comprises a first electrode 2010, a second electrode 2020, and a third electrode 2030. The first electrode 2010 and second electrode 2020 are as described above. The third electrode 2030 has a tubular configuration and encircles or surrounds the first and second electrodes 2010, 2020 without being in direct contact with second electrode 2020 or first electrode 2010. The third electrode 2030 is illustrated as being translucent in FIG. 21 simply for the sake of clarity so that the arrangement of electrodes 2010 and 2020 can be seen to extend throughout the interior space defined by the third electrode 2030. In an actual CESD 2100, the third electrode 2030 is not translucent. The third electrode 4030 has the same polarity as the first electrode 2010 and has a polarity opposite that of the second electrode 2020 during use. A dielectric material (not shown for the sake of clarity) fills spaces between electrodes 2010, 2020, 2030. The first electrode 2010, spiral second electrode 2020, and tubular third electrode 2030 each have a central axis AC, wherein the central axes are coaxial. Optionally, the tubular stacked CESD further comprises an outer nonconductive sealing material applied to outer surfaces of the third electrode 2030. The outer nonconductive sealing material may electrically isolate the tubular stacked CESD, provide resistance to fluid flow when using a fluid dielectric material, and/or provide additional mechanical strength to the tubular stacked CESD. Suitable nonconductive sealing materials include, but are not limited to, polymerized p-xylylene (e.g., Puralene™ polymer), a copolymer comprising p-xylylene and a co-monomer, polyethylene terephthalate, shellac, polyurethane, or crosslinked polyurethane.

It is clear to those versed in multiconductor cable manufacture that the electrodes illustrated by FIG. 21 can be intertwined around each other. In other words the center electrode could be formed in a spiral manner as to be in close proximity to the outer spiral electrode without touching. In the course of winding such a device similar to FIG. 21, such geometrical bending and winding is common. In a similar manner multiple conductors (electrodes of both polarities) can be wound together to make a single bundle (not shown).

Further layers can be added to CESD 2100 by including additional alternating spiral and tubular electrodes. For instance, another, larger spiral electrode 2020 may be wrapped around the third electrode 2030 without being in direct contact with third electrode 2030, and another, larger tubular electrode 2030 may surround the inner layers. All spaces between the electrodes are filled with a dielectric material. The number of layers is only limited by manufacturing and size constraints. The first electrode 2010 and third electrodes 2030 may be connected in parallel using a first electrical interconnect (not shown), and the second electrodes 2020 may be connected in parallel using a second electrical interconnect (not shown). During use, two or more CESDs 2100 can be connected in parallel using electrical interconnects (not shown).

Figure 22A:
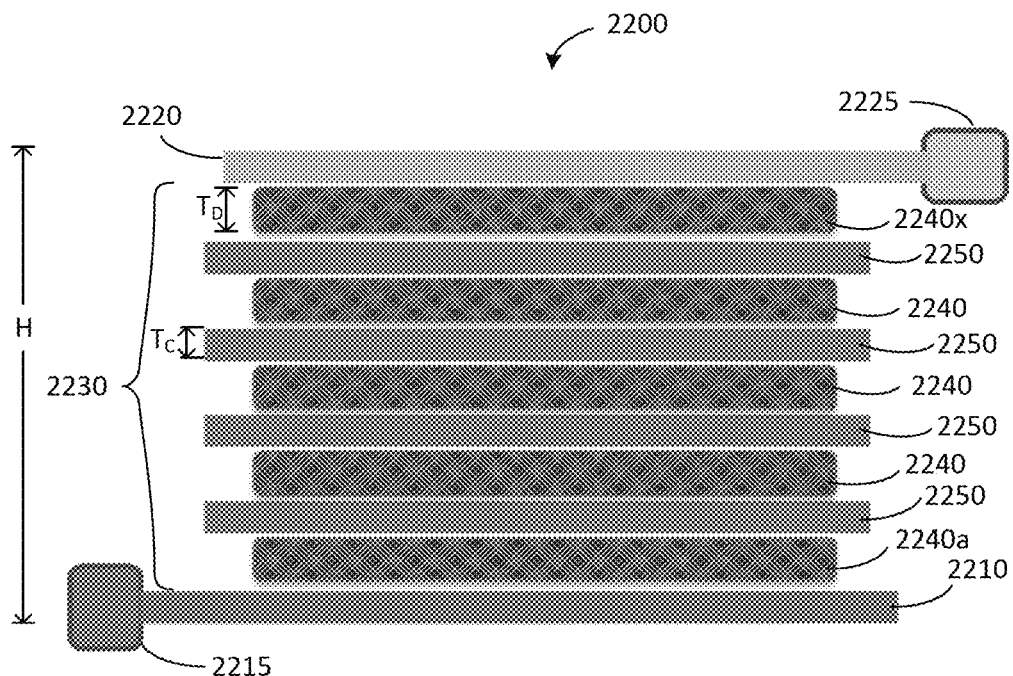
FIGS. 22A and 22B are a cross-sectional side view (22A) and a perspective view (22B) of an exemplary stacked CESD.
Figure 22B:
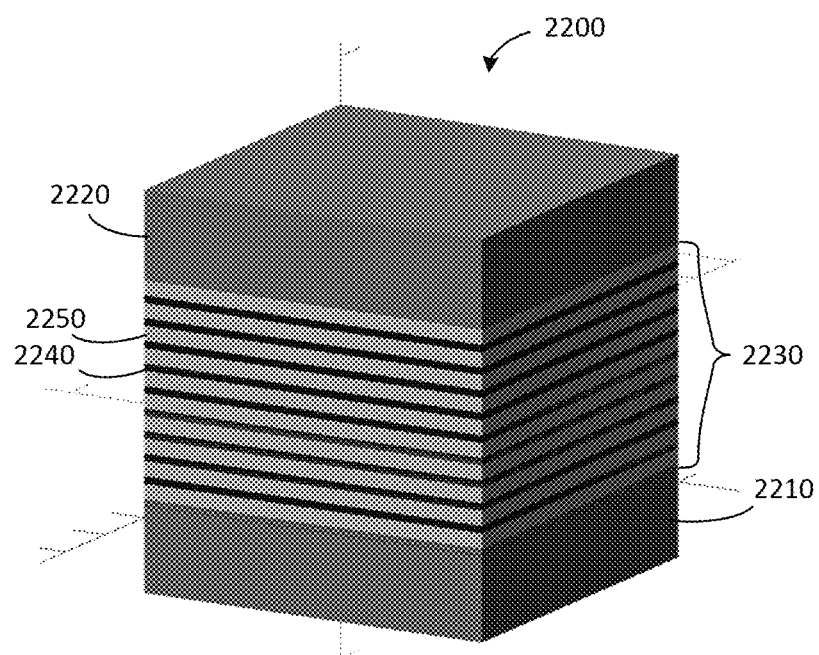

In some embodiments, as shown in FIGS. 22A and 22B, a stacked CESD 2200 includes a first electrode 2210, a second electrode 2220 parallel to and spaced apart from the first electrode, thereby forming a space between the first and second electrodes, and a stacked arrangement 2230 of alternating layers of a dielectric material 2240 and a conductive material 2250 disposed parallel to the first and second electrodes and occupying the space between the first and second electrodes. Connectors 2215 and 2225 are for external electrical connections. Apparent gaps between elements of the stacked CESD 2200 in FIG. 22A are shown for clarity purposes only and are not present in the actual device.

With reference to FIG. 22A, the stacked arrangement 2230 comprises x layers of a dielectric material, wherein (i) x is an integer greater than or equal to two, (ii) a first layer of the dielectric material 2240a is in direct contact with the first electrode 2210, and (iii) layer x of the dielectric material 2240x is in direct contact with the second electrode 2220. The stacked arrangement further comprises y layers of a conductive material, wherein y=x−1 and a layer of the conductive material is positioned between each pair of adjacent layers of the dielectric material. There is also direct contact between adjacent layers of dielectric material 2240 and conductive material 2250.

The stacked arrangement 2230 provides a CESD wherein the multiple layers of dielectric material and conductive material are stacked in series. Advantageously, the stacked CESD 2200 requires no internal electrical connections, other than direct contact, between the stacked alternating layers of dielectric material and conductive material. FIG. 22A shows a slight gap between layers such as 2240 and 2250; the gap is shown only for clarity in the drawing. The materials are in direct contact with each other.

Embodiments of the stacked CESD 2200 include x layers of the dielectric material 2240, wherein x is an integer greater than or equal to two, and y layers of the conductive material 2250, wherein y=x−1. From a theoretical standpoint, the number of layers is essentially unlimited. However, the number of layers may be practically limited by manufacturing constraints (e.g., difficulty in forming many layers having a reproducible thickness). In some embodiments, x is an integer from 2-5000, 2-1000, 2-500, 2-100, 2-50, 2-25, 2-10, or 2-5. For example, x may be 2, 3, 4, 5, 6, 7, 8, 9, or 10. In such arrangements, y is 1, 2, 3, 4, 5, 6, 7, 8, or 9, respectively. In the nonlimiting exemplary stacked CESD of FIG. 22A, x is 5 and y is 4.

Each conductive material layer may have a thickness Tc (as shown in FIG. 22A) within a range of from 0.0005 μm to 10000 µm, such as a thickness within a range of from 0.005-10000 µm, 0.005-1000 µm, 0.005-500 µm, 0.01-500 µm, 0.01-100 µm, 0.02-100 µm, 0.05-100 µm, 0.05-50 µm, 0.05-10 µm, or 0.05-5 µm. In some embodiments, the thickness of each conductive material layer is the same. By "the same" is meant that the thickness of each layer varies by less than ±5% relative to an average thickness of the layers, such by less than ±2% relative to an average thickness of the layers.

Figure 23:
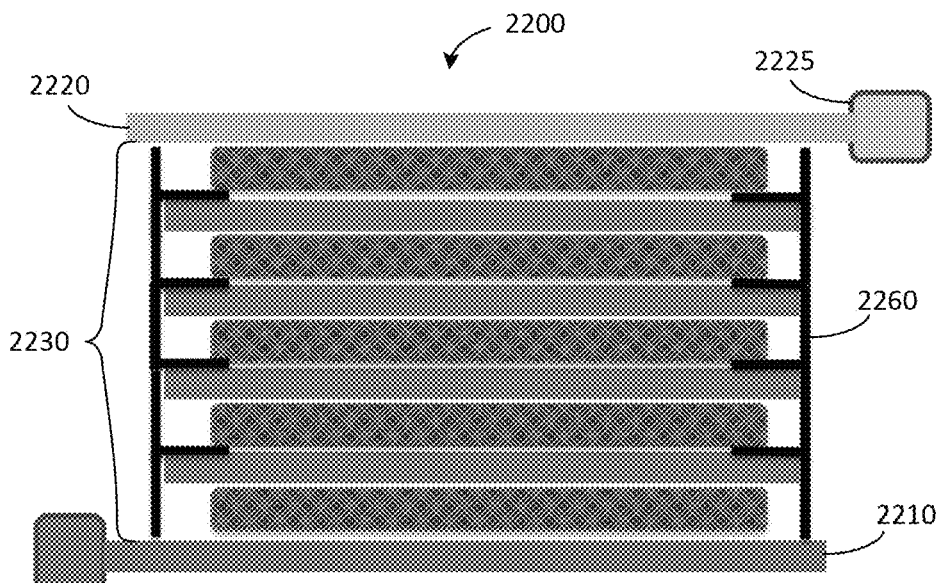
FIG. 23 is a cross-sectional side view of an exemplary stacked CESD further including a sealing material on side edges of the CESD.

Optionally, as shown in FIG. 23, the stacked CESD 2200 further includes a nonconductive sealing material 2260 in contact with one or more side edges of the stacked arrangement 2230 and extending from the first electrode 2210 to the second electrode 2220. The nonconductive sealing material may electrically isolate the stacked CESD, provide resistance to fluid flow when using a fluid dielectric material, and/or provide additional mechanical strength to the stacked CESD. Suitable nonconductive sealing materials include, but are not limited to, polymerized p-xylylene (e.g., Puralene™ polymer), a copolymer comprising p-xylylene and a co-monomer, or polyethylene terephthalate. Again, the gaps shown between the layers do not exist, and are shown only to clearly distinguish the layers.

As shown in FIG. 22A, the stacked CESD has a height H, as measured from an outwardly facing surface of the first electrode to an outwardly facing surface of the second electrode. In some embodiments, the height H is within a range of from 0.025 µm to 2000 µm, such as a height within a range of from 0.05-2000 µm, 0.1-2000 µm, 1-2000 µm, 1-1000 µm, 5-1000 µm, 10-1000 µm, 10-500 µm, 10-200 µm, or 10-100 µm.

Figure 24A:
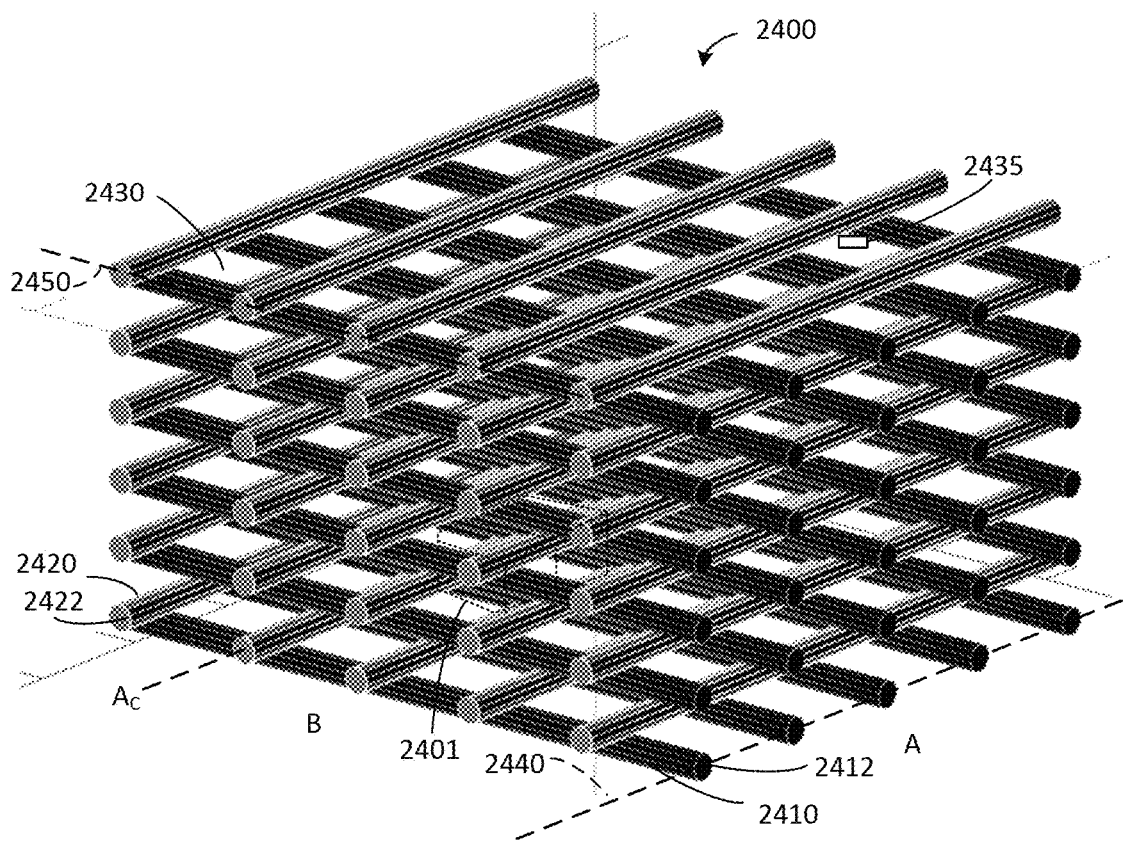
FIGS. 24A-24C are a perspective view, a bottom view, and a cross-sectional side view, respectively, of an exemplary stacked CESD including a plurality of layers of parallel electrodes wherein the electrodes in a given layer have a common polarity, electrodes in adjacent layers have opposite polarities, and electrodes in each layer are oriented at right angles relative to electrodes in the adjacent layer(s).
Figure 24B:
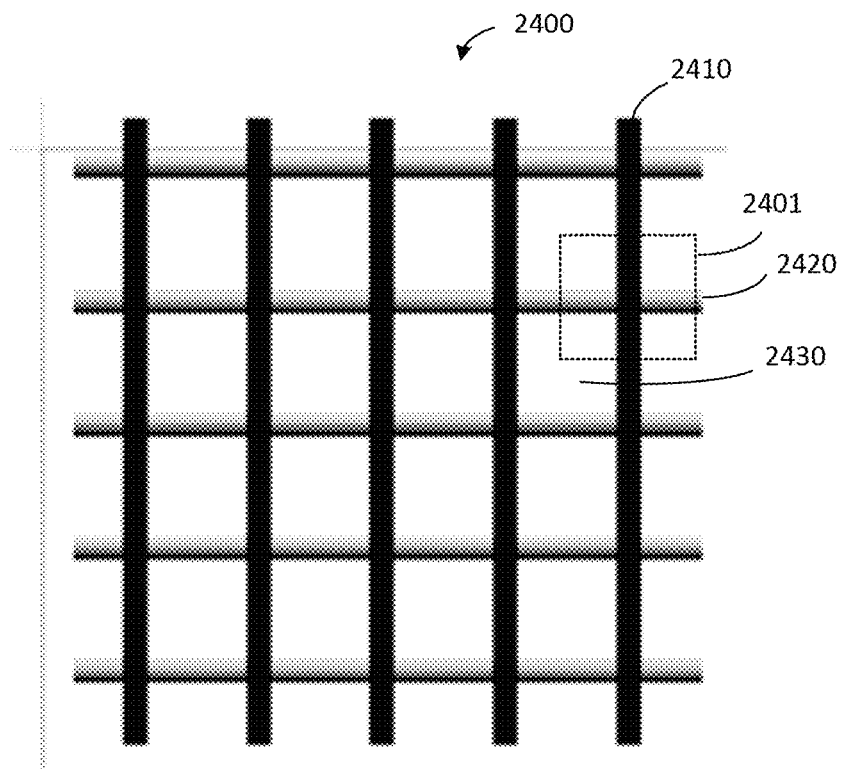
Figure 24C:
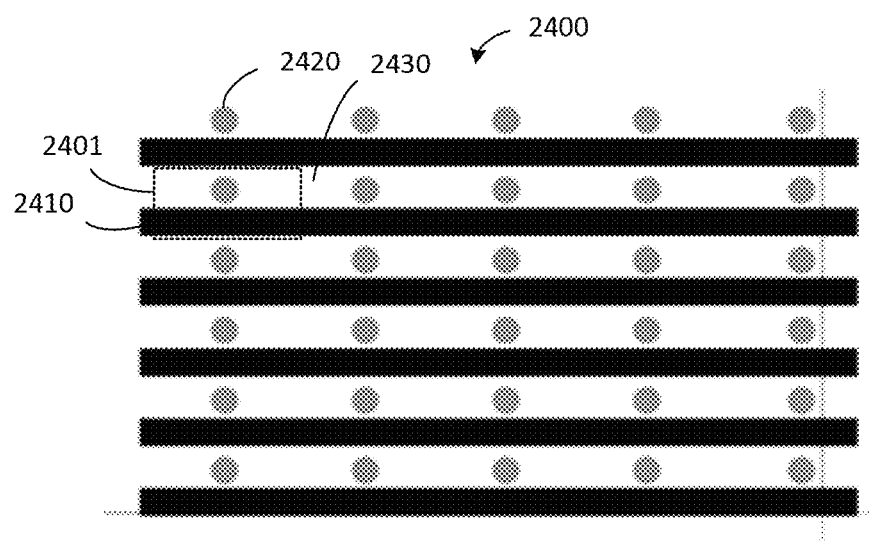

In some embodiments, a stacked CESD includes an array of spaced-apart electrodes arranged in a plurality of parallel planes or layers with a dielectric material filling spaces between the electrodes. FIGS. 24A-24C show a stacked CESD 2400 including n groups of parallel electrodes arranged in n stacked parallel planes or layers, the CESD comprising alternating planes or layers of first electrodes 2410 and second electrodes 2420. FIG. 24A is a perspective view of CESD 2400, and FIGS. 24B and 24C are bottom and side views, respectively. The dotted lines indicate a unit cell 2401. Each electrode 2410, 2420 has a central axis $A_C$ parallel to the plane in which the electrode is located. In the exemplary CESD of FIG. 24, electrodes 2410 and 2420 have opposing polarities during use. Each electrode in a given layer (e.g., all electrodes 2410 in a given layer) have the same polarity during use. A dielectric material 2430 occupies the spaces between the electrodes 2410, 2420 and contacts the electrodes. Regions of the dielectric material 2430 located between adjacent electrodes 2410, 2420 of opposing polarities define capacitive elements 2435. Electrodes 2410 in any given layer are vertically aligned with electrodes 2410 in other layers. Electrodes 2420 in any given layer are vertically aligned with electrodes 2420 in other layers. In some embodiments, the CESD 2400 has a quadrilateral configuration defining four side edges of the CESD. Advantageously, one end of each electrode (e.g., electrode ends 2412, 2422) protrudes from the dielectric material 2430 at one side edge of the CESD such that electrical connections can be made. In certain embodiments, a conductive material (not shown) is applied to two adjacent side edges, e.g., side edges A and B, of the CESD 2400 such that protruding ends 2412 are in contact with and electrically connected in parallel with the conductive material on one side edge of the CESD 2400 and protruding ends 2422 are in contact with and electrically connected in parallel with the conductive material on an adjacent side edge of the CESD 2400. During use, the conductive material on one side edge of the CESD is connected to a voltage source, and the conductive material on the adjacent side edge of the CESD is connected to Vss.

In an independent embodiment, electrodes in a lowermost layer of the CESD 2400, e.g., electrodes 2410 in the lowermost layer are connected in series with an electrical interconnect 2440; electrodes in an uppermost layer of the CESD 2400, e.g., electrodes 2420 in the uppermost layer, are connected in series with an electrical interconnect 2450.

In one embodiment, electrodes of a given polarity from two or more layers are connected in series, e.g., vertically aligned electrodes 2420 are serially connected using an electrical interconnect 2440. In another embodiment, electrodes in a given layer (i.e., horizontally aligned electrodes of a given polarity) are serially connected using an electrical interconnect 2450.

Figure 25:
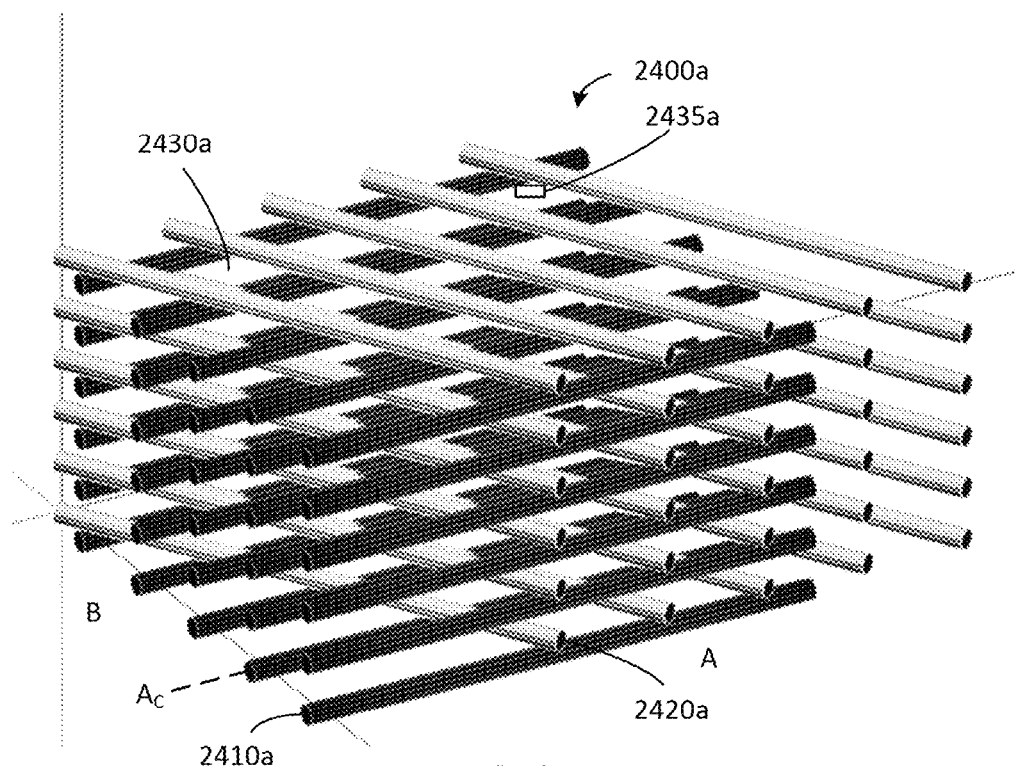
FIG. 25 is a perspective view of an exemplary stacked CESD including a plurality of layers of parallel electrodes wherein the electrodes in a given layer have a common polarity, electrodes in adjacent layers have opposite polarities, and the parallel electrodes in each layer are rotated such they are not oriented at right angles relative to the parallel electrodes in the adjacent layer(s).

In the exemplary CESD of FIG. 24, electrodes 2420 are oriented at right angles to electrodes 2410. However, a perpendicular orientation is not required. FIG. 25 shows a stacked CESD 2400a including n groups of parallel electrodes arranged in n stacked parallel planes or layers, the CESD comprising alternating layers of first electrodes 2410a and second electrodes 2420a. Each electrode 2410a, 2420a has a central axis $A_C$ parallel to the plane in which the electrode is located. A dielectric material 2430a occupies the spaces between the electrodes 2410a, 2420a and contacts the electrodes. Electrodes 2410a and 2420a have opposing polarities during use. Regions of the dielectric material 2430a located between adjacent electrodes of opposing polarities define capacitive elements 2435a. The electrodes 2410a and 2420a are not oriented at right angles to one another. In contrast, electrodes 2420a are rotated from 90° relative to electrodes 2410a. In FIG. 25, the rotation is 30° from right angles. The degree of rotation is not limited to 30°, however. The degree of rotation may be, for example, within a range of 0-90°, 0-45°, 5-45°, 10-45°, 15-40°, or 20-35°, such as a degree of rotation of 0°, 5°, 10°, 15°, 20°, 25°, 30°, 35°, 40°, or 45°. Furthermore, although the orientation of each layer of electrodes 2410a is the same and the orientation of each layer of electrodes 2420a is the same in the exemplary CESD 2400a of FIG. 24, the configuration is not so limited. Indeed each successive layer of electrodes may be rotated relative to the plane directly below, thereby producing a twisting spiral configuration of the electrodes (not shown).

Figure 26A:
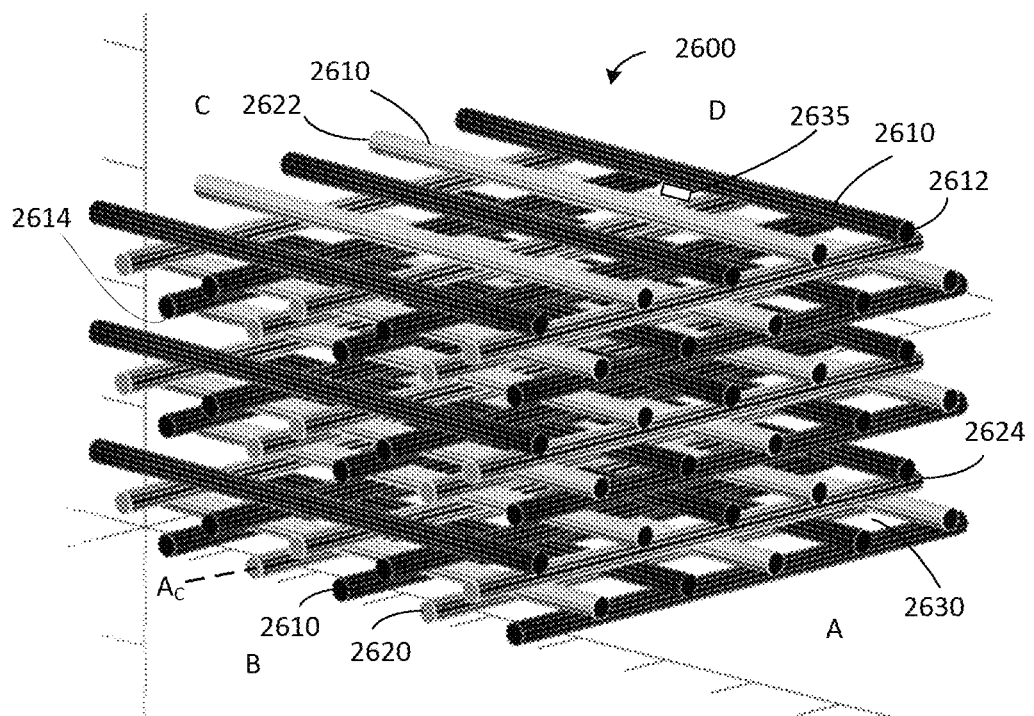
FIGS. 26A-26D are, respectively a perspective view, a bottom view, and two cross-sectional side views of an exemplary stacked CESD including a plurality of layers of parallel electrodes wherein the electrodes in a given layer have alternating polarities, and electrodes in each layer are oriented at right angles relative to electrodes in the adjacent layer(s).
Figure 26B:
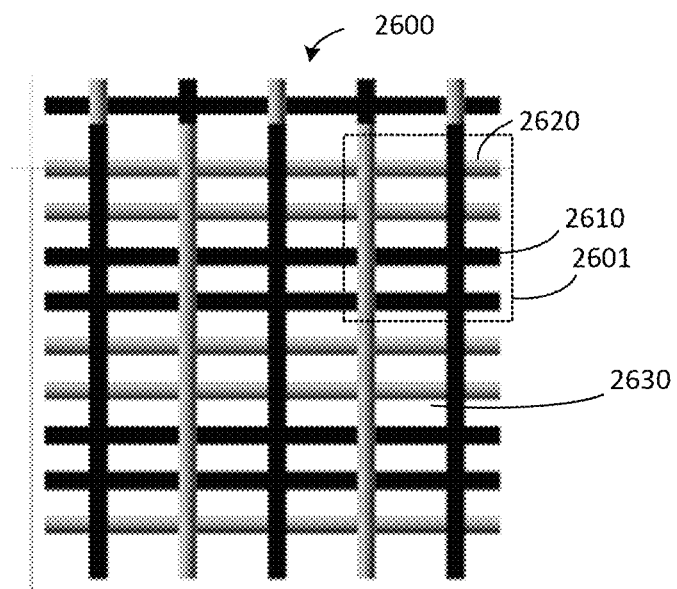
Figure 26C:
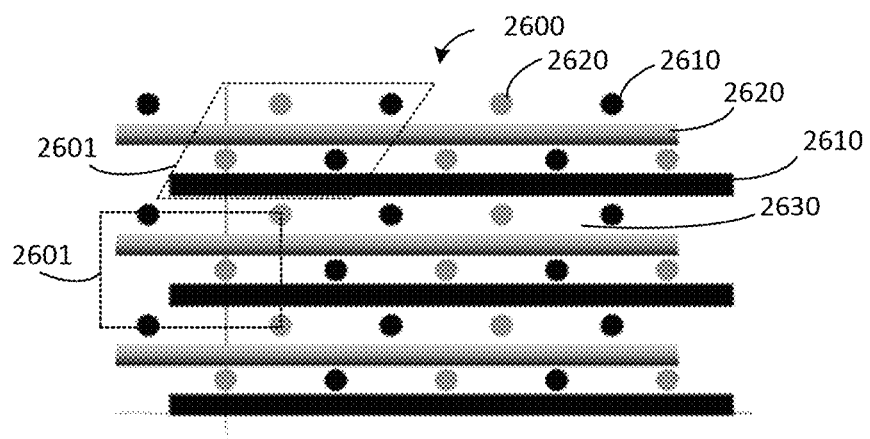
Figure 26D:
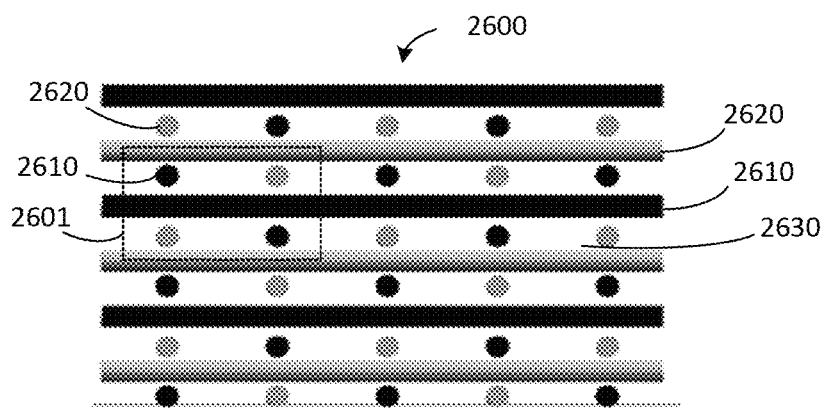

FIGS. 26A-26D show a stacked CESD 2600 including n groups of parallel electrodes arranged in n stacked parallel planes or layers, the CESD comprising planes or layers of electrodes 2610, 2620. FIG. 26A is a perspective view of CESD 2600, FIG. 26B is a bottom view, and FIGS. 26C and 26D are side views with offset and vertically aligned electrodes, respectively. The dotted lines indicate a unit cell 2601. Each electrode 2610, 2620 has a central axis $A_C$ parallel to the plane in which the electrode is located. A dielectric material 2630 occupies the spaces between the electrodes 2610, 2620 and contacts the electrodes. Electrodes 2610, 2620 have opposing polarities during use. Regions of the dielectric material 2630 located between adjacent electrodes of opposing polarities define capacitive elements 2635. In each layer, electrodes 2610 alternate with electrodes 2620. Thus, each layer includes electrodes of alternating polarities. The CESD 2600 may have a quadrilateral configuration defining four side edges A, B, C, D. Advantageously, one end of each electrode, e.g., electrode ends 2612, 2622, protrudes from the dielectric material 2630 at one side edge such that electrical connections can be made. Because the electrodes alternate in polarity in each layer, electrode ends 2612, 2622 protrude from opposing sides of the CESD 2600, e.g., sides A, C. Similarly, electrode ends 2614, 2624 protrude from the two remaining opposing sides of the CESD 2600, e.g., sides B, D. In some embodiments, a conductive material is applied to each of the four side edges of the CESD 2600 such that protruding electrode ends of each side edge are in contact with and electrically connected in parallel with the conductive material on that side edge. The conductive material on two adjacent side edges is connected to a voltage source, and the conductive material on the two remaining side edges is connected to Vss, e.g., ground. For example, the conductive materials in contact with electrode ends 2612, 2614 may be connected to a voltage source and the conductive materials in contact with electrode ends 2622, 2624 may be connected to Vss. Alternatively, an electrical interconnect on one side edge of the CESD can be used to serially connect electrodes of a given polarity in a particular plane, and an electrical interconnect on the opposing side edge of the CESD can be used to serially connect electrodes having the opposite polarity in that particular plane.

In the stacked CESD 2600 as illustrated in FIGS. 26A and 26C, there is a plane/plane offset such that electrodes in the alternating layers with the same orientation, e.g., electrodes in the first and third layers or electrodes in the second and fourth layers, are not vertically aligned with one another. However, in some examples, there may be no offset such that the electrodes in alternating layers with the same orientation are vertically aligned with one another (FIG. 26D). In the exemplary embodiment of FIG. 26, electrodes in each layer are oriented at right angles to electrodes in adjacent layers. However, as described above with respect to CESD 2400a (FIG. 25), the electrodes in any layer may be rotated from 0-90° relative to electrodes in the adjacent layers. The degree of rotation may be, for example, within a range of 0-45°, 5-45° 10-45°, 15-40°, or 20-35°, such as a degree of rotation of 0°, 5°, 10°, 15°, 20°, 25°, 30°, 35°, 40°, or 45°. Furthermore, each successive layer of electrodes may be rotated relative to the plane directly below, thereby producing a twisting spiral configuration of the electrodes (not shown).

Although the electrodes 2410, 2410a, 2420, 2420a, 2610, and 2620 in FIGS. 24-26 are illustrated as having a right cylindrical configuration, it is to be understood that the electrodes alternatively may have a complex surface geometry. For example, the electrodes may have a cross-sectional area that is semi-circular, elliptical or polygonal. As another example, the electrodes may have a regular or smooth surface, or an irregular or rough surface.

Figures 27A, 27B:
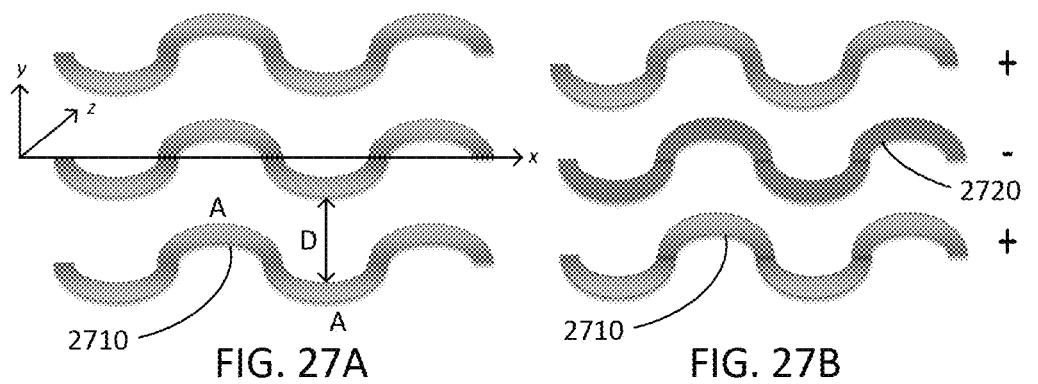
FIGS. 27A and 27B show two parallel arrangements of twisted wire electrodes wherein adjacent electrodes have the same polarity (27A) or opposite polarities (27B).

In still other examples, the electrodes may be twisted or sinuous wires or traces. FIG. 27A shows a plurality of parallel, twisted or sinuous electrodes 2710 which may be used in the foregoing embodiments. By parallel is meant that the curves in adjacent electrodes are in phase with one another. For instance, if the x-axis extends along the length of the electrode 2710, and the curves have a positive or negative amplitude with respect to the x-axis, then the apices A (i.e., points of maximum deviation) of the curves of any two adjacent electrodes at any given distance along the x-axis have the same direction from the x-axis. The curves may deviate from the x-axis in the y-direction or the z-direction. In some embodiments, the curves of any two adjacent electrodes at any given distance along the x-axis have the same, or substantially the same, amplitude and direction from the x-axis such that the distance D between the adjacent electrodes is the same, or substantially the same along the length of the x-axis. Each of the electrodes 2710 has the same polarity. FIG. 27B shows another parallel arrangement in which alternating electrodes 2710, 2720 have opposite polarities.

Figures 28A, 28B:
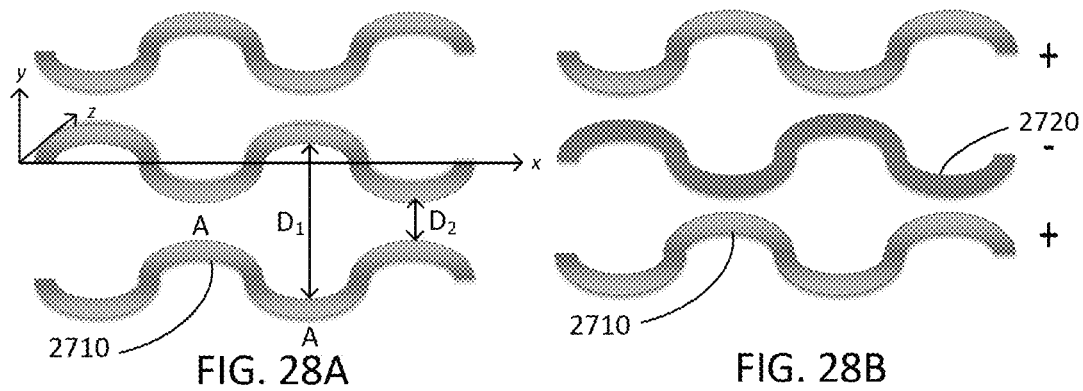
FIGS. 28A and 28B show two antiparallel arrangements of twisted wire electrodes wherein adjacent electrodes have the same polarity (28A) or opposite polarities (28B).

FIG. 28A shows an antiparallel arrangement including a plurality of twisted or sinuous electrodes 2710, wherein each of the electrodes 2710 has the same polarity. By antiparallel is meant that the curves in adjacent electrodes are out of phase with one another, such as 180° out of phase. For instance, if the x-axis extends along the length of the electrode 2710, and the curves have a positive or negative amplitude with respect to the x-axis, then the curves of any two adjacent electrodes at any given distance along the x-axis have opposite directions from the x-axis. The curves may deviate from the x-axis in the y-direction or the z-direction. In some embodiments, the apices of the curves of any two adjacent electrodes at any given distance along the x-axis have the same, or substantially the same, amplitude but opposite directions from the x-axis such that the distance between the adjacent electrodes varies from a maximum distance $D_1$ to a minimum distance $D_2$ along the length of the x-axis. FIG. 28B shows another antiparallel arrangement in which alternating electrodes 2710, 2720 have opposite polarities. An increased E-field may be produced where the electrodes are in closer proximity to one another. The energy storage in these areas is larger due to increases in the E-field and its shape.

Figures 29A, 29B:
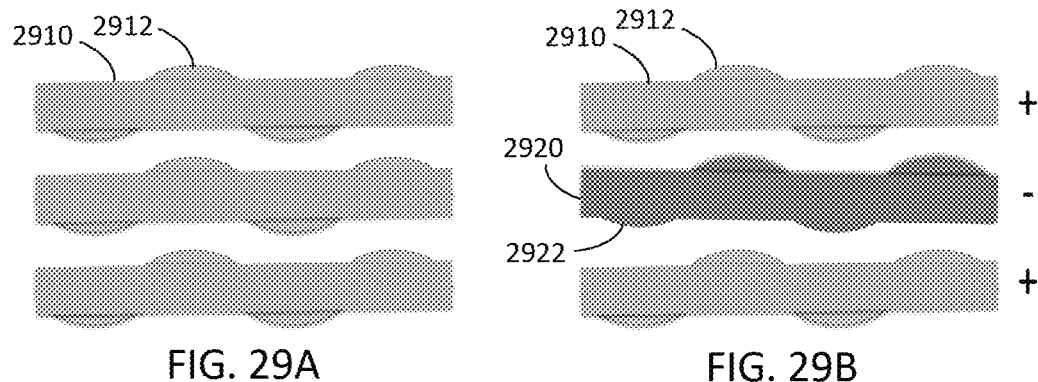
FIGS. 29A and 29B show two parallel arrangements of wire electrodes, each electrode including periodic protrusions along the length of the electrode, wherein adjacent electrodes have the same polarity (29A) or opposite polarities (29B).
Figures 30A, 30B:
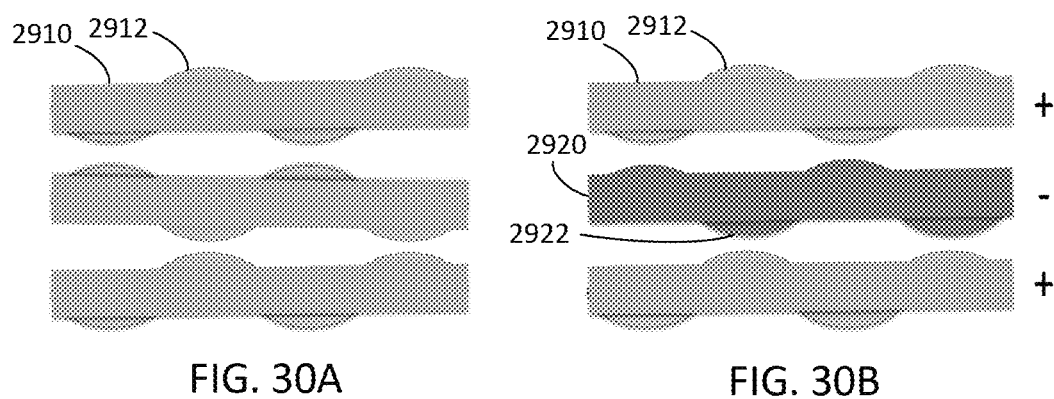
FIGS. 30A and 30B show two antiparallel arrangements of wire electrodes, each electrode including periodic protrusions along the length of the electrode, wherein adjacent electrodes have the same polarity (30A) or opposite polarities (30B).

In further examples, a sinuous wire-type electrode may be formed with a wire including periodic protrusions or bumps along the electrode's surface. FIG. 29A shows a plurality of parallel electrodes 2910, each electrode 2910 including periodic protrusions 2912 along the length of the electrode. Each of the electrodes 2910 has the same polarity. FIG. 29B shows another parallel arrangement in which alternating electrodes 2910 with periodic protrusions 2912 and electrodes 2920 with periodic protrusions 2922 have opposite polarities. FIG. 30A shows an antiparallel arrangement in which each of the electrodes 2910 has the same polarity. FIG. 30B shows another antiparallel arrangement in which alternating electrodes 2910, 2920 have opposite polarities.

A person of ordinary skill in the art understands that the stacked CESDs exemplified in FIGS. 24-26 may further include edge connectors (not shown, but similar in nature to edge connectors 2215, 2225 of FIG. 23) for external connections to the electrodes and/or a nonconductive sealing material (not shown, but similar in nature to nonconductive sealing material 2260 of FIG. 23) in contact with one or more side edges of the stacked arrangement. The stacked CESD may further include a nonconductive sealing material on the upper and lower surfaces of the stacked CESD (not shown). The nonconductive sealing material may electrically isolate the stacked CESD, provide resistance to fluid flow when using a fluid dielectric material, and/or provide additional mechanical strength to the stacked CESD. Suitable nonconductive sealing materials include, but are not limited to, polymerized p-xylylene (e.g., Puralene™ polymer), a copolymer comprising p-xylylene and a co-monomer, or polyethylene terephthalate.

Electrical connections to the stacked CESDs of FIGS. 24-26 may be made in different ways. In some instances, electrical connections to the appropriate polarities are made only to the uppermost and lowermost layers of electrodes, and the inner layers are allowed to "float." However, the number of layers would be limited as the overall voltage across the device would increase to very high values. Alternatively, individual layers of electrodes may be connected to their corresponding polarities in a perpendicular plane or in multiple perpendicular planes. Edge connections have several advantages, including that the individual electrodes will have lower resistance and impedance connections to the flowing electrical charges and the CESDs will be relatively easy to connect with larger dimensionality. To facilitate edge connections, a given polarity of electrodes are allowed to protrude from a given side more than electrodes of the opposite polarity. In this way, a conductive material can be applied to that entire side to make parallel electrical connections between the individual electrodes and an electrical bus. Other sides of the stacked CESD can be treated similarly. When each layer of the stacked CESD includes electrodes with alternating polarities, two opposing sides of the CESD will be used to make the connections. The two remaining sides will be used for electrical connections to electrodes in the adjacent planes, which have a different orientation as illustrated in FIGS. 24-26.

Figure 31:
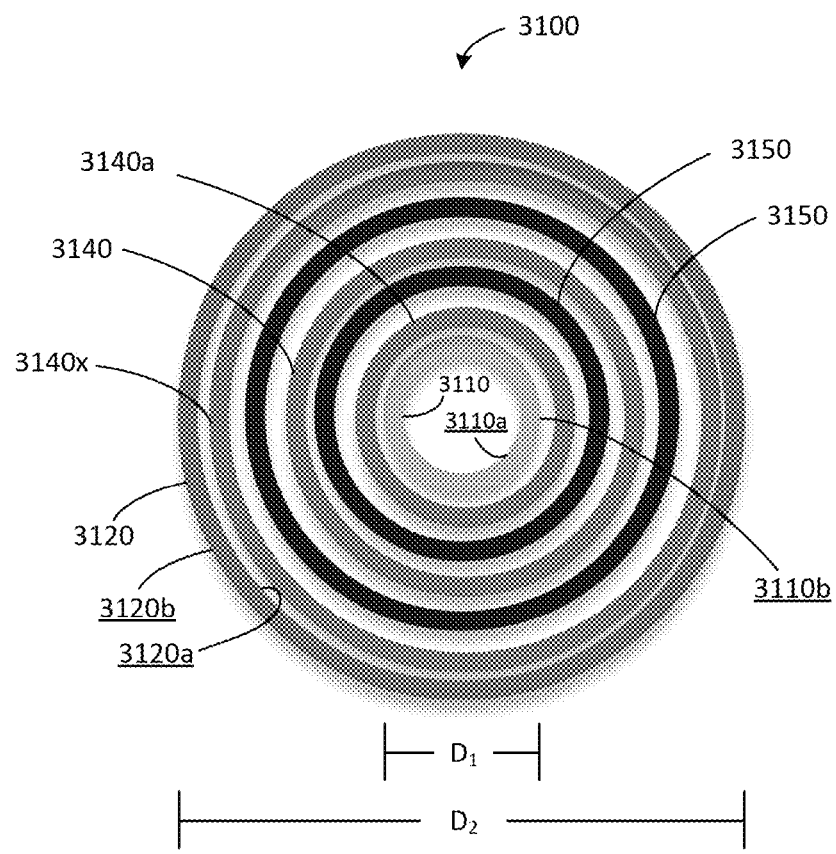
FIG. 31 is a cross-sectional view of an exemplary tubular stacked CESD having a cylindrical configuration.

FIG. 31 illustrates a cross-section of an exemplary tubular stacked CESD 3100 having a cylindrical configuration. Apparent gaps between elements of the stacked CESD 3100 are shown for clarity purposes only and are not present in the actual device. In the embodiment of FIG. 31, the first electrode 3110 has a cylindrical configuration, an inwardly facing surface 3110*a*, an outwardly facing surface 3110*b*, and an outer diameter $D_1$. The first electrode 3110 may be a hollow tube, such as a hollow metal tube as shown. Alternatively, the first electrode 3110 may be a solid tube, such as a metal solid tube (not shown). It is understood that when the first electrode 3110 is a solid tube, the electrode does not have an inwardly facing surface. The second electrode 3120 has a cylindrical configuration, an inwardly facing surface 3120*a*, an outwardly facing surface 3120*b*, and an inner diameter $D_2$, wherein the inner diameter $D_2$ is greater than the outer diameter $D_1$ of the first electrode 3110. The first and second electrodes 3110, 3120 are arranged such that the first electrode 3110 is positioned within a space defined by the inwardly facing surface 3120*a* of the second electrode 3120.

A stacked arrangement comprising alternating layers of dielectric material and conductive material is disposed between the outwardly facing surface of the first electrode and the inwardly facing surface of the second electrode in concentric alternating layers of the dielectric material and the conductive material. The stacked arrangement includes x layers of the dielectric material, wherein (i) x is an integer greater than or equal to two, (ii) a first layer of the dielectric material 3140*a* is in direct contact with the outwardly facing surface 3110*b* of the first electrode 3110, and (iii) layer x of the dielectric material 3140*x* is in direct contact with the inwardly facing surface 3120*a* of the second electrode 3120. The stacked arrangement further comprises y layers of the conductive material, wherein y=x−1 and a layer of the conductive material is positioned between each pair of adjacent layers of the dielectric material. The dielectric and conductive materials are as previously described.

Embodiments of the tubular stacked CESD 3100 include x layers of the dielectric material 3140, wherein x is an integer greater than or equal to two, and y layers of the conductive material 3150, wherein y=x−1. From a theoretical standpoint, the number of layers is essentially unlimited. However, the number of layers may be practically limited by manufacturing constraints (e.g., difficulty in forming many layers having a reproducible thickness). In some embodiments, x is an integer from 2-5000, 2-1000, 2-500, 2-100, 2-50, 2-25, 2-10, or 2-5. For example, x may be 2, 3, 4, 5, 6, 7, 8, 9, or 10. In such arrangements, y is 1, 2, 3, 4, 5, 6, 7, 8, or 9, respectively. In the nonlimiting exemplary stacked CESD of FIG. 31, x is 3 and y is 2.

Figure 32:
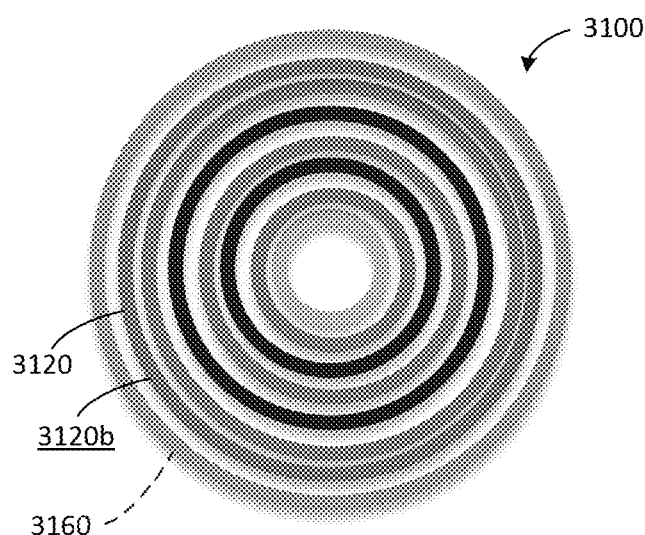
FIG. 32 is a cross-sectional view of the tubular stacked CESD of FIG. 31, wherein the tubular stacked CESD further includes an optional outer nonconductive coating.

Optionally, the tubular stacked CESD 3100 further comprises an outer nonconductive sealing material 3160 in contact with the outwardly facing surface 3120*b* of the second electrode 3120, as shown in FIG. 32. If desired, the outer nonconductive sealing material may be applied to all exterior surfaces of the tubular stacked CESD 3100. The outer nonconductive sealing material may electrically isolate the tubular stacked CESD, provide resistance to fluid flow when using a fluid dielectric material, and/or provide additional mechanical strength to the tubular stacked CESD. Suitable nonconductive sealing materials include, but are not limited to, polymerized p-xylylene (e.g., Puralene™ polymer), a copolymer comprising p-xylylene and a co-monomer, polyethylene terephthalate, shellac, polyurethane, or crosslinked polyurethane.

Advantageously, embodiments of the disclosed stacked CESDS as illustrated in FIGS. 22A, 22B, 31, and 32 function similarly to a plurality of serially-connected capacitors, thereby allowing use of higher voltages than would otherwise be suitable for conventional capacitors. With reference to FIGS. 22A and 22B, a voltage applied between the first and second electrodes 2210, 2220 is divided across the stack. When the layers of dielectric material have the same thickness, the voltage is evenly divided. Thus, if an exemplary voltage of 5V is applied across the stacked CESD 2200, a 1V drop will be observed across each of the five dielectric material layers 2240. Stacking increases the dimensionality of the CESD while retaining the ability to apply a high voltage to each conductive layer in the stack without having to make electrical connections to each individual layer. This feature allows higher voltages to be applied to the stacked CESD without resulting dielectric breakdown, as compared to voltages that can be applied to a capacitor including a single layer of dielectric material. Furthermore, embodiments of the disclosed stacked CESDs exhibit very little detectable leakage after being charged and may hold a charge for a greatly extended period of time compared to known electrolytic capacitors.

The electrodes in any or all of the foregoing embodiments may be any conductive material. Exemplary materials include, but are not limited to, conductive carbon, a conductive organic material other than carbon, a conductive metal, or a semiconductor.

In general, two or more of the disclosed CESDs may be connected serially or in parallel as would be understood by a person of ordinary skill in the art of electrical circuits. Tubular CESDs as shown in FIGS. 20 and 21, however, typically are connected in parallel to provide a two-connection device. Serial and/or parallel connections of CESDs may be made at the time of manufacture or subsequently by an end user.

Figure 33:
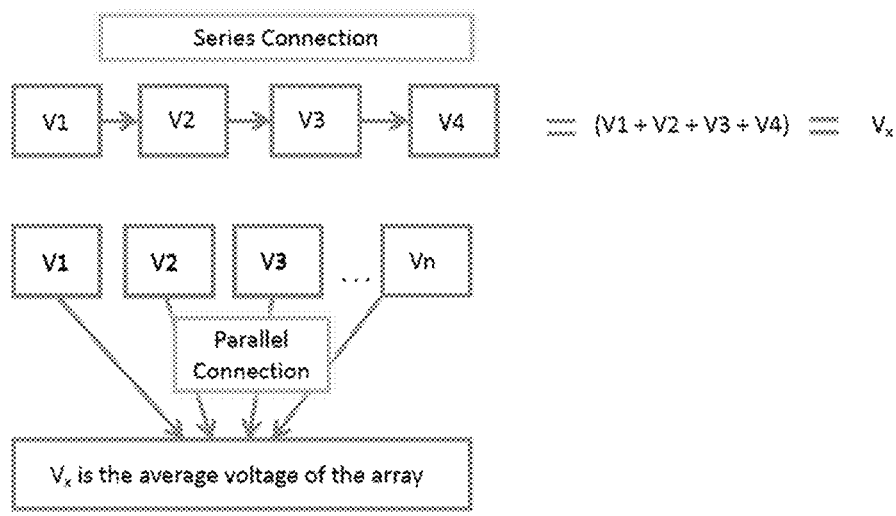
FIG. 33 is as schematic diagram illustrating possible series and parallel connections of capacitive elements in a CESD.

Selective switching of electrical connections to capacitive elements of a CESD allows combinations of the capacitive elements for use in computational devices. As shown in FIG. 33, individual capacitive elements may be concatenated in series or in parallel configurations, providing additive/subtractive, or averaged voltages, respectively. For example, in a stacked CESD, switches may be set to activate two adjacent electrodes in a first layer of electrodes, thereby applying a voltage across one or more capacitive elements between the two adjacent electrodes of the first layer. Additional switches may be set to activate another two adjacent electrodes in another region of the first layer or in another layer of electrodes in the CESD stack, thereby applying a voltage across one or more capacitive elements in the other region or layer. The switches may be externally connected in a desired configuration, e.g., in series or parallel, to combine the outputs as desired by methods well known to those skilled in the art of electrical circuitry and/or computational devices. These electrical connections are used to perform mathematical operations, and may be utilized directly as memory storage of a device to perform logical operations and computation as well as compression of stored data.

Figure 34:
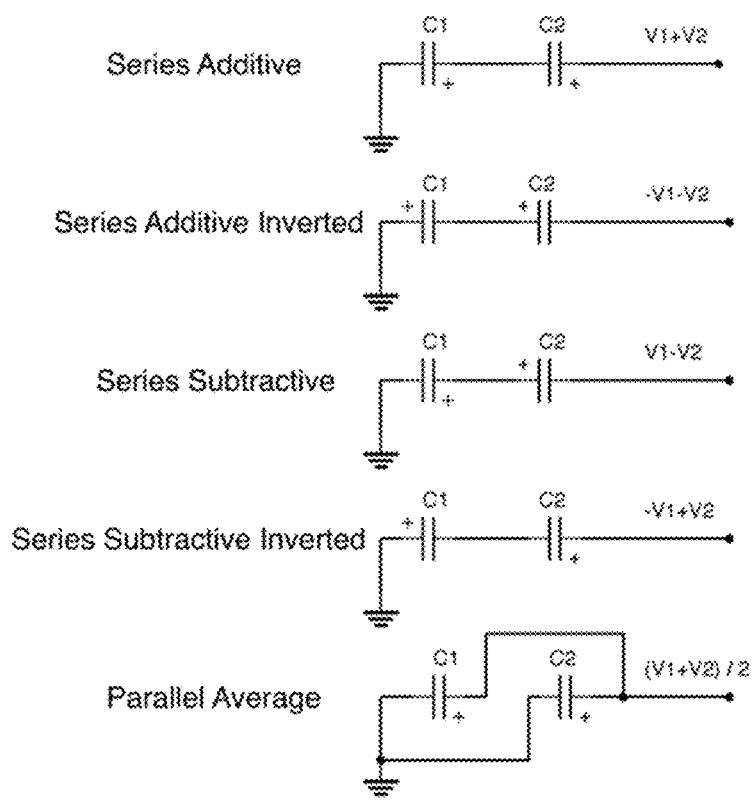
FIG. 34 shows several exemplary combinations of two capacitive elements in series or parallel.

FIG. 34 illustrates exemplary connections of two capacitive elements—series additive, series additive inverted, series subtractive, series subtractive inverted, and parallel average. A person of ordinary skill in the art understands that the illustrated concepts can be expanded to sets of multiple capacitive elements, thereby extending the commands to n×m elements. Concatenation of the operators can be used to provide new operators that can be configured and used within a single operational cycle. For example, extended numerical division can be performed using the ability to divide arrays of capacitive elements into other arrays simultaneously to provide division with essentially unlimited precision in a two-cycle operation. Basic operators include: ADD(n)—add n elements to give a sum (adding two elements also can be a logical AND or NAND); ADDI(n)—add n elements to give a negative sum; DIV(n,m)—divide n elements by m elements; SUB(n,m)—subtract element n from element m (subtracting two elements can be a logical OR or NOR); SUBI(n,m)—subtract element m from element n; AVE(n)—provides the averaged output of n elements; SFL(n)—shift left n elements; SFR(n)—shift right n elements. Table 2 shows resulting output voltages from several exemplary combinations of the capacitive elements as illustrated in FIG. 34:

TABLE 2

| Initial Charge Voltages | | Output Voltages | | | | |
|---|---|---|---|---|---|---|
| V1 | V2 | Series additive | Series Additive Inverted | Series Subtractive | Series Subtractive Inverted | Parallel Average |
| 0 | 0 | 0 | 0 | 0 | 0 | 0 |
| 0 | 1 | 1 | 1 | −1 | 1 | 0.5 |
| 1 | 0 | 1 | −1 | 1 | −1 | 0.5 |
| 1 | 1 | 2 | 0 | 0 | 0 | 1 |
| Threshold Voltages( ) | | OR (0.5) AND (1.5) | XOR (<>0) | XOR (<>0) | XOR (<>0) | OR (0.25) AND (0.75) |

Parallel connections can be used to perform multi-element logic operators on arrays. The voltage averaging that occurs can be used to reduce the overall voltage on the outputs to maintain common digital voltage levels. In some embodiments, a sense amplifier and/or a comparator may be used to decode voltages produced by connected capacitive elements. Advantageously, embodiments of the disclosed CESDs and CESD stacks may be used to manufacture computers capable of performing logical operations and computations much faster than conventional computers, such as up to 100× or 200× faster than conventional computers.

Figure 10:
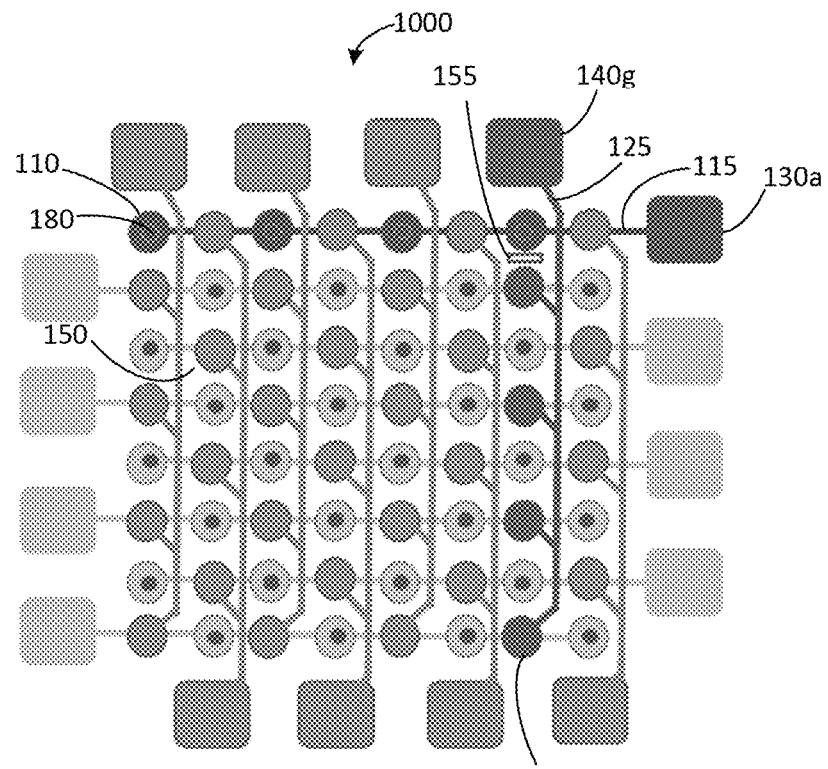
FIG. 10 illustrates activation of a single edge row group and a single interior column group of the CESD of FIG. 7, thereby accessing a single capacitive element.

In some embodiments, a CESD functions as both an energy storage device and a memory device. With reference, for example, to FIGS. 10 and 11, an edge row group of electrodes and all column groups including an electrode in the edge row may be activated to charge all capacitive elements between electrodes of the edge row and store energy. Individual electrodes elsewhere in the CESD can be addressed to read and write to one or more capacitive elements for memory storage. As illustrated schematically in FIG. 19, a switching array 310 and controller 320 comprising a logic circuit may be used to operate the CESD.

III. Dielectric and Insulative Materials

Embodiments of the disclosed CESDs comprise a dielectric material having a relative permittivity greater than silicon dioxide, i.e., greater than 3.9. In some embodiments, the dielectric material has liquid characteristics, and has a viscosity similar to honey or greater. In certain embodiments, the dielectric material has a viscosity greater than or equal to 0.5 cP, such as a viscosity from 10,000 cP to 250,000 cP. In an independent embodiment, the dielectric material is a solid.

The dielectric material may be substantially free of conductivity; in other words, the dielectric material does not undergo oxidation/reduction at or near the electrodes and does not exhibit Ohmic conductivity. In other embodiments, the dielectric material is conductive. The dielectric material may comprise a conductive or nonconductive polymer, an inorganic metal oxide, mixed metal oxides, mixed polymer and organic materials, or combinations thereof. In some examples, the polymer is a biopolymer.

In some embodiments, the dielectric material comprises polymeric molecules having polar and/or ionizable functional groups, resulting in intramolecular dipoles and dipole moments. The polymeric molecules may further include one or more double bonds. In some embodiments, the polymeric molecules are polar polymers. Proteins are readily available, inexpensive polar polymers that have low toxicity. The low toxicity is a large advantage over other polymers, and allows the CESDs to be recycled or incinerated. A protein molecule includes amino acids with polar and/or ionizable functional groups. Other suitable polymers include, but are not limited to, substituted (e.g., fluorinated) and unsubstituted parylene polymers, polypropylene, acrylic acid polymers, methacrylic polymers, polyethylene glycol, urethane polymers, epoxy polymers, silicone polymers, organic terpenoid polymers, natural organic polymers (e.g., resins such as shellac), polyisocyanates, and combinations thereof. Copolymers, such as acrylate copolymers (e.g., copolymers with ethylene butyl-, ethyl-, and methyl-acrylates) and parylene copolymers (e.g., copolymers of p-xylylene with acrylates (e.g., 2-carboxylethyl acrylate), methacrylates (e.g., 3-(trimethoxysilyl)propyl methacrylate), α-pinene, R-(−)carvone, linalool, cyclohexene, dipentene, α-terpinene, R-(+)-limonene, and combinations thereof), also are within the scope of this disclosure. Non-limiting examples of polar polymers include zein, hemp protein, wheat gluten, poly(acrylic acidco-maleic acid), poly(acrylic acid), whey protein isolate, soy protein isolate, pea protein extract, shellac, and combinations thereof.

In certain embodiments, polymeric molecules are derivatized to attach additional functional groups, such as functional groups that facilitate subsequent binding of the polymeric molecules to a bare electrode surface (i.e., a bare metal or carbon surface) or to a composite electrode surface. Exemplary derivatization agents include, but are not limited to, anhydrides, carbodiimides, imidoesters, and reagents including combinations of N-hydroxysuccinimide and maleimide, aryl azide, or diazirine groups. In some examples, the polymer is derivatized with an anhydride, such as maleic anhydride, itaconic anhydride, cis-4-cyclohexene-1,2-dicarboxylic anhydride, or cis-5-norbornene-end-2,3-dicarboxylic anhydride. A derivatized polymeric molecule can be bound to the electrode surface by crosslinking or by other reaction with the surface. A polymeric molecule also can be crosslinked with one or more other polymeric molecules in the dielectric. When a polymeric molecule is derivatized with maleic anhydride, for example, the derivatized polymeric molecule can be crosslinked through the double bonds. Crosslinking can be performed by any suitable means, such as a chemical agent (e.g., a radical initiator), ultraviolet light activation, or thermal activation. Two non-limiting examples of nonconductive, high-permittivity dielectrics are zein in a shellac matrix and a protein derivatized with maleic anhydride.

The inventors surprisingly discovered that polymeric molecules with the above-described characteristics, when sterically constrained, can be used for energy storage even though the polymeric molecules cannot freely move between opposing electrodes. Polymeric molecules can be sterically constrained by binding the polymeric molecules to a bare electrode surface or to a nonconductive or insulative coating of a composite electrode by any means, including a covalent bond (single or multiple), van der Waals forces, or hydrogen bonding, prior to charging and/or discharging an energy storage device including the electrode and a dielectric material comprising the polymeric molecules.

Without wishing to be bound by any particular theory of operation, it is believed that within a large molecule, movements of only portions of the molecule may take place while other portions of the molecule are bound in place sufficiently to prevent the overall movement to a lower energy level and subsequent release of potential energy to be coupled to the electrode and not released as thermal motion. This constraint of movement decreases the degrees of freedom in the dielectric molecule, and consequently decreases the molecule's ability to dissipate absorbed energy from the electrical field as heat. Thus, a bound polymeric molecule couples to the electric field in such a way that the polymeric molecule cannot release energy in the form of heat due its reduced degrees of freedom. The movement of certain portions of a macromolecule can be related and is similar to electrophoretic movements known to those who use such techniques to analyze biological macromolecules.

Additionally, without wishing to be bound by any particular theory of operation, it is believed that when a portion of the polymer is bound to an electrode (or to a coating on the electrode), the remainder of the polymer may stretch, twist, or bend within the dielectric film as polar and/or ionizable functional groups reorient in response to an electric field. These changes in conformation and position store energy within the energy storage device. When the energy storage device discharges, the stored energy is released as electrical energy as the bound polymer molecules return to a less ordered conformation. A dielectric material comprising polymeric molecules, wherein at least some of the polymeric molecules have decreased degrees of freedom, is referred to as a "sterically constrained" dielectric material.

In some embodiments, the dielectric material comprises an organic polymer and a high permittivity compound, such as an inorganic salt or a salt comprising a metal cation and an organic anion. The dielectric material may further include a solvent. Suitable polymers include, but are not limited to, zein, shellac, and silicone oil. In some embodiments, the salt comprises a group IIA or group IIIA metal. In one embodiment, the inorganic salt is a boron compound, such as sodium borohydride or borax. When the inorganic salt is sodium borohydride or borax, the dielectric material may further comprise ammonium hydroxide. In an independent embodiment, the inorganic salt is barium titanate. In another independent embodiment, the inorganic salt is a Gd, Sr, or Sn salt. In still another independent embodiment, the inorganic salt is a transition metal salt, such as an iron salt. The salt may be, for example, a carbonate salt. When the inorganic salt is barium titanate or a transition metal salt, the dielectric material may further comprise sodium borohydride or borax. In certain embodiments, the dielectric material further comprises a permittivity increasing material or breakdown voltage adjuvant. The permittivity increasing material or breakdown voltage adjuvant may include Y, Ni, Sm, Sc, Tb, Yb, La, Te, Ti, Zr, Ge, Mg, Pb, Hf, Cu, Ta, Nb, Bi, or a combination thereof, which is substantially evenly distributed throughout the material.

In certain examples, the dielectric material comprises a zein protein derivatized with maleic anhydride and neutralized with a carbonate salt.

In some embodiments, the dielectric material has a relative permittivity greater than silicon dioxide, i.e., greater than 3.9. In certain embodiments, the dielectric material has liquid characteristics, and has a viscosity similar to honey or greater. The dielectric material may have a viscosity greater than or equal to 0.5 cP, such as a viscosity from 0.5 cP to 250,000 cP, 10 cP to 250,000 cP, 100 cP to 250,000 cP, 500 cP to 250,000 cP, 1,000 cP to 250,000 cP, 5,000 cP to 250,000 cP, or 10,000 cP to 250,000 cP.

In some embodiments, the dielectric material is an electroentropic dielectric material having a relative permittivity greater than 3.9 as disclosed herein. The electroentropic dielectric material may comprise a plurality of polymeric molecules as previously described. In some examples, the polymeric molecules comprise proteins, polyp-xylylene) poly(maleic acid), acrylic acid polymers, methacrylic acid polymers, polyethylene glycol, urethane polymers, epoxy polymers, silicone polymers, terpenoid polymers, naturally occurring resin polymers, polyisocyanates, or combinations thereof. In certain CESDs, the polymeric molecules are poly(p-xylylene), zein, poly(maleic acid), shellac, silicone oil, or a combination thereof.

Each dielectric material layer may have a thickness $T_D$ (as shown in FIG. 22A) within a range of from 0.0001 μm to 10000 μm, such as a thickness within a range of 0.0005-10000 μm, 0.0005-1000 μm, 0.0005-100 μm, 0.001-100 μm, 0.01-100 μm, 0.05-100 μm, 0.1-50 μm, 0.5-10 μm, or 1-5 μm. In some embodiments, the thickness of each dielectric material layer is the same. By "the same" is meant that the thickness of each layer varies by less than ±5% relative to an average thickness of the layers, such by less than ±2% relative to an average thickness of the layers.

The conductive material comprises a carbonaceous material, a metal, a conductive polymer, or a combination thereof. Carbonaceous materials include any conductive material comprising conductive carbon including, but not limited to, carbon powder, graphene, graphitic carbon, graphitized carbon, partially graphitized carbon (e.g., a graphitic-type structure content within a range of from 20 to 99 wt %), activated carbon, carbon black, and carbonized polymers (polymers converted at least partially into carbon or a carbon-containing residue, typically by pyrolysis or chemical treatment), or any combination thereof. Suitable metals include, but are not limited to, aluminum, copper, gold, platinum, silver, titanium, and combinations thereof. In certain examples, the conductive material comprises or consists of carbon powder, graphene, graphite, aluminum, polyaniline, or poly(N-methyl pyrrole).

Additional disclosure regarding suitable dielectric materials is found, e.g., in U.S. Pat. Nos. 8,432,663, 8,940,850, 9,011,627, US 2015/0000090A1, US 2015/0000833 A1, and US 2015/0131198 A1, each of which is incorporated in its entirety herein by reference.

As described above, a CESD may include one or more insulative layers between electrical connects. Electrodes and/or an underlying substrate also may have an insulative layer or coating. The CESD may further comprise an upper sealing layer. The insulative layer and/or sealing layer may have an Ohmic conductivity less than $1\times10^{-1}$ S/m. In some embodiments, the insulative layer has an Ohmic conductivity less than $1\times10^{-2}$ S/m, less than $1\times10^{-5}$ S/m, or less than $1\times10^{-10}$ S/m. In certain embodiments, the Ohmic conductivity is from $1\times10^{-25}$ S/m to $1\times10^{-1}$ S/m, from $1\times10^{-10}$ S/m to $1\times10^{-1}$ S/m or from $1\times10^{-5}$ S/m to $1\times10^{-1}$ S/m. The insulative layer may range from a few nanometers to greater than 50 microns in thickness. In some embodiments, the insulative layer has an average thickness from 5 nm to 10 µm, such as from 0.1-10 µm, 0.3-10 µm, 0.3-5 µm, or 0.3-2 µm. The sealing layer may have an average thickness from 50 nm to 50 mm, such as from 50 nm to 25 mm, or from 100 nm to 10 mm.

An exemplary insulative or sealing layer is polymerized p-xylylene, such as a Puralene™ polymer coating as disclosed, for example, in US 2014/0139974, which is incorporated in its entirety herein by reference. The insulative layer may be modified with appropriate co-monomers to provide increased permittivity, and/or attachment sites for polymeric molecules of the dielectric material. In some embodiments, the co-monomers include one or more unsaturated bonds. An insulative layer comprising polymerized p-xylylene may be modified, for example, by inclusion of co-monomers including, but not limited to, olefins, vinyl derivatives, alkynyl derivatives, acryl compounds, allyl compounds, carbonyls, cyclic ethers, cyclic acetals, cyclic amides, oxazolines, and combinations thereof. In some embodiments, the co-monomers are acrylates (e.g., 2-carboxylethyl acrylate), methacrylates (e.g., 3-(trimethoxysilyl)propyl methacrylate), α-pinene, R-(−)carvone, linalool, cyclohexene, dipentene, α-terpinene, R-(+)-limonene, and combinations thereof. The copolymers may include alternating monomers or may be in the form of block copolymers.

IV. Methods of Making a CESD

Figure 35:
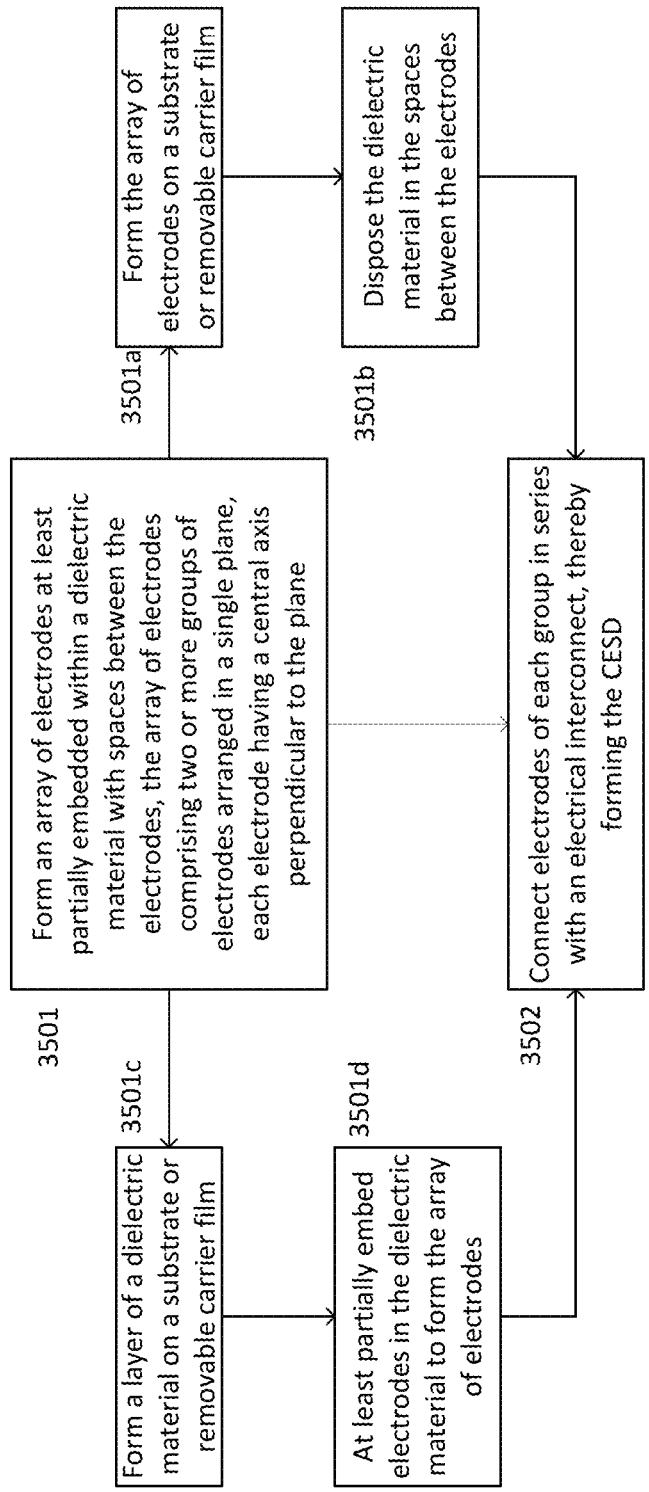
FIG. 35 is a flow diagram of a generalized method of making a CESD as disclosed herein.

As shown in the flow diagram of FIG. 35, some embodiments of a method for making a CESD as disclosed in FIGS. 2-18 comprise forming an array of electrodes at least partially embedded within or in contact with a dielectric material with spaces between the electrodes, the array of electrodes comprising n groups of electrodes arranged in a single plane, where n is an integer greater than or equal to 2, each electrode having a central axis perpendicular to the plane (step 3501); and connecting electrodes of each group in series with an electrical interconnect, thereby forming the CESD (step 3502).

In some embodiments, forming the array of electrodes at least partially embedded in or in contact with the dielectric material further comprises forming the array of electrodes (step 3501*a*), and then disposing the dielectric material in the spaces between the electrodes (step 3501*b*). The electrodes may be formed by any suitable means including, but not limited to, forming the electrodes on a substrate by nanolithography, microlithography, shadow-mask polymerization, laser marking, imprint, inkjet, grauver, flexographic, or a screen printing process. In one embodiment, the substrate is a nonconductive surface; in another embodiment, the substrate is a removable carrier. In certain embodiments, the array of electrodes is formed using nanolithography, such as roll-to-roll (R2R) nanoimprint lithography (NIL) where an electrode material layered on a flexible substrate is rolled with pressure over a rigid stamp, which patterns the electrode material to form the array of electrodes (see, e.g., Kooy et al., *Nanoscale Research Letters* 2014, 9:320). Advantageously, R2R NIL provides a solution to device manufacture that does not need vacuum processing. In an alternative method, vacuum processes, such as those well-known for the manufacture of microelectronics can be used to form the array of electrodes. Alternative methods such as simple photolithography utilizing shadow masks are also possible. The advantages of a non-contact process such as photolithography at longer wavelengths than vacuum ultraviolet are clear advantages. These advantages when coupled with the lack of a need for vacuum process, make a compelling argument for the economic manufacturing methods of this invention. In one embodiment, the electrodes are metal, and are anodized by methods well known to those skilled in the art of capacitor production. In an independent embodiment, the electrodes are coated with an insulative layer or coating, such as a Puralene® polymer (poly-p-xylylene) coating. Methods for forming a Puralene® polymer (poly-p-xylylene) coating and similar coatings are further described in U.S. Pat. No. 8,633,289 and US 2015/0017342 A1, each which is incorporated in its entirety herein by reference. A polyp-xylylene) insulative coating on the electrodes may be formed in the presence of an electric field or a magnetic field. In one embodiment, the insulative coating is formed in the presence of a direct current electric field greater than 100 V/cm. The substrate/carrier and electrodes may, for example, be immersed in a direct current electric field as the insulative coating is applied to the electrodes. In another embodiment, the insulative coating is formed in a magnetic field greater than 1 Gauss, wherein the magnetic field may be provided by placing the substrate/carrier and electrodes between magnetic north and south poles of a magnetic source while applying the insulative coating. The electrode material may also be provided by electrode plating methods or spatial atomic layer deposition (ALD).

The dielectric material may be disposed in the spaces between the electrodes by any suitable means including, but not limited to, flowing a solvent-based dielectric, such as a viscous dielectric, onto the substrate, spraying the dielectric onto the substrate, vapor-phase deposition, or other methods known to those skilled in the art of film formation. In some instances the dielectric is solidified, e.g., by removing solvent, such as by evaporation, or by cross-linking polymers in the dielectric material. A removable carrier may be subsequently removed by any suitable method. For example, a removable carrier comprising a water-soluble polymer can be dissolved and removed with water.

In an alternative method, a layer of dielectric material is formed on a substrate (e.g., by vapor phase deposition, liquid spraying, screening, spin-coating, pressing, or other methods known to those of skilled in the art of film formation) (step 3501c), and electrodes are at least partially embedded in or placed in contact with the dielectric material to form the array of electrodes (step 3501d). In some embodiments, a layer of dielectric material is applied to a substrate or removable carrier film. If liquid, the dielectric film may be partially dried at low temperatures (e.g., 25-60° C.) before proceeding. In another independent embodiment, a layer of dielectric material is pressed onto a conductive surface to act as a masking layer. The dielectric material can serve as both the substrate and an insulative layer, as well as the medium for energy storage. In certain embodiments, the dielectric material is patterned, e.g., by nanoimprint lithography, such as R2R NIL, or laser or chemical etching such as through a photoresist mask. Cavities in the patterned dielectric material are then filled with a suitable electrode material. In an independent embodiment, pre-formed electrodes are inserted into the dielectric layer, e.g., while the dielectric material is in a viscous liquid or semisolid state. In another independent embodiment, electrodes (e.g., carbon electrodes) may be generated in situ in or on the dielectric material using suitable chemical reactions on the surface. Graphene and other carbon inks such as graphene oxide ink and sintering methods may also be alternative methods for forming the conductive electrodes and interconnects.

The shape of the electrode from the manufacturing processes may be cylindrical in nature or the electrodes may be flattened cylinders or other geometrical shapes due to the pressing, forming, or etching process. Curved electrode surfaces may have complex spacing and geometrical considerations especially when the paired electrodes are essentially oriented parallel or perpendicular to each other. Angled orientations may have advantages when high density capacitance or unit cell addressing on single layers is desired.

In some embodiments, the dielectric material is an entropic material, such as an electroentropic material comprising polymeric molecules, and the film material is prepared from a liquid or a slurry comprising a solvent and a plurality of polymeric molecules. Suitable solvents include, but are not limited to, alkanols, alkylene glycols, lactones, carbonates, water, and combinations thereof. Exemplary solvents include ethanol, ethylene glycol, water, lactones, carbonates, and combinations thereof. In some embodiments, the polymeric molecules have one or more polar functional groups, ionizable functional groups, or a combination thereof. The polymeric molecules may also include one or more double bonds. Suitable polymeric molecules are described above. In certain embodiments, undissolved polymeric molecules are removed from the mixture, e.g., by filtering or centrifuging the mixture.

The liquid or slurry may further comprise a crosslinking agent. Suitable crosslinking agents include, but are not limited to, anhydrides, carbodiimides, imidoesters, borax salts, sodium borohydride, and reagents including combinations of N-hydroxysuccinimide and maleimide, aryl azide, or diazirine groups. Common crosslinking agents include triallyltriazinetrione and other triallyl or trivinyl reagents known to those versed in polymer chemistry. Exemplary anhydrides include maleic anhydride, itaconic anhydride, cis-4-cyclohexene-1,2-dicarboxylic anhydride, cis-5-norbornene-endo-2,3-dicarboxylic anhydride, and combinations thereof.

In some embodiments, the liquid or slurry further includes an initiator, such as a radical initiator, to initialize crosslinking between the polymeric molecules. Exemplary initiators include thermal and light-activated chemical initiators, including, but not limited to, azobisisobutyronitrile, 1,1'-azobis(cyclohexanecarbonitrile), dicumyl peroxide, 2-hydroxy-2-methylpropiophenone, camphorquinone, phenanthrenequinone, and combinations thereof. In one example, itaconic anhydride and dicumyl peroxide were used to crosslink zein molecules.

One or more salts, such as salts capable of forming organic salts with the polymeric molecules and/or neutralizing the film material, may be added to the liquid or slurry before crosslinking is complete. In some embodiments, a carbonate salt (e.g., guanidine carbonate, cesium carbonate, strontium carbonate, or a combination thereof) may be used because the reaction releases carbon dioxide and produces no undesired counterion contamination of the dielectric film. In one embodiment, barium titanate is added to the liquid or slurry. In an independent embodiment, a voltage adjuvant, such as a nonconductive polymer, is added.

In an independent embodiment, the polymeric molecules of the dielectric film are formed in situ. The dielectric material liquid or slurry comprises a crosslinking agent and a plurality of polymeric molecule precursors comprising one or more polar functional groups, ionizable functional groups, or a combination thereof. In some examples, the precursors are amino acid molecules, oligopeptides, polypeptides, or a combination thereof. In certain embodiments, the polymeric molecule precursors further comprise p-xylylene monomers. In some embodiments, the liquid or slurry is applied to the substrate or removable carrier as previously described. After application, the crosslinking agent is activated, thereby crosslinking the polymeric molecule precursors to provide a dielectric film comprising a plurality of polymeric molecules. The crosslinking process also may bind some of the polymeric molecules to surfaces of electrodes disposed on the substrate or removable carrier layer and/or to the substrate or removable carrier layer. In an independent embodiment, crosslinking may be initiated prior to applying the liquid or slurry to the substrate or removable carrier.

Groups of electrodes are connected in series to electrical interconnects by any suitable means. Electrical connections to the electrodes may be direct or indirect. Direct connections can be made, for example, using standard wire-bonding machinery or conductive adhesives. In some embodiments, e.g., as shown in FIGS. 9-12, electrodes of one or more groups are connected to a branched electrical interconnect by branches extending from a main line.

In some embodiments, after the dielectric film, electrodes, and electrical interconnects have been assembled, an electric field is applied to the CESD. For example, a direct current electric field may be applied by activating every other row of electrodes and grounding (connecting to Vss) the alternate rows (e.g., in the embodiments of FIG. 3-6 or 15), by activating all row electrical interconnects and grounding all column electrical interconnects (e.g., in the embodiments of FIGS. 7-14), or by activating one electrode while grounding the other in the case of a co-spiral arrangement (e.g., in the embodiment of FIG. 18), such that some electrodes function as positive electrodes and others function as negative electrodes. In some embodiments, an applied E-field in the range of from 0.0001 V/$\mu$m to 1000 V/$\mu$m or more, based on an average thickness of the dielectric material, is utilized. In certain embodiments, the applied E-field is within a range of 0.0001 V/µm to 100 V/µm, 100 V/µm to 1000 V/µm, or 1 V/µm to 5 V/µm depending on the intended use of the CESD. The E-field is applied for an effective period of time to bind at least some of the polymeric molecules to the positively charged electrodes, thereby producing a sterically constrained dielectric film. The effective period of time is based at least in part on the electric field strength and may range from one second to several minutes, such as from 30 seconds to 60 minutes, from 5 minutes to 30 minutes, or from 5 minutes to 15 minutes. In some embodiments, the electric field is 0.0005-600 V/µm and the effective period of time is from 0.0001 second to 30 minutes.

In an independent embodiment, at least some of the electrodes are coated with an insulative layer, and a radical initiator may be applied to the electrodes before applying the dielectric film. For example, an insulative layer may be applied to the positive electrode or electrodes. The radical initiator may then be activated to bind at least some of the polymeric molecules to the insulative layer and produce a sterically constrained dielectric film. Exemplary radical initiators include azobisisobutyronitrile, 1,1'-azobis(cyclohexane-carbonitrile), dicumyl peroxide, 2-hydroxy-2-methylpropiophenone, camphorquinone, phenanthrenequinone, combinations thereof, and other radical initiators known to one skilled in the art of polymerization. The radical initiator is activated by oxidation-reduction, photoinitiation, thermal initiation, or other methods known to those skilled in the art of polymerization, thereby binding at least of the polymeric molecules to the insulative layer on the electrodes.

In another independent embodiment, at least some of the electrodes (e.g., the positive electrode or electrodes) are coated with an insulative layer, and polymeric molecules of the dielectric material are derivatized with a derivatization agent to provide functional groups capable of cross-linking to the insulative layer of the electrodes. The functional groups are subsequently crosslinked to the insulative layer by using a radical initiator, ultraviolet light, thermal activation, or a combination thereof, thereby producing a sterically constrained dielectric film. Exemplary derivatization agents include anhydrides, carbodiimides, imidoesters, and reagents including combinations of N-hydroxysuccinimide and maleimide, aryl azide, or diazirine groups. In some embodiments, the derivatization agent is an anhydride, such as maleic anhydride, itaconic anhydride, cis-4-cyclohexene-1,2-dicarboxylic anhydride, or cis-5-norbornene-end-2,3-dicarboxylic anhydride.

Figure 36:
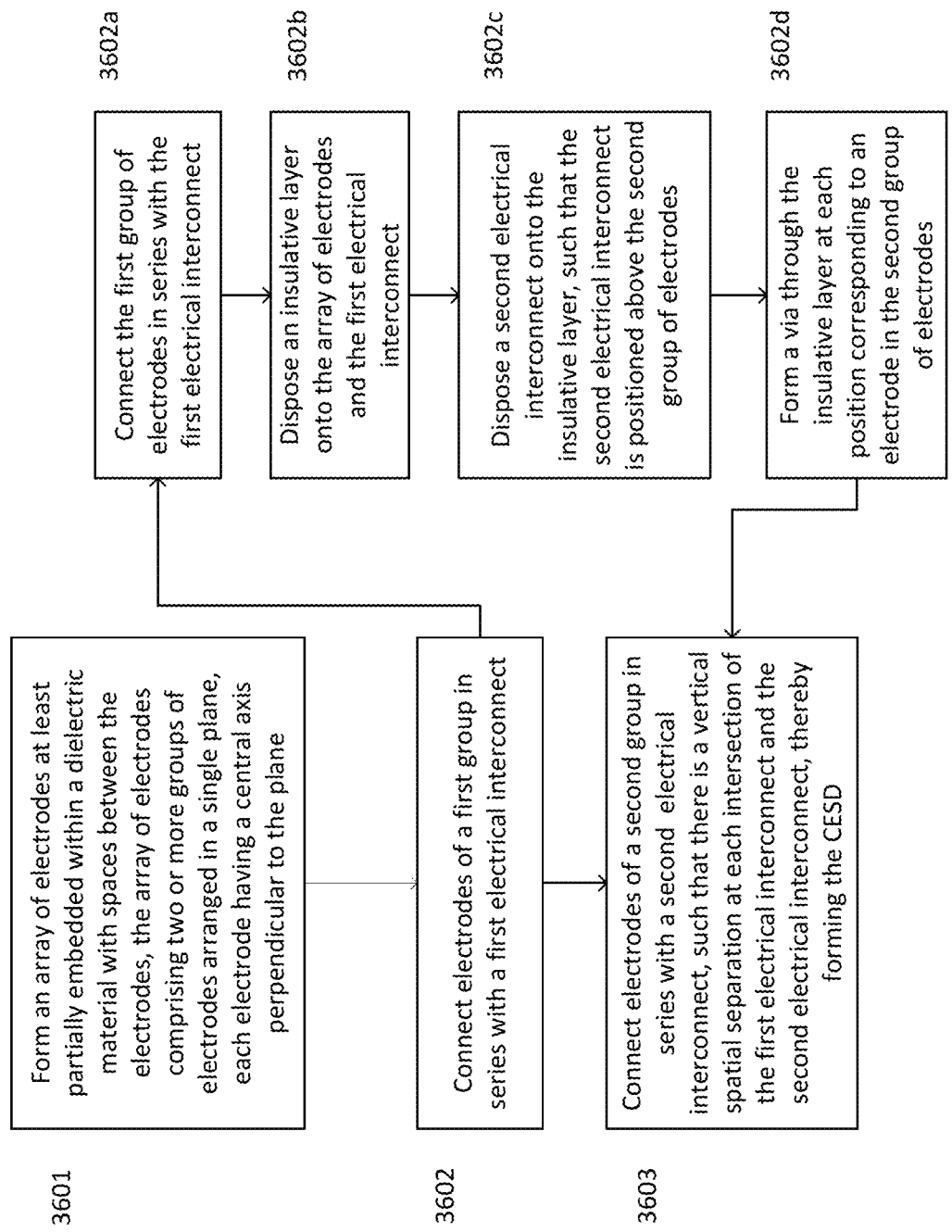
FIG. 36 is a flow diagram of a generalized method of making a CESD including intersecting electrical interconnects.

With reference to FIG. 36, in embodiments where electrical interconnects intersect one another, e.g., as shown in FIGS. 7-14, the method includes forming an array of electrodes at least partially embedded within or in contact with a dielectric material with spaces between the electrodes, the array of electrodes comprising n groups of electrodes arranged in a single plane, where n is an integer greater than or equal to 2, each electrode having a central axis perpendicular to the plane (step 3601), connecting a first group of electrodes in series with a first electrical interconnect (step 3602), and connecting a second group of electrodes in series with a second electrical interconnect, such that there is a vertical spatial separation at each intersection where the second electrical interconnect crosses the second interconnect (step 3603). In some embodiments, the method includes connecting the first group of electrodes in series with the first electrical interconnect (step 3602a), disposing an insulative layer onto the array of electrodes and the first electrical interconnect such that the first electrical interconnect is below the insulative layer (step 3602b), disposing a second electrical interconnect onto the insulative layer, such that the second electrical interconnect is positioned above the insulative layer and above the second group of electrodes (step 3602c), and forming a via through the insulative layer at each position corresponding to an electrode in the second group of electrodes, thereby electrically connecting the second row electrical interconnect to electrodes in the second group in series (step 3602d). The insulative layer may be applied by any suitable means, such as by flowing or spraying the insulative material onto the partially assembled CESD after first connecting the first electrical interconnect to the first group of electrodes. In some embodiments, the insulative layer is poly(p-xylylene). Vias are formed through the insulative layer above electrodes of the second group, and the second electrical interconnect is applied such that the vias connect the second electrical interconnect to the electrodes of the second group. In the exemplary embodiments of FIGS. 7, 8, and 10-14, the row electrical interconnects 115 are above the insulative layer 190, and the column electrical interconnects 125 are below the insulative layer 190.

In a unit cell arrangement, there may be multiple planes of electrical interconnects and multiple insulative layers. For example, the unit cells illustrated in FIGS. 16 and 17 include electrical interconnects disposed in four planes. In some embodiments, the illustrated unit cell and/or unit cell array therefore includes three insulative layers to separate the four planes of electrical interconnects. Vias would extend through one, two, or all three insulative layers as necessary to provide connections to the appropriate underlying electrodes.

In any or all of the above embodiments, an upper sealing layer may be deposited atop the CESD. The upper sealing layer may be an insulative layer such as, for example, polyp-xylylene). The upper sealing layer is deposited by any suitable means, such as by flowing or spraying the sealing material onto the assembled CESD.

Figure 37:
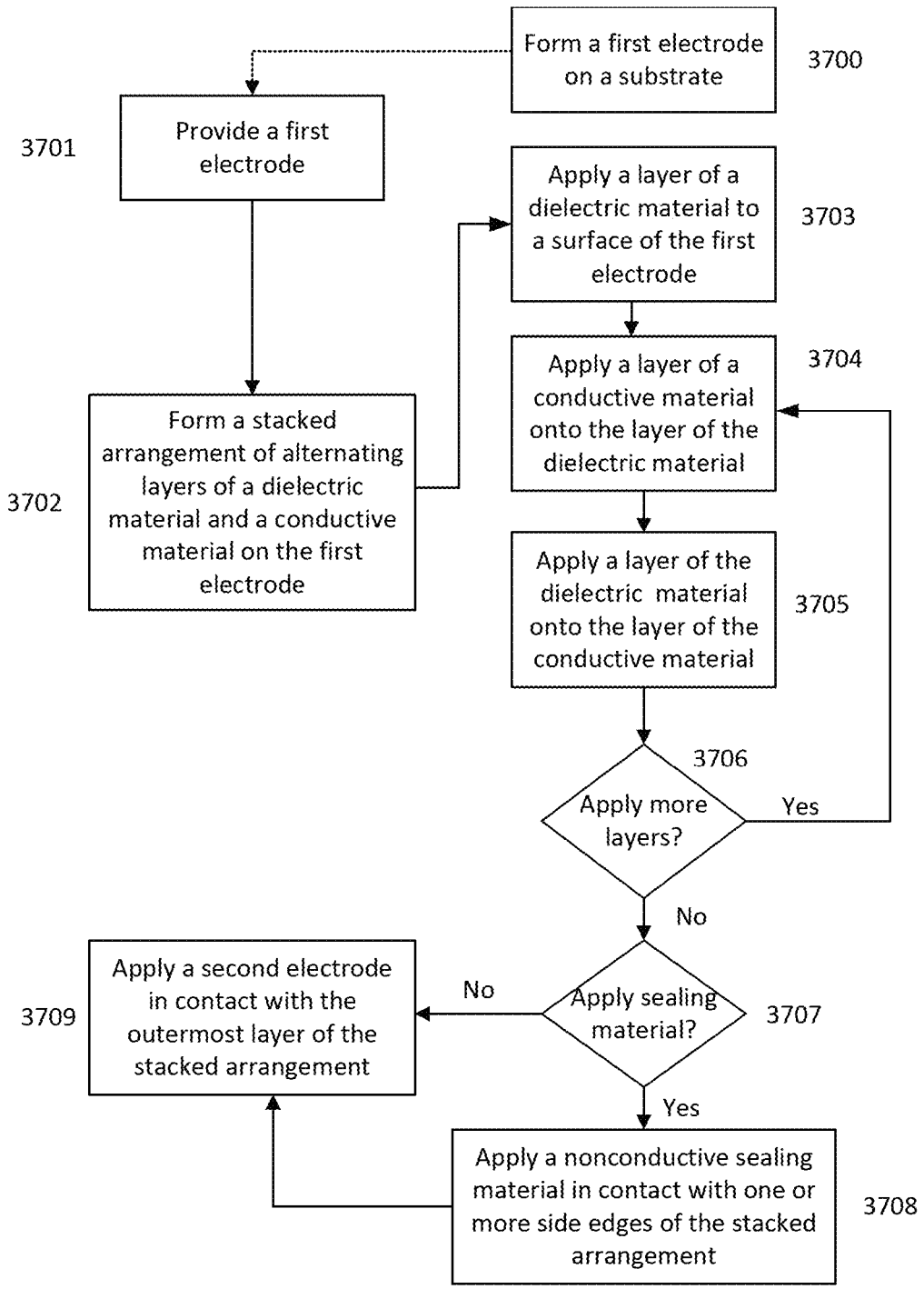
FIG. 37 is a flow diagram of a generalized method of making a stacked CESD as shown in FIGS. 22A and 22B.

FIG. 37 is a flow diagram illustrating embodiments of method for making a stacked CESD as illustrated in FIGS. 22A, 22B, 23, 31, and 32. The method includes providing a first electrode (step 3701) and forming a stacked arrangement of alternating layers of a dielectric material and a conductive material on the first electrode (step 3702). Optionally (e.g., with respect to tubular CESDs as shown in FIGS. 22A, 22B, 23), the first electrode may be provided by forming the first electrode on a substrate (step 3700). The stacked arrangement is formed by applying a layer of a dielectric material to a surface of the first electrode (step 3703), applying a layer of a conductive material onto the layer of the dielectric material (step 3704), and applying another layer of the dielectric material onto the layer of the conductive material (step 3705). If more layers are desired (step 3706), then steps 3704 and 3705 are repeated. When the desired number of layers has been formed, a decision is made whether to apply an outer nonconductive sealing material (step 3707). If the optional nonconductive sealing material is desired, it is applied in contact with one or more side edges of the stacked arrangement (e.g., as shown in FIG. 23) (step 3708). A second electrode is applied in contact with the outermost layer, which is a dielectric material layer, of the stacked arrangement (step 3709). It is to be understood that optional step 3708 can be performed before step 3709 as shown or, alternatively, after step 3709. When making a tubular stacked CESD as shown in FIG. 32, the optional outer nonconductive sealing material 3160 may be applied to the outwardly facing surface 3120b of the second electrode 3120, or to all exterior surfaces of the CESD 3100.

Applying layers of the dielectric material and the conductive material may be performed by any suitable method. In some embodiments, layers of the dielectric material and/or the conductive material are applied by spraying (e.g., with an air brush), vapor-phase deposition, or other methods known to those skilled in the art of film formation. Alternatively, dielectric material layers may be applied by flowing a solvent-based dielectric, such as a viscous dielectric, onto the first electrode or an underlying conductive material layer. In some instances the dielectric material is thickened or solidified, e.g., by removing solvent, such as by evaporation, or by cross-linking polymers in the dielectric material. An optional nonconductive sealing material is applied by similar methods.

A removable carrier or substrate on which the first electrode has been formed may be subsequently removed by any suitable method. For example, a removable carrier comprising a water-soluble polymer can be dissolved and removed with water.

Figure 38:
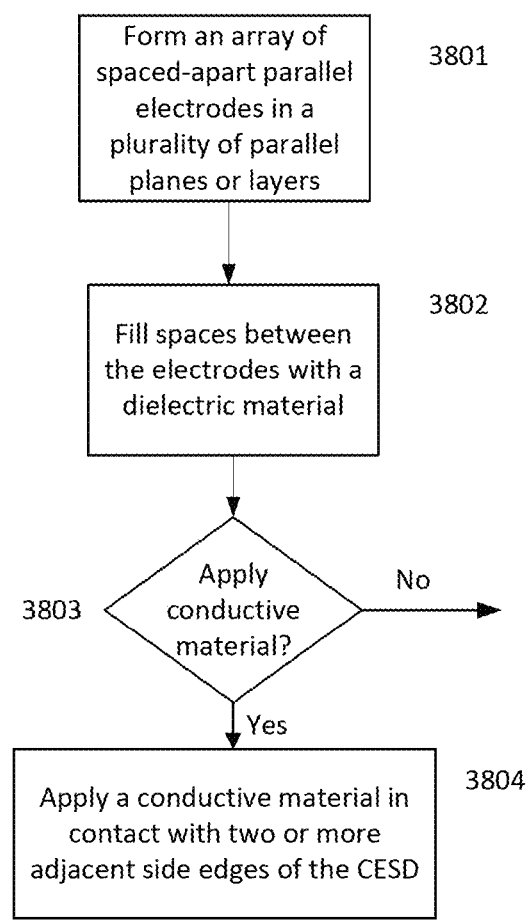
FIG. 38 is a flow diagram of one generalized method for making a stacked CESD as shown in FIGS. 24-26.

FIG. 38 is a flow diagram illustrating one embodiment of a generalized method for making a stacked CESD as illustrated in FIGS. 24-26. The method includes forming an array of n groups of spaced-apart parallel electrodes in n parallel planes or layers (step 3801). Optionally, the array of electrodes is formed on a substrate. The array of electrodes may be formed by any suitable method, e.g., as described above with respect to the method of FIG. 35. A group of parallel electrodes in a layer may be oriented at right angles to an adjacent group of parallel electrodes, or the group of parallel electrodes may be rotated 0-90° relative to the adjacent group of parallel electrodes. Advantageously, the electrodes are arranged such that electrode ends will protrude from two or more sides of a completed quadrilateral CESD as discussed with respect to FIGS. 24-26. When the electrode array has been formed, spaces between the electrodes are filled with a dielectric material (step 3802). The dielectric material may be disposed in the spaces by any suitable method, e.g., as described above with respect to the method of FIG. 35. A decision is made whether to apply a conductive material (step 3803). If the optional conductive material is desired, it is applied in contact with two or more side edges of the stacked arrangement (step 3804). The optional conductive material may be applied by any suitable means, such as by flowing or spraying the conductive material onto the side edges.

Figure 39:
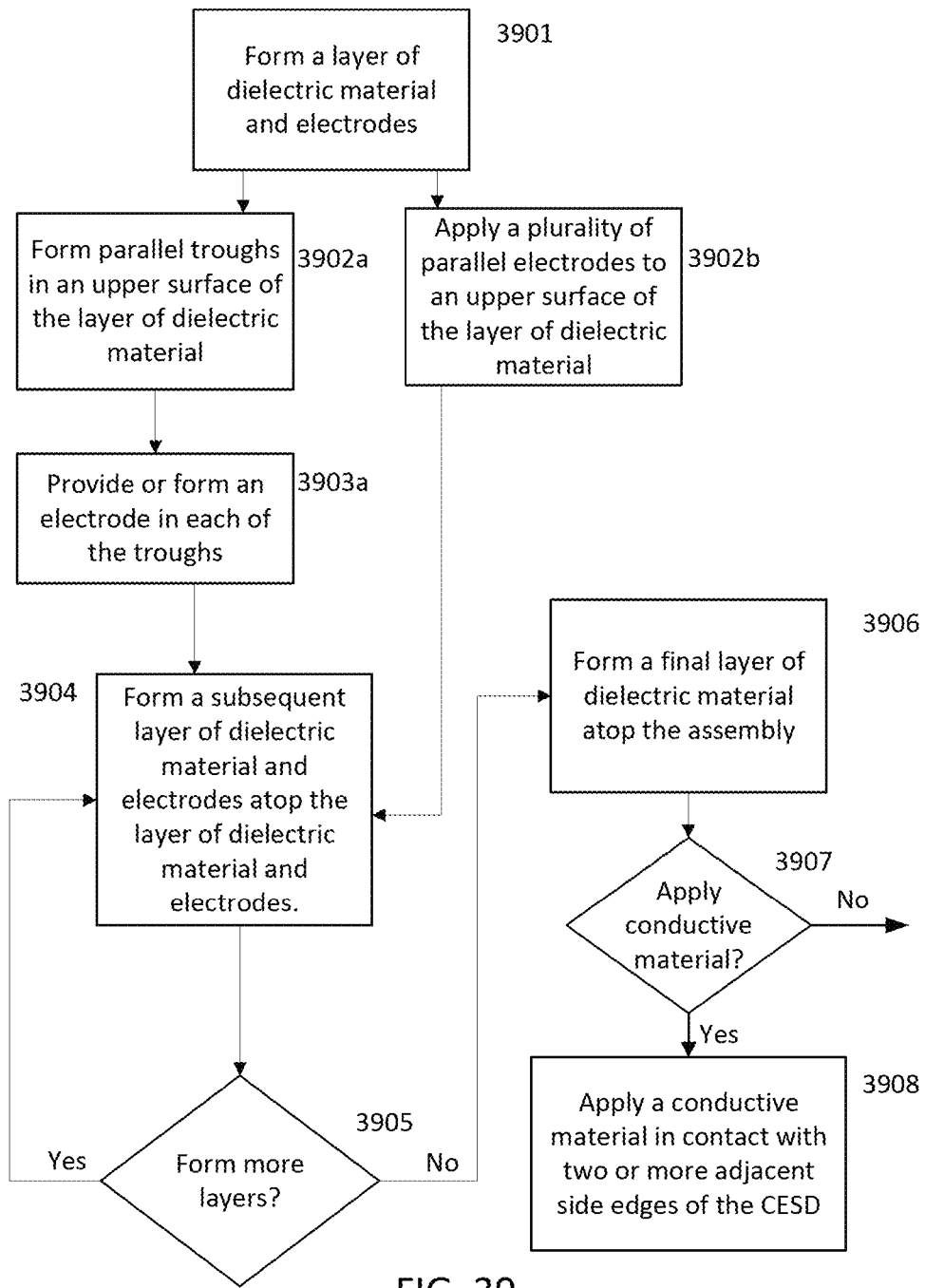
FIG. 39 is a flow diagram of another generalized method for making a stacked CESD as shown in FIGS. 24-26.

FIG. 39 is a flow diagram illustrating an independent embodiment of a generalized method for making a stacked CESD as illustrated in FIGS. 24-26. The method includes forming a layer of dielectric material and electrodes (step 3901). Optionally, the layer of dielectric material is formed on a substrate. The layer of dielectric material may be formed by any suitable method, e.g., as described above with respect to the method of FIG. 35. In one embodiment, a plurality of parallel troughs is formed in an upper surface of the t layer of dielectric material (step 3902a). The troughs may be formed by any suitable method, such as etching, laser cutting, etc. Advantageously, the troughs are formed such that electrode ends can protrude from or be coincident with one or more side edges of the dielectric material layer. An electrode is provided or formed in each of the troughs (step 3903a). The electrodes may be provided, for example, as a wire. Alternatively, the electrodes may be formed in the troughs, e.g., by filling the troughs with conductive carbon. In another embodiment, a plurality of parallel electrodes is applied to an upper surface of the layer of dielectric material (step 3902b). The electrodes can be applied by any suitable method. For example, a liquid form of the electrodes can be "printed" onto the upper surface of the dielectric material as will be understood by a person of ordinary skill in the art. Alternatively, a layer of electrode material can be applied to the upper layer of the dielectric material, and then excess electrode material removed to leave a plurality of parallel electrodes. A subsequent layer of dielectric material and electrodes is formed atop the layer of dielectric material and electrodes (step 3904). The electrodes of the subsequent layer may be oriented at right angles to the electrodes the first layer, or the electrodes of the subsequent layer may be rotated 0-45° relative to the electrodes of the first layer. If additional layers are desired (step 3905), step 3904 is repeated. When the desired number of layers has been formed, a final layer of dielectric material is formed atop the dielectric material and electrodes (step 3906). A decision is made whether to apply an outer nonconductive sealing material (step 3907). If the optional nonconductive sealing material is desired, it is applied in contact with two or more side edges of the stacked arrangement (step 3908).

V. Methods of Using a CESD

The disclosed CESDs can be used for energy storage, memory storage, or a combination thereof. Embodiments of a method for using a CESD as disclosed herein include applying a voltage across a capacitive element disposed between an electrode of a first group of electrodes and an adjacent electrode of a second group of electrodes, wherein the capacitive element is a region of the dielectric material located between the electrode of the first group and the adjacent electrode of the second group, thereby charging the capacitive element to a voltage V1. The applied electric field may be from 0.001 V/µm to 1000 V/µm or more, based on the average thickness of the dielectric material. In one embodiment, the applied E-field is from 100 V/µm to 1000 V/µm. In an independent embodiment, the applied E-field is from 0.001 V/µm to 100 V/µm. In another independent embodiment, the applied E-field is from 1 V/µm to 5 V/µm.

FIG. 40 is a flow diagram showing a generalized method of charging a capacitive element of a CESD. The method includes providing at process block 4001 a CESD comprising at least one capacitive element defined by a region of a dielectric material between a first electrode of a first group of electrodes and a second electrode of a second group of electrodes, the first group of electrodes connected in series to a first electrical interconnect and the second group of electrodes connected in series to a second electrical interconnect. A voltage is applied across the capacitive element by applying a voltage to the first electrical interconnect, and connecting the second electrical interconnect to Vss for a period of time (step 4002).

When the CESD comprises an array of aligned or staggered rows of electrodes, each row constituting a group of electrodes (e.g., as shown in FIGS. 3-6 and 15), applying the voltage charges the plurality of capacitive elements between the adjacent rows of activated electrodes. Such embodiments may be particularly useful as bulk energy storage devices or devices in which a higher voltage output is desirable. Indeed, in some examples, all rows may be activated to simultaneously charge or discharge all capacitive elements within the CESD.

In embodiments where the CESD comprises an array of rows and columns of electrodes (e.g., as shown in FIGS. 7-14), wherein each row comprises electrodes of a first group alternating with electrodes of one or more other groups, the first electrical interconnect connects each electrode of the first group in a row in series, a second group of electrodes not connected by the first electrical interconnect are connected in a column in series by the second electrical interconnect, and applying the voltage charges one or more capacitive elements between two adjacent activated electrodes. Similarly, when the CESD comprises an array of unit cells (e.g., as shown in FIGS. 16 and 17), applying the voltage charges one or more capacitive elements between two adjacent activated electrodes. In some embodiments, the CESD is a memory device, and each capacitive element has a logic state determined by the voltage applied across the capacitive element.

In any of the foregoing embodiments, energy may be supplied from the CESD to a load by providing a circuit including the CESD and a load connected to the CESD, wherein the capacitive element is charged to the voltage V1; and applying a reversed polarization electric potential across the capacitive element for a discharge period of time, wherein the reversed polarization electric potential is less than the voltage V1 and less than a voltage that would be generated by the capacitive element in a high impedance state, thereby supplying power from the capacitive element to the load. This method may be advantageous when, for example, the CESD has a large geometry, such as an energy collector and memory cell or a large energy storage cell. This method also may be used to indirectly increase the voltage output of the CESD to the load.

FIG. 41 is a flow diagram showing a generalized method of supplying energy from a CESD to a load. The method includes providing at process block 4101 a circuit including a CESD having at least one capacitive element charged to a first voltage level, the capacitive element defined by a region of a dielectric material between a first electrode and a second electrode; in some embodiments, the dielectric film comprises an electroentropic dielectric material as disclosed herein. The first electrode is connected to a first electrical interconnect, and the second electrode is connected to a second electrical interconnect. The capacitive element between the first electrode and the second electrode is charged by applying a voltage across the capacitive element, e.g., by applying a voltage to the first electrical interconnect and connecting the second electrical interconnect to Vss. A person of ordinary skill in the art understands that, alternatively, the voltage could be applied to the second electrical interconnect, and the first electrical interconnect could be connected to Vss. A reversed polarization electric potential is applied across the capacitive element for a discharge period of time, thereby supplying power from the CESD to the load (step 4102). A reversed polarization electric potential may be applied across the capacitive element by connecting one of the first electrical interconnect and the second electrical interconnect to the load, and connecting the other of the first electrical interconnect and the second electrical interconnect to Vss. For example, if the capacitive element was charged by applying a voltage to the first electrical interconnect and grounding the second electrical interconnect, a reversed polarization electrical potential may be applied by connecting the second electrical interconnect to the load and grounding the first electrical interconnect. In some embodiments, the CESD comprises a plurality of charged capacitive elements, and the method further comprises applying reversed polarization electric potentials across the plurality of charged capacitive elements for the discharge period of time.

FIG. 42 is a flow diagram showing a generalized method of charging a capacitive element of a stacked CESD (e.g., as shown in FIGS. 24-26). The method includes providing at process block 4201 a stacked CESD comprising at least one capacitive element defined by a region of a dielectric material between a first electrode of a first group of electrodes and a second electrode of a second group of electrodes, the first group of electrodes connected in parallel to a first conductive material and the second group of electrodes connected in parallel to a second conductive material. A voltage is applied across the capacitive element by applying a voltage to the first conductive material, and connecting the second conductive material to Vss for a period of time (step 4202).

FIG. 43 is a flow diagram showing a generalized method of supplying energy from a stacked CESD to a load. The method includes providing at process block 4301 a circuit including a stacked CESD having at least one capacitive element charged to a first voltage level, the capacitive element defined by a region of a dielectric material between a first electrode and a second electrode; in some embodiments, the dielectric material comprises an electroentropic dielectric material as disclosed herein. The first electrode is connected to a first conductive material, and the second electrode is connected to a second conductive material. The capacitive element between the first electrode and the second electrode is charged by applying a voltage across the capacitive element, e.g., by applying a voltage to the first conductive material and connecting the second conductive material to Vss. A person of ordinary skill in the art understands that, alternatively, the voltage could be applied to the second conductive material, and the first conductive material could be connected to Vss. A reversed polarization electric potential is applied across the capacitive element for a discharge period of time, thereby supplying power from the stacked CESD to the load (step 4302). A reversed polarization electric potential may be applied across the capacitive element by connecting one of the first conductive material and the second conductive material to the load, and connecting the other of the first conductive material and the second conductive material to Vss, e.g., to ground. For example, if the capacitive element was charged by applying a voltage to the first conductive material and grounding the second conductive material, a reversed polarization electrical potential may be applied by connecting the second conductive material to the load and grounding the first conductive material. In some embodiments, the CESD comprises a plurality of charged capacitive elements, and the method further comprises applying reversed polarization electric potentials across the plurality of charged capacitive elements for the discharge period of time.

The dielectric material has an "intrinsic capacitance" when it is first manufactured in an unpolarized state or starting state (e.g., the state of the dielectric material after manufacture), which can be modified by an applied voltage. Thus, in any or all of the above embodiments, the capacitive element may have an intrinsic capacitance, and applying the voltage across the capacitive element modifies the intrinsic capacitance. In certain embodiments, the intrinsic capacitance of the capacitive element remains unchanged when the applied voltage is removed.

Figure 44:
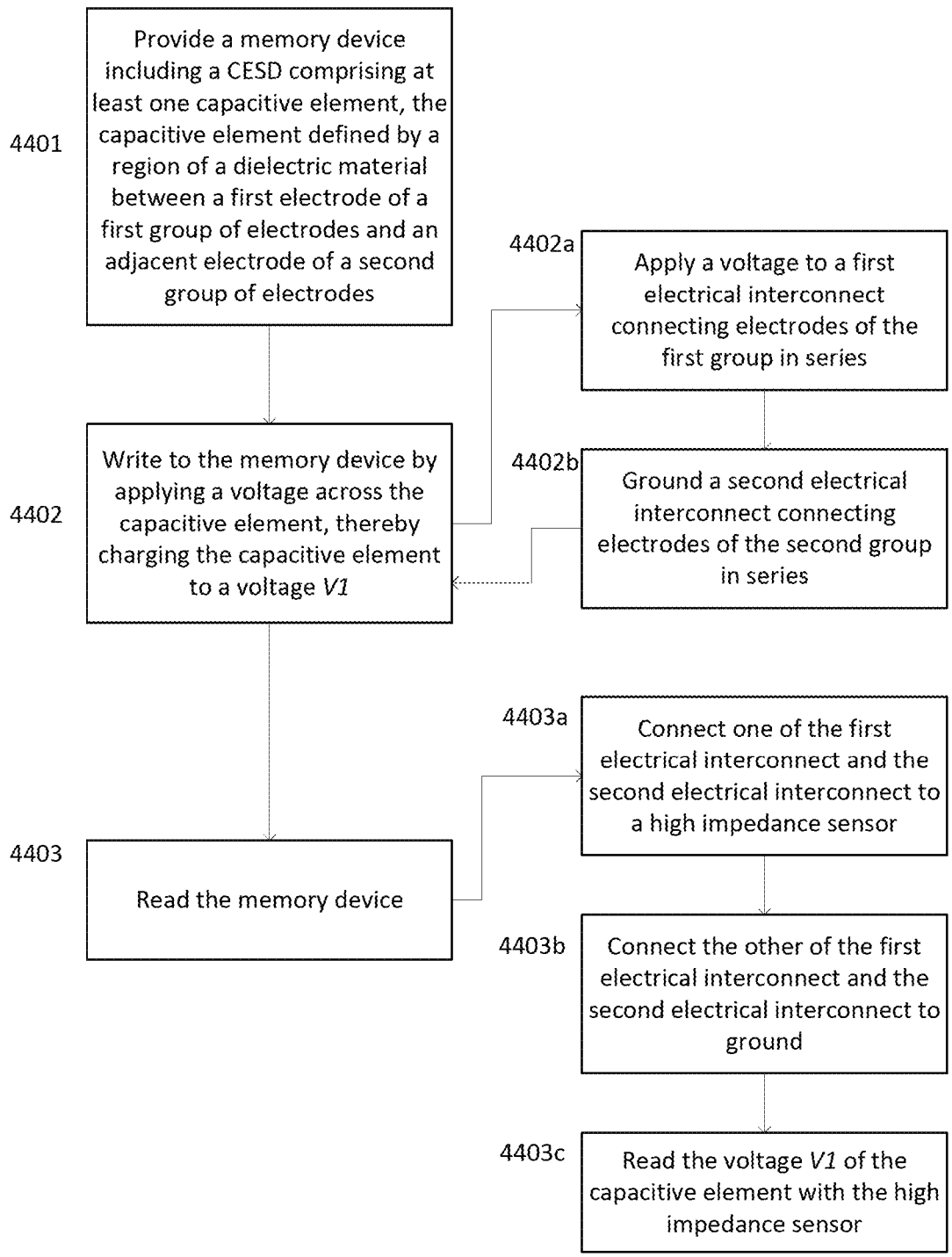
FIG. 44 is a flow diagram illustrating one method of writing to a memory device comprising a CESD as disclosed herein and reading the memory device.

In some embodiments, as shown in the flow diagram of FIG. 44, a method of reading and writing to a memory device includes providing a memory device comprising a CESD (step 4401), and writing to the memory device by applying a voltage across a capacitive element disposed between an electrode of a first group of electrodes and an adjacent electrode of a second group of electrodes, wherein the capacitive element is a region of the dielectric material located between the electrode of the first group and the adjacent electrode of the second group, thereby charging the capacitive element to a voltage V1 (step 4402). A voltage may be applied across the capacitive element by applying a voltage to a first electrical interconnect connecting electrodes of the first group in series (step 4402*a*), and grounding (or connecting to Vss) a second electrical interconnect connecting the electrodes of the second group in series (step 4402*b*). The method may further include reading the memory device (step 4403). The memory device may be read by connecting one of the first electrical interconnect and the second electrical interconnect to a high impedance sensor (step 4403*a*), connecting the other of the first electrical interconnect and the second electrical interconnect to ground/Vss (step 4403*b*), and reading the voltage V1 of the capacitive element with the high impedance sensor (step 4403*c*).

During the writing of a voltage level to a particular capacitive element, the impression of the electric field onto the dielectric in the region that defines the capacitive element induces a change in the permittivity of the dielectric material. This change in electrical permittivity is a function of voltage. As a result, the CESD will function as a memory storage device even without the necessity of accurate voltage levels. If the voltage level of a particular capacitive element is allowed to dissipate (this may be a very long time, e.g., >3 seconds), the permittivity of the dielectric material can still be determined by utilization of a "pulse" of columbic charge. If the capacitive element was charged to a given level of voltage, even if the charge at the electrodes on either side of the capacitive element is drained, the permittivity of the dielectric material in the region defining the capacitive element remains at a level that is consistent with the voltage (E-field) the dielectric would have had if the E-field were still present. For example, if the capacitive element was charged to 1V, the dielectric material will have a characteristic permittivity consistent with the applied voltage. If the electrodes on either side of the capacitive element are subsequently disconnected and the voltage of the capacitive element partially or fully dissipates, the permittivity of the capacitive element will remain substantially unchanged. This hysteresis characteristic of the dielectric is advantageous to determine the voltage level change in the capacitive element upon a small pulse of amperage to a given capacitive element. This columbic pulse will then induce a small change in the residual voltage that is proportional to the permittivity of the dielectric, which is directly proportional to the capacitance of the capacitive element as set forth below.

The general relation between charge Q, capacitance C, and potential V is:

$$Q = C \times V \qquad \text{Equation 1}$$

The capacitance C is typically considered a constant physical property under most conditions. The capacitance of a specific capacitive element in the array can be measured by giving it a very small perturbing charge. In a capacitive element, the application of an electric potential (or field) can affect the relative permittivity of the dielectric region that defines the capacitive element. Given that this effect is largely a function of the voltage (polarization of the dielectric), this property can be used to determine the state of the capacitive element without a very accurate measurement of the voltage. The perturbing charge should not be enough to effect a capacitance change in the capacitive element regardless of its state of polarization. Given this condition, when there is a change in the charge, dQ on the electrodes on either side of the capacitive element, this becomes:

$$Q + dQ = C \times V' \qquad \text{Equation 2}$$

where V' is the new potential across the capacitive element. By subtracting Equation 1 from Equation 2, capacitance C can be determined as a function of the changes in charge and potential.

$$Q + dQ - Q = CV' - CV \qquad \text{Equation 3}$$

$$dQ = C \times (V' - V) \qquad \text{Equation 4}$$

$$\frac{dQ}{dV} = C \qquad \text{Equation 5}$$

The value of the capacitive element's capacitance C is compared to predetermined values for charged and uncharged states of the capacitive element, and the logic state is thus correlated to the capacitance rather than to a voltage appearing at the electrodes on either side of the capacitive element.

In the relationship, $C = K \ast e_0 \ast A/d$ where A is the area of one of the electrodes in contact with the region of dielectric material defining the capacitive element, d is the distance between the electrodes, and $e_0$ is the electrical permittivity of a vacuum ($8.8542 \times 10^{-12}$ F/m), all quantities are constant except for K, relative permittivity. Thus, voltage is related to the change in capacitance of a given capacitive element.

The total polarization of the dielectric is dependent upon at least three different mechanisms of energy storage (as defined by curve fitting to a charging curve). The fastest mechanisms for energy storage (charging) are affected by the state of polarization of the longest-term energy storage mechanism. Thus, as the longest-term energy polarization takes place, a measurement of the faster mechanisms of polarization indicate significant changes. Changes in this fast short-term polarization can be used to determine what the underlying longer-term polarization may be.

The original polarization level of the capacitive element is determined by the measurement of the capacitance of the capacitive element. A calibration curve of the capacitance of a capacitive element to the polarization is used to calculate the original programmed polarization. Methods to do this calculation can be as simple as a look-up table, analog voltage reference levels, or mathematical calculations in a logic device as is well known.

In this way the length of time allowed to elapse between refreshment charges to the capacitive element is greatly extended or practically eliminated altogether. Advantageously, the quantity of charge that is used to determine capacitance should be as practically small as possible for a given noise level of the electronic switching. Methods for the movement of minute charge levels are known to those versed in the art of analog electronics. Determination of the original polarization state of the dielectric can be significantly altered by the application of too much charge for an extended period of time; so, the smallest amount of charge applied singly or in multiple applications generally is used. In this way the capabilities of the memory device are extended by such an amount to make utilization of the method extend into very long-term storage of digital data. Applications such as these are termed non-volatile memory and can be thought to be "permanent" memory and data storage.

A memory device comprising a CESD may be refreshed by (i) charging a capacitive element in the CESD to a voltage V1, wherein the voltage V1 discharges, at least in part, due to leakage over time; (ii) subsequently determining a capacitance C of the capacitive element; (iii) determining, based on the capacitance C, the voltage V1; and recharging the capacitive element to the voltage V1. In some embodiments, capacitance C is correlated to the voltage V1 and the capacitance C remains substantially unchanged as the voltage V1 discharges due to leakage. The capacitive element in the CESD may be charged to the voltage V1 by applying a voltage to a first electrical interconnect connecting electrodes of the first group in series, and grounding (or connecting to Vss) a second electrical interconnect connecting the electrodes of the second group in series. The capacitance C of the capacitive element may be determined by (i) reading a voltage V of the capacitive element; (ii) applying a perturbing charge dQ to the capacitive element, wherein the perturbing charge dQ has a magnitude sufficient to induce a change in the voltage V without inducing a change in the capacitance C; (iii) subsequently reading a voltage V' of the EESD; and (iv) determining the capacitance C, where C=dQ/(V'-V). When activating two electrodes addresses multiple capacitive elements, all addressed capacitive elements are read together, and the values are averaged.

Figure 45:
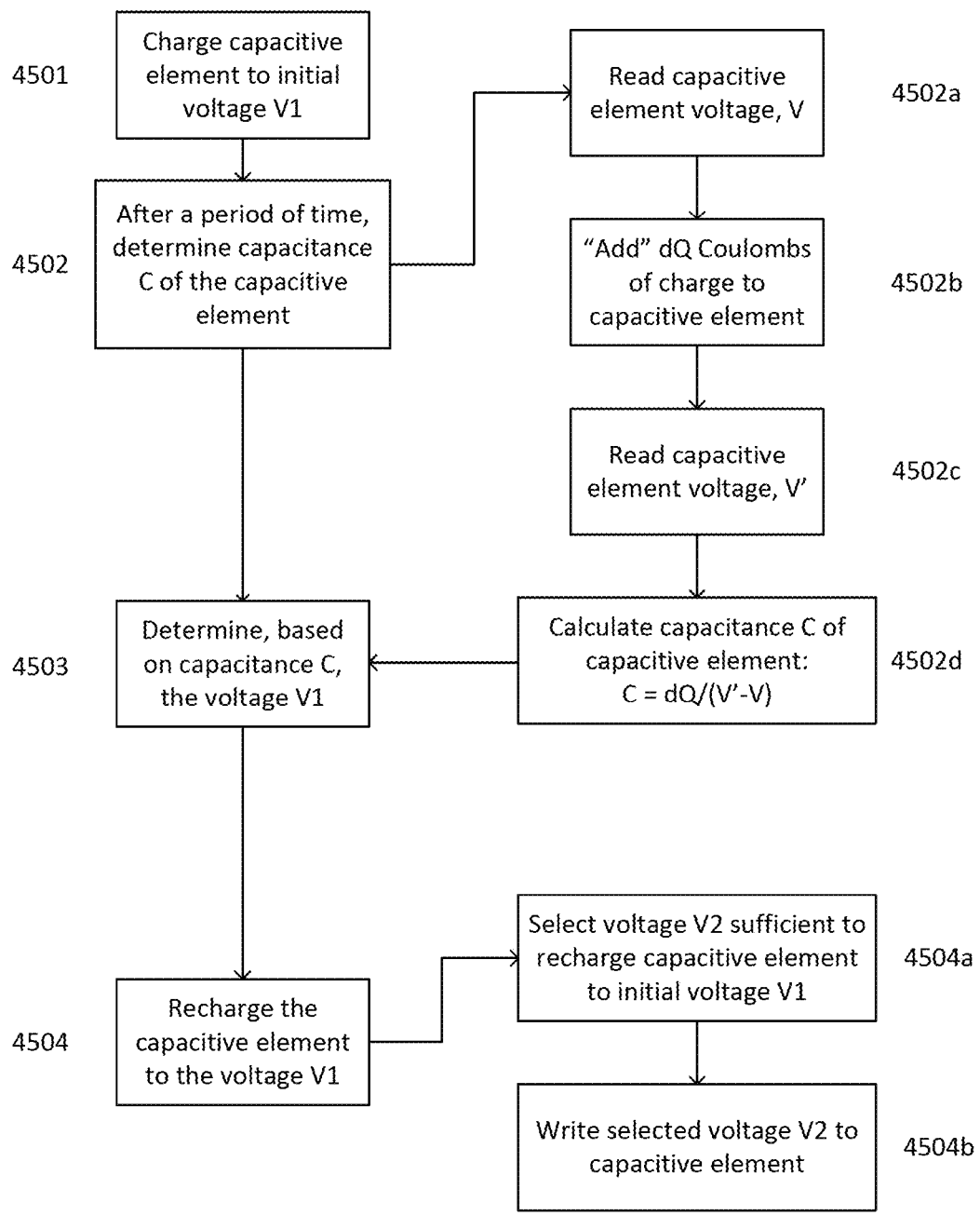
FIG. 45 is a flow diagram illustrating one method of determining the capacitance of a capacitive element in a memory device comprising a CESD and refreshing the CESD.

FIG. 45 is a flow diagram illustrating an exemplary method of determining the capacitance of a capacitive element in a memory device comprising a CESD as disclosed herein, and refreshing the memory device. In step 4501, a capacitive element of the CESD is initially charged to a voltage V1. After a period of time has elapsed, the capacitance C of the capacitive element is determined in step 4502. Determining the capacitance C may include reading the voltage V of the capacitive element (step 4502a), adding a perturbing charge dQ to the capacitive element (step 4502b), reading the subsequent voltage V' of the capacitive element (step 4502c), and calculating the capacitance C of the capacitive element according to Equation 5 (step 4502d). In some embodiments, the perturbing charge dQ has a magnitude approximately equal to a magnitude of discharge due to leakage over time. The magnitude of discharge may be from 0.1-50% of a charge capacity of the capacitive element, such as from 1-50%, 1-25%, 1-10%, or 1-5% of the charge capacity. In certain embodiments, the perturbing charge dQ has a magnitude within a range of $1 \times 10^{-15}$ coulombs to $1 \times 10^{-2}$ coulombs, such as a magnitude from $1 \times 10^{-15}$ coulombs to $1 \times 10^{-6}$ coulombs, from $1 \times 10^{-12}$ coulombs to $1 \times 10^{-6}$ coulombs, or from $1 \times 10^{-12}$ coulombs to $1 \times 10^{-10}$ coulombs. At step 4503, the initial voltage V1 of the capacitive element is determined based on the capacitance C. Determining V1 may be done by comparing capacitance C to predetermined values corresponding to states of charge and discharge of the capacitive element. At step 4504, the capacitive element is recharged to the initial voltage V1. Recharging the capacitive element may be performed by selecting a voltage V2 sufficient to recharge the capacitive element to the initial voltage V1 (step 4504a) and then writing the selected voltage V2 to the capacitive element (step 4504b).

Figure 46:
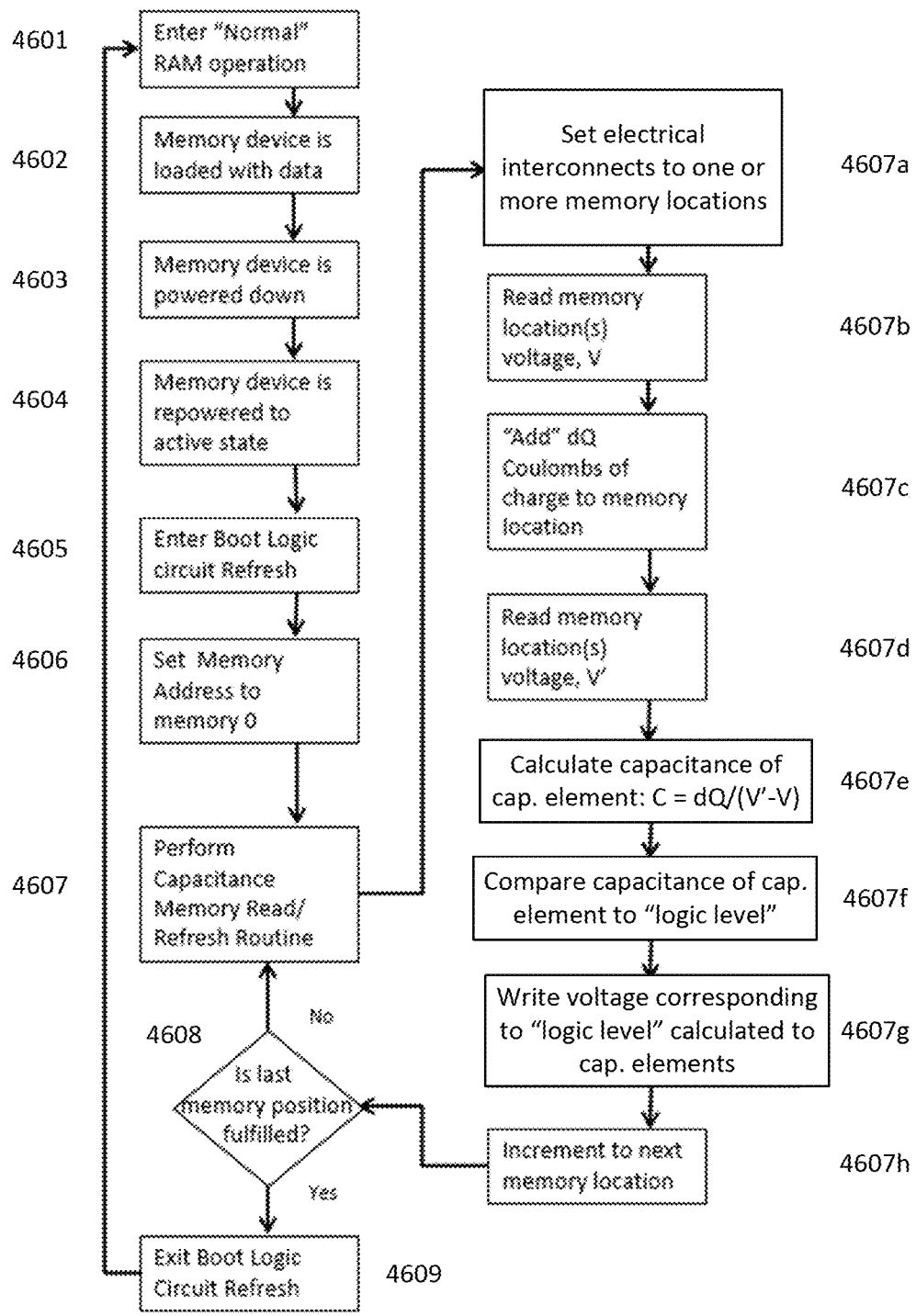
FIG. 46 is a flow diagram illustrating one method of reading a capacitive element in a memory device in ROM mode, the memory device comprising a CESD.

A memory device may be read by connecting one of the first electrical interconnect and the second electrical interconnect to a high impedance sensor, connecting the other of the first electrical interconnect and the second electrical interconnect to Vss, and reading the voltage V1 of the capacitive element with the high impedance sensor. FIG. 46 is a flow diagram illustrating one method of reading a memory device comprising a CESD as disclosed herein.

Upon entering RAM operation (step 4601), the memory device is loaded with data (step 4602). The memory device is subsequently powered down (step 4603). At step 4604, the memory device is repowered to an active state. The memory device then enters a boot logic circuit refresh (step 4605). The memory address is set to memory 0 (step 4606), and a capacitance memory read/refresh routine is initiated (step 4606). In the memory read/refresh routine, electrical interconnects are set to address a memory block (i.e., a plurality of capacitive elements) or individual memory location (i.e., one or more capacitive elements surrounding a single activated electrode (step 4607a), and the voltage V of the memory location(s) is read (step 4607b). A perturbing charge dQ is added to the memory location (step 4607c), and the voltage V' is read (step 4607d). The capacitance of the capacitive element(s) is calculated according to Equation 5 (step 4607e). The capacitance is compared to a logic level (step 4607f). Applying a voltage to a capacitive element modifies the intrinsic capacitance of the dielectric material. Incremental voltages (e.g., voltages in increments of 0.25 V) may be used to modify the intrinsic capacitance in increments, wherein each incremental capacitance corresponds to a logic level of the capacitive element. The intrinsic capacitance remains unchanged when the applied voltage is removed. Thus, the capacitance is indicative of the originally applied voltage. The comparison may be performed, for example, using a look-up table which relates capacitance to initial voltage V. A voltage sufficient to restore the capacitive element voltage back to the initial value V associated with the logic level is selected and written to the capacitive element (step 4607g). The routine then is incremented to the next memory location (step 4607h). At step 4608, a query asks whether the last memory position has been fulfilled. If the answer is no, the memory read/refresh routine is repeated. If the answer is yes, the boot logic circuit refresh is exited at step 4609. In some embodiments, a capacitive element can be charged with incremental voltages to provide eight logic levels and two bits per capacitive element.

Certain representative embodiments are disclosed in the following numbered clauses.

1. A capacitive energy storage device (CESD), comprising: an array of electrodes with spaces between the electrodes, the array of electrodes comprising n groups of electrodes in a plane, where n is an integer greater than or equal to 2, each electrode having a central axis $A_C$ perpendicular to the plane; an electrical interconnect for each group of electrodes, each electrical interconnect connecting electrodes of a group in series; and a dielectric material occupying the spaces between the electrodes and contacting the electrodes, wherein regions of the dielectric material located between adjacent electrodes define capacitive elements.

2. The CESD of clause 1, wherein the array comprises aligned rows of electrodes such that the central axis of each electrode in a row is aligned with the central axis of an electrode in an adjacent row, each row constituting a group of electrodes.

3. The CESD of clause 1, wherein the array comprises staggered rows of electrodes such that the central axis of each electrode in a row is not aligned with the central axes of electrodes in an adjacent row, each row constituting a group of electrodes.

4. The CESD of clause 1, wherein: the array comprises staggered rows of the electrodes such that the central axis of each electrode in a row is not aligned with the central axes of electrodes in an adjacent row; each row further comprises a row electrical interconnect connecting a group of alternating electrodes in the row in series; and groups of staggered electrodes not connected by the row electrical interconnect are connected in columns by column electrical interconnects, the column electrical interconnects being offset from the central axes of the staggered electrodes, wherein there is a vertical spatial separation at each intersection where a row electrical interconnect crosses a column electrical interconnect.

5. The CESD of clause 1, wherein: the array comprises a grid pattern of rows and columns of electrodes, wherein each row comprises electrodes of a row group alternating with electrodes of a plurality of column groups; each row group further comprises a row electrical interconnect connecting each electrode of the row group in series; and each column group further comprises a column electrical interconnect connecting each electrode of the column group in series, wherein there is a vertical spatial separation at each intersection where a row electrical interconnect crosses a column electrical interconnect.

6. The CESD of any one of clauses 3-5, further comprising: an insulative layer disposed between the row electrical interconnects and the column electrical interconnects such that the row electrical interconnects are above the insulative layer and the column electrical interconnects are below the insulative layer; and a via defined by the insulative layer for each electrode of the row group, the via connecting the electrode to the row electrical interconnect.

7. The CESD of clause 6, wherein the insulative layer comprises polymerized p-xylylene or a copolymer comprising p-xylylene and a co-monomer.

8. The CESD of clause 4 or clause 5, wherein: the row electrical interconnect contacts electrodes of the first group at a height $h_1$ above a lower surface of each electrode of the first group; and the column electrical interconnect contacts electrodes of the second group at a height $h_2$ above a lower surface of each electrode of the second group where $h_1 \neq h_2$.

9. The CESD of any one of clauses 1-8 wherein each of the row electrical interconnects and each of the column electrical interconnects has a rectangular, circular, or elliptical cross-sectional profile.

10. The CESD of clause 9, wherein each of the row electrical interconnects and/or the column electrical interconnects comprises an electrically insulated metal, a carbonized polymer, conductive carbon, or an electrically conductive polymer.

11. A capacitive energy storage device (CESD), comprising a unit cell, the unit cell comprising: a plurality of electrodes at least forming a shape of a polygon with an electrode at each vertex of the polygon, a number of electrical interconnects equal to a number of electrodes in the unit cell, each electrical interconnect connected to a single electrode in the unit cell, wherein there is a vertical spatial separation at each intersection of two or more electrical interconnects, and a dielectric material occupying spaces between the electrodes, wherein regions of the dielectric material located between adjacent electrodes define capacitive elements.

12. The CESD of clause 11, further comprising an electrode at a center of the polygon.

13. The CESD of clause 11 or clause 12, wherein the polygon is a hexagon.

14. The CESD of any one of clauses 11-13, further comprising: an insulative layer disposed between intersecting electrical interconnects; and a via defined by the insulative layer to connect an electrical interconnect above the insulative layer to an electrode below the electrical interconnect and insulative layer.

15. The CESD of any one of clauses 11-14, further comprising an array of the unit cells.

16. The CESD of clause 15, wherein the array comprises rows of the unit cells.

17. The CESD of clause 16, wherein: the polygon is a hexagon; the unit cell further comprises an electrode at a center of the hexagon; and the unit cells are staggered in the rows such that a center of a hexagon is aligned with an edge of a hexagon in each of the adjacent rows.

18. The CESD of any one of clauses 15-17, wherein collinear electrodes of a corresponding position in two or more unit cells are connected in series through an electrical interconnect.

19. The CESD of any one of clauses 1-18, further comprising a planar nonconductive substrate, wherein: the array of electrodes is disposed on the substrate, the central axis of each electrode extending generally perpendicular to the substrate; and the dielectric material is disposed on the substrate and occupies the spaces between the electrodes.

20. The CESD of clause 19, wherein the planar nonconductive substrate comprises a nonconductive polymer.

21. The CESD of any one of clauses 1-20, wherein each capacitive element has an intrinsic capacitance, and the intrinsic capacitance is modified by a voltage applied between two electrodes adjacent to the capacitive element.

22. The CESD of any one of clauses 1-21, wherein each electrode has a right circular cylindrical configuration, an elliptic cylindrical configuration, a polygonal cylindrical configuration, a spherical configuration, or a hemispherical configuration.

23. The CESD of clause 22, wherein a central axis-to-central axis spacing between adjacent electrodes is within a range of 5 nm to 5 mm.

24. The CESD of any one of clauses 1-23, wherein each of the electrical connects comprises an electrically insulated metal, a carbonized polymer, conductive carbon, or an electrically conductive polymer.

25. The CESD of clause 24, wherein the electrically insulated metal is a metal coated with a self-assembled monolayer, poly(p-xylylene), or a combination thereof.

26. The CESD of any one of clauses 1-25, wherein: (i) each electrode has a height along the central axis of from 50 nm to 1200 μm; (ii) each electrode in a group of electrodes has substantially the same height along the central axis; (iii) each electrode in the array has substantially the same height along the central axis; or (iv) any combination of (i), (ii), and (iii).

27. A capacitive energy storage device (CESD), comprising: two or more electrodes disposed in a co-spiral arrangement with spaces between the electrodes, wherein the two or more electrodes do not intersect one another; and a dielectric material occupying the spaces between the electrodes and in contact with the electrodes.

28. The CESD of clause 27, wherein the electrodes are spaced equidistant from one another throughout the spiral arrangement.

29. The CESD of clause 27 or clause 28, wherein the co-spiral arrangement has a circular, elliptical, or polygonal shape.

30. The CESD of any one of clauses 1-29, wherein the electrodes comprise conductive carbon, a conductive organic material, a conductive metal, or a semiconductor.

31. The CESD of any one of clauses 1-30, wherein each electrode is anodized or coated with polyp-xylylene).

32. The CESD of any one of clauses 1-31, further comprising an upper sealing layer.

33. The CESD of clause 32, wherein the upper sealing layer comprises polyp-xylylene).

34. The CESD of any one of clauses 1-33, wherein the dielectric material is an electroentropic dielectric material that has a relative permittivity greater than 3.9.

35. The CESD of clause 34, wherein the electroentropic dielectric material comprises a plurality of polymeric molecules.

36. The CESD of clause 35, wherein the polymeric molecules comprise proteins, poly(p-xylylene) poly(maleic acid), acrylic acid polymers, methacrylic acid polymers, polyethylene glycol, urethane polymers, epoxy polymers, silicone polymers, terpenoid polymers, naturally occurring resin polymers, polyisocyanates, or combinations thereof.

37. The CESD of clause 35, wherein the polymeric molecules are poly(p-xylylene), zein, poly(maleic acid), shellac, silicone oil, or a combination thereof.

38. The CESD of any one of clauses 34-37, wherein the electroentropic dielectric material further comprises an inorganic salt.

39. The CESD of clause 38, wherein the inorganic salt comprises a group IIA metal ion, a group IIIA metal ion, or a combination thereof.

40. The CESD of clause 38, wherein the CESD is a component of a memory device, a bulk energy storage device, or a combined memory and energy storage device.

41. A method for making a capacitive energy storage device (CESD) according to any one of clauses 1-26 or 30-40, comprising: forming an array of electrodes at least partially embedded within or in contact with a dielectric material with spaces between the electrodes, the array of electrodes comprising n groups of electrodes arranged in a single plane, where n is an integer greater than or equal to 2, each electrode having a central axis perpendicular to the plane; connecting electrodes of each group in series with an electrical interconnect, thereby forming the CESD.

42. The method of clause 41, wherein forming the array of electrodes at least partially embedded in or in contact with the dielectric material further comprises: forming the array of electrodes; and disposing the dielectric material in the spaces between the electrodes.

43. The method of clause 41 or clause 42, wherein forming the array of electrodes comprises forming the electrodes on a substrate by nanolithography, microlithography, shadow-mask polymerization, or a screeening process.

44. The method of clause 41, wherein forming the array of electrodes at least partially embedded or in contact with in the dielectric material further comprises: forming a layer of a dielectric material on a substrate; and at least partially embedding the electrodes in the dielectric material or placing the electrodes in contact with the dielectric material to form the array of electrodes.

45. The method of clause 43 or clause 44, wherein the substrate is a nonconductive substrate.

46. The method of any one of clauses 43-45, wherein the substrate is a removable carrier layer, the method further comprising removing the substrate after forming the array of electrodes at least partially embedded in or in contact with the dielectric material.

47. The method of any one of clauses 41-46, wherein connecting the electrodes within each group in series comprises: connecting a first group of electrodes in series with a first electrical interconnect; and connecting a second group of electrodes in series with a second electrical interconnect, such that there is a vertical spatial separation at each intersection where the second electrical interconnect crosses the first electrical interconnect.

48. The method of clause 47, further comprising: disposing an insulative layer onto the array of electrodes and the first electrical interconnect such that the first electrical interconnect is below the insulative layer; disposing a second electrical interconnect onto the insulative layer such that the second electrical interconnect is positioned above the insulative layer and above the second group of electrodes; and forming a via through the insulative layer at each position corresponding to an electrode in the second group of electrodes, thereby electrically connecting the second row electrical interconnect to electrodes in the second group in series.

49. The method of any one of clauses 41-48, further comprising depositing an upper sealing layer on the CESD.

50. A method for using a capacitive energy storage device (CESD) according to any one of clauses 1-26 or 30-40, comprising: providing a CESD according to any one of clauses 1-26 or 30-40; and applying a voltage across a capacitive element disposed between an electrode of a first group of electrodes and an adjacent electrode of a second group of electrodes, wherein the capacitive element is a region of the dielectric material located between the electrode of the first group and the adjacent electrode of the second group, thereby charging the capacitive element to a voltage V1.

51. The method of clause 50, wherein applying a voltage across the capacitive element comprises: applying a voltage to a first electrical interconnect connecting electrodes of the first group in series; and connecting a second electrical interconnect to Vss, the second electrical interconnect connecting the electrodes of the second group in series.

52. The method of clause 50 or clause 51, wherein: the CESD comprises an array of aligned or staggered rows of electrodes, each row constituting a group of electrodes, wherein the device comprises a plurality of capacitive elements, each capacitive element defined by a region of the dielectric material located between two electrodes in adjacent rows of electrodes; and applying the voltage charges the plurality of capacitive elements between the adjacent rows of electrodes.

53. The method of clause 50 or clause 51, wherein: the CESD comprises an array of rows and columns of electrodes, wherein each row comprises electrodes of a first group alternating with electrodes of one or more other groups; the first electrical interconnect connects each electrode of the first group in a row in series; a second group of electrodes not connected by the first electrical interconnect are connected in a column in series by the second electrical interconnect; and applying the voltage charges two or more capacitive elements adjacent to one electrode of the first group or the second group.

54. The method of any one of clauses 50-53, further comprising supplying energy from the CESD to a load by: providing a circuit including the CESD and a load connected to the CESD, wherein the capacitive element is charged to the voltage V1; and applying a reversed polarization electric potential across the capacitive element for a discharge period of time, wherein the reversed polarization electric potential is less than the voltage V1 and less than a voltage that would be generated by the capacitive element in a high impedance state, thereby supplying power from the capacitive element to the load.

55. The method of clause 54, wherein applying a reversed polarization electric potential across the capacitive element comprises: connecting one of the first electrical interconnect and the second electrical interconnect to the load; and connecting the other of the first electrical interconnect and the second electrical interconnect to Vss.

56. The method of any one of clauses 50-53, wherein the CESD is a memory device, and the capacitive element has a logic state determined by the voltage applied across the capacitive element.

57. The method of any one of clauses 50-56, wherein the capacitive element has an intrinsic capacitance, and applying the voltage across the capacitive element modifies the intrinsic capacitance.

58. The method of clause 57, wherein the intrinsic capacitance of the capacitive element remains unchanged when the applied voltage is removed.

59. A method of using a memory device, comprising: providing a memory device comprising a capacitive energy storage device (CESD) according to any one of clauses 1-26 or 30-40; and writing to the memory device by applying a voltage across a capacitive element disposed between an electrode of a first group of electrodes and an adjacent electrode of a second group of electrodes, wherein the capacitive element is a region of the dielectric material located between the electrode of the first group and the adjacent electrode of the second group, thereby charging the capacitive element to a voltage V1.

60. The method of clause 59, wherein applying a voltage across the capacitive element comprises: applying a voltage to a first electrical interconnect connecting electrodes of the first group in series; and connecting a second electrical interconnect to Vss, the second electrical interconnect connecting the electrodes of the second group in series.

61. The method of clause 59 or clause 60, further comprising reading the memory device by: connecting one of the first electrical interconnect and the second electrical interconnect to a high impedance sensor; connecting the other of the first electrical interconnect and the second electrical interconnect to Vss; and reading the voltage V1 of the capacitive element with the high impedance sensor.

62. A method of refreshing a memory device, comprising: providing a capacitive energy storage device (CESD) according to any one of clauses 1-26 or 30-40; charging a capacitive element in the CESD to a voltage V1, wherein the voltage V1 discharges, at least in part, due to leakage over time; subsequently determining a capacitance C of the capacitive element; determining, based on the capacitance C, the voltage V1; and recharging the capacitive element to the voltage V1.

63. The method of clause 62, wherein the capacitance C is correlated to the voltage V1 and the capacitance C remains substantially unchanged as the voltage V1 discharges due to leakage.

64. The method of clause 62 or clause 63, wherein charging the capacitive element in the CESD to a voltage V1 comprises: applying a voltage to a first electrical interconnect connecting electrodes of the first group in series; and connecting a second electrical interconnect to Vss, the second electrical interconnect connecting the electrodes of the second group in series.

65. The method of any one of clauses 62-64, wherein determining the capacitance C of the capacitive element comprises: reading a voltage V of the capacitive element; applying a perturbing charge dQ to the capacitive element, wherein the perturbing charge dQ has a magnitude sufficient to induce a change in the voltage V without inducing a change in the capacitance C; subsequently reading a voltage V' of the EESD; and determining the capacitance C, where $C=dQ/(V'-V)$.

66. The method of any one of clauses 62-65, wherein determining the initial voltage V1 prior to leakage comprises comparing the capacitance C of the capacitive element to predetermined capacitance values for the capacitive element in charged and uncharged states, thereby correlating the capacitance C to the voltage V1.

67. The method of any one of clauses 62-66, wherein recharging the CESD to the voltage V1 comprises: selecting a voltage V2 sufficient to recharge the capacitive element to the voltage V1; and writing the selected voltage V2 to the capacitive element, thereby recharging the capacitive element to the voltage V1.

68. A method of supplying energy from a capacitive energy storage device (CESD) to a load, comprising: providing a circuit including a CESD according to any one of clauses 1-26 or 30-40 and a load connected to the CESD, the CESD comprising at least one charged capacitive element that is charged to a first voltage level, wherein the charged capacitive element is disposed between an electrode of a first group of electrodes and an adjacent electrode of a second group of electrodes; and applying a reversed polarization electric potential across the charged capacitive element for a discharge period of time, wherein the reversed polarization electric potential is less than the first voltage level and less than a voltage that would be generated by the charged capacitive element in a high impedance state, thereby supplying power from the charged capacitive element to the load.

69. The method of clause 68, wherein applying a reversed polarization electric potential across the capacitive element comprises: connecting a first electrical interconnect connecting electrodes of the first group in series to the load; and connecting a second electrical interconnect connecting electrodes of the second group in series to Vss.

70. The method of clause 68 or clause 69, wherein the CESD comprises a plurality of charged capacitive elements, the method further comprising applying reversed polarization electric potentials across the plurality of charged capacitive elements for the discharge period of time.

71. A stacked capacitive energy storage device (CESD), comprising: a first electrode; a second electrode parallel to and spaced apart from the first electrode, thereby forming a space between the first and second electrodes; and a stacked arrangement of alternating layers of a dielectric material and a conductive material disposed parallel to the first and second electrodes and occupying the space between the first and second electrodes, wherein the stacked arrangement comprises x layers of a dielectric material, wherein (i) x is an integer greater than or equal to two, (ii) a first layer of the dielectric material is in direct contact with the first electrode, and (iii) layer x of the dielectric material is in direct contact with the second electrode; and y layers of a conductive material, wherein y=x−1 and a layer of the conductive material is positioned between each pair of adjacent layers of the dielectric material.

72. The stacked CESD of clause 71, wherein the dielectric material is a fluid having a viscosity greater than or equal to 0.5 cP.

73. The stacked CESD of clause 71 or clause 72, wherein the dielectric material is an electroentropic dielectric material that has a relative permittivity greater than 3.9.

74. The stacked CESD of clause 73, wherein the electroentropic dielectric material comprises a plurality of polymeric molecules.

75. The stacked CESD of clause 74, wherein the polymeric molecules comprise proteins, polyp-xylylene) poly (maleic acid), acrylic acid polymers, methacrylic acid polymers, polyethylene glycol, urethane polymers, epoxy polymers, silicone polymers, terpenoid polymers, naturally occurring resin polymers, polyisocyanates, or combinations thereof.

76. The stacked CESD of clause 75, wherein the polymeric molecules are polyp-xylylene), zein, poly(maleic acid), shellac, silicone oil, or a combination thereof.

77. The stacked CESD of any one of clauses 71-76, wherein the conductive material comprises a carbonaceous material, a metal, a conductive polymer, or a combination thereof.

78. The stacked CESD of clause 77, wherein the conductive material comprises carbon powder, graphene, graphite, aluminum, polyaniline, or poly(N-methyl pyrrole).

79. The stacked CESD of any one of clauses 71-78, wherein each layer of the dielectric material has a thickness within a range of from 0.0001 μm to 100 μm.

80. The stacked CESD of clause 79, wherein the thickness of each layer of the dielectric material is the same.

81. The stacked CESD of any one of clauses 71-80, wherein each layer of the conductive material has a thickness within a range of from 0.0005 μm to 10000 μm.

82. The stacked CESD of clause 81, wherein the thickness of each layer of the conductive material is the same.

83. The stacked CESD of any one of clauses 71-82, further comprising a nonconductive sealing material in contact with one or more side edges of the stacked arrangement and extending from the first electrode to the second electrode.

84. The stacked CESD of clause 83, wherein the nonconductive sealing material comprises polymerized p-xylylene, a copolymer comprising p-xylylene and a co-monomer, or polyethylene terephthalate.

85. The stacked CESD of any one of clauses 71-84, wherein x is an integer from 2 to 10, and the stacked CESD has a height, as measured from an outwardly facing surface of the first electrode to an outwardly facing surface of the second electrode, within a range of from 10 μm to 2000 μm.

86. The stacked CESD of any one of clauses 71-84, wherein: the first electrode has a cylindrical configuration, an inwardly facing surface, an outwardly facing surface, and an outer diameter; the second electrode has a cylindrical configuration, an inwardly facing surface, an outwardly facing surface, and an inner diameter that is greater than the outer diameter of the first electrode; and the stacked arrangement is disposed between the outwardly facing surface of the first electrode and the inwardly facing surface of the second electrode in concentric alternating layers of the dielectric material and the conductive material.

87. The stacked CESD of clause 86, further comprising an outer nonconductive coating in contact with the outwardly facing surface of the second electrode.

88. A method for making a stacked capacitive energy storage device (CESD), the method comprising: (a) providing a first electrode; (b) forming a stacked arrangement of alternating layers of a dielectric material and a conductive material by (i) applying a layer of a dielectric material to a surface of the first electrode, (ii) applying a layer of a conductive material onto the layer of the dielectric material, and (iii) applying a subsequent layer of the dielectric material onto the layer of the conductive material; and (c) applying a second electrode in contact with an outermost layer of the stacked arrangement.

89. The method of clause 88, further comprising sequentially repeating steps (ii) and (iii) to provide additional alternating layers of the dielectric material and the conductive material, the additional alternating layers terminating with a layer of the dielectric material such that the stacked arrangement includes x layers of the dielectric material alternating with y layers of the conductive material, wherein x is an integer greater than or equal to 2 and y=x−1.

90. The method of clause 88 or clause 89, further comprising applying a nonconductive sealing material in contact with one or more side edges of the stacked arrangement and extending from the first electrode to the second electrode.

91. A capacitive energy storage device (CESD), comprising: a first electrode; a second electrode wrapped in a spiral configuration around the first electrode, wherein there is a space between the first electrode and the second electrode; and a dielectric material occupying the space between the first electrode and the second electrode and in contact with the first electrode and the second electrode, wherein regions of the dielectric material located between the electrodes define capacitive elements.

92. The CESD of clause 91, further comprising a third electrode having a tubular configuration surrounding the first and second electrodes, wherein there is a space between the third tubular electrode and the second electrode, the space filled with the dielectric material.

93. A stacked capacitive energy storage device (CESD), comprising: an array of electrodes with spaces between the electrodes, the array of electrodes comprising n groups of spaced-apart parallel electrodes forming n stacked parallel layers of parallel electrodes where n is an integer greater than or equal to 2, each electrode having a central axis parallel to the layer; and a dielectric material occupying spaces between the electrodes and contacting the electrodes, wherein regions of the dielectric material located between adjacent electrodes define capacitive elements.

92. The stacked CESD of clause 91, wherein the parallel electrodes in each layer are rotated from 0-90° relative to the parallel electrodes in each adjacent layer.

93. The stacked CESD of clause 92, wherein the parallel electrodes in each layer are rotated 90° relative to the parallel electrodes in each adjacent layer.

94. The stacked CESD of any one of clauses 91-93, wherein the stacked CESD has a quadrilateral configuration defining four side edges and each electrode has an end protruding from one side edge of the CESD, the stacked CESD further comprising a conductive material applied to two or more side edges of the stacked CESD and in contact with the ends of electrodes protruding from the side edges to which the conductive material is applied.

95. The stacked CESD of any one of clauses 91-94, wherein the electrodes comprise wires having sinuous curves or wires including periodic protrusions along a length of the wire.

96. The stacked CESD of clause 95, wherein: adjacent electrodes in a layer are oriented such that the sinuous curves or periodic protrusions of the adjacent electrodes are in phase with one another; or adjacent electrodes in a layer are oriented such that the sinuous curves or periodic protrusions of the adjacent electrodes are 180° out of phase with one another.

97. The CESD of any one of clauses 91-96, wherein each capacitive element has an intrinsic capacitance, and the intrinsic capacitance is modified by a voltage applied between two electrodes adjacent to the capacitive element.

98. The CESD of any one of clauses 91-97, wherein each electrode has a right circular cylindrical configuration, an elliptic cylindrical configuration, a polygonal cylindrical configuration, a spherical configuration, or a hemispherical configuration.

99. The CESD of clause 98, wherein a central axis-to-central axis spacing between adjacent electrodes is within a range of 5 nm to 5 mm.

100. The CESD of any one of clauses 91-99, wherein the electrodes comprise conductive carbon, a conductive organic material, a conductive metal, or a semiconductor.

101. The CESD of any one of clauses 91-100, wherein each electrode is anodized or coated with poly(p-xylylene).

102. The CESD of any one of clauses 91-101, wherein the dielectric material is an electroentropic dielectric material that has a relative permittivity greater than 3.9.

103. The CESD of clause 102, wherein the electroentropic dielectric material comprises a plurality of polymeric molecules.

104. The CESD of clause 103, wherein the polymeric molecules comprise proteins, poly(p-xylylene) poly(maleic acid), acrylic acid polymers, methacrylic acid polymers, polyethylene glycol, urethane polymers, epoxy polymers, silicone polymers, terpenoid polymers, naturally occurring resin polymers, polyisocyanates, or combinations thereof.

105. The CESD of clause 103, wherein the polymeric molecules are poly(p-xylylene), zein, poly(maleic acid), shellac, silicone oil, or a combination thereof.

106. The CESD of any one of clauses 102-105, wherein the electroentropic dielectric material further comprises an inorganic salt.

107. The CESD of clause 106, wherein the inorganic salt comprises a group IIA metal ion, a group IIIA metal ion, or a combination thereof.

108. A method of making a stacked capacitive energy storage device (CESD) according to any one of clauses 91-107, comprising: forming an array of electrodes embedded within a dielectric material with spaces between the electrodes, the array of electrodes comprising n groups of parallel electrodes arranged in n stacked parallel planes where n is an integer greater than or equal to 2, each electrode having a central axis parallel to the stacked parallel planes.

109. The method of clause 108, wherein forming the array of electrodes embedded within the dielectric material comprises: forming the array of electrodes; and disposing the dielectric material in the spaces between the electrodes.

110. The method of clause 108, wherein forming the array of electrodes embedded within the dielectric material comprises: (a) forming a first layer of a dielectric material on a substrate; (b) at least partially embedding a first group of electrodes in the dielectric material; (c) forming a subsequent layer of the dielectric material atop the first layer; (d) at least partially embedding a subsequent group of electrodes in the subsequent layer; and (e) repeating steps (c) and (d) until n stacked parallel layers are formed.

111. The method of clause 108, wherein forming the array of electrodes embedded within the dielectric material comprises: (a) forming a first layer of a dielectric material on a substrate; (b) forming a plurality of parallel troughs in an upper surface of the first layer of the dielectric material; (c) placing or forming an electrode in each of the parallel troughs in the first layer to form a first group of electrodes; (d) forming a subsequent layer of the dielectric material atop the first layer; (e) forming a plurality of parallel troughs in an upper surface of the subsequent layer of the dielectric material; (f) placing or forming an electrode in each of the parallel troughs in the subsequent layer to form a subsequent group of electrodes; (g) repeating steps (d)-(f) until n stacked parallel planes are formed; and (h) forming an upper layer of dielectric material atop the nth parallel plane.

112. The method of any one of clauses 107-111, wherein the CESD has a quadrilateral configuration defining four side edges, the method further comprising applying a conductive material to at least two adjacent side edges.

113. A method for using a stacked capacitive energy storage device (CESD) according to any one of clauses 91-107, comprising: providing a stacked CESD according to any one of clauses 91-107; and applying a voltage across a capacitive element disposed between two adjacent electrodes, wherein the capacitive element is a region of the dielectric material located between the adjacent electrodes, thereby charging the capacitive element to a voltage V1.

114. The method of clause 113, wherein providing the stacked CESD comprises providing a stacked CESD according to clause 94 having a first conductive material applied to a first side edge of the stacked CESD and a second conductive material applied to an adjacent side edge of the stacked CESD and wherein the two adjacent electrodes are in adjacent layers of the stacked CESD, the method further comprising: applying a voltage to the first conductive material; and connecting the second conductive material to Vss.

115. The method of clause 113, wherein providing the stacked CESD comprises providing a stacked CESD according to clause 94 having a first conductive material applied to a first side edge of the stacked CESD and a second conductive material applied to an opposing side of the stacked CESD and wherein the two adjacent electrodes are in a single layer of the stacked CESD, the method further comprising: applying a voltage to the first conductive material; and connecting the second conductive material to Vss.

116. The method of any one of clauses 113-116, further comprising supplying energy from the stacked CESD to a load by: providing a circuit including the stacked CESD and a load connected to the stacked CESD, wherein the capacitive element is charged to the voltage V1; and applying a reversed polarization electric potential across the capacitive element for a discharge period of time, wherein the reversed polarization electric potential is less than the voltage V1 and less than a voltage that would be generated by the capacitive element in a high impedance state, thereby supplying power from the capacitive element to the load.

117. The method of clause 116, wherein applying a reversed polarization electric potential across the capacitive element comprises: connecting one of the first conductive material and the second conductive material to the load; and connecting the other of the first conductive material and the second conductive material to Vss.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A capacitive energy storage device (CESD), comprising:
an array of electrodes comprising n groups of electrodes in one or more planes, where n is an integer greater than 2, each electrode having a central axis $A_C$ perpendicular to the plane in which the electrode is located, the array comprising a grid pattern of a plurality of rows of electrodes in each of the one or more planes with spaces between the electrodes, each of the plurality of rows in a plane constituting a group of electrodes;

a separate row electrical interconnect for each group of electrodes, each row electrical interconnect comprising an electrically conductive filament connecting electrodes of a group in series, wherein a width of the electrodes forming the array of electrodes, as viewed in a top plan view, is larger than a width of the row electrical interconnect;

a separate edge connector for each separate row electrical interconnect, wherein a terminal end of the row electrical interconnect is coupled to the edge connector; and a dielectric material occupying the spaces between the electrodes and contacting the electrodes, wherein regions of the dielectric material located between adjacent electrodes define capacitive elements, wherein the array comprises staggered rows of electrodes in each of the one or more planes such that the central axis of each electrode in a row is not aligned with the central axes of electrodes in an adjacent row; or the array comprises offset diagonal rows of electrodes in each of the one or more planes.

2. The CESD of claim 1, wherein a central axis-to-central axis spacing between adjacent electrodes is within a range of 5 nm to 5 mm.

3. The CESD of claim 1, wherein each of the row electrical interconnects comprises an electrically insulated metal, a carbonized polymer, conductive carbon, or an electrically conductive polymer.

4. The CESD of claim 1, wherein the electrodes comprise conductive carbon, a conductive organic material, a conductive metal, or a semiconductor.

5. The CESD of claim 1, further comprising a planar nonconductive substrate, wherein:

the array of electrodes is disposed on the substrate, the central axis $A_C$ of each electrode extending generally perpendicular to the substrate; and the dielectric material is disposed on the substrate and occupies the spaces between the electrodes.

6. The CESD of claim 1, wherein each capacitive element has an intrinsic capacitance, and the intrinsic capacitance is modified by a voltage applied between two electrodes adjacent to the capacitive element.

7. The CESD of claim 1, wherein each electrode has a right circular configuration, an elliptic cylindrical configuration, a polygonal cylindrical configuration, a spherical configuration, or a hemispherical configuration.

8. The CESD of claim 1, wherein:
(i) each electrode has a height along the central axis of from 50 nm to 1200 µm; or
(ii) each electrode in a group of electrodes has substantially the same height along the central axis; or
(iii) each electrode in the array has substantially the same height along the central axis; or
(iv) any combination of (i), (ii), and (iii).

9. The CESD of claim 1, wherein the dielectric material has a relative permittivity greater than 3.9.

10. The CESD of claim 1, wherein the dielectric material comprises a conductive or nonconductive polymer, an inorganic metal oxide, a mixture of metal oxides, or any combination thereof.

11. A capacitive energy storage device (CESD) stack, comprising:

a plurality of stacked CESDs according to claim 1, each CESD further comprising a non-conductive substrate on which the electrodes are disposed; and a plurality of stacked CESDs according to claim 1 and an insulative sealing layer disposed between each pair of adjacent CESDs in the CESD stack.

12. A method for using a capacitive energy storage device (CESD), comprising:

providing a CESD according to claim 1; and applying a voltage across a capacitive element disposed between an electrode of a first group of electrodes and an adjacent electrode of a second group of electrodes, wherein the capacitive element is a region of the dielectric material located between the electrode of the first group and the adjacent electrode of the second group, thereby charging the capacitive element to a voltage V1.

13. The method of claim 12, wherein applying a voltage across the capacitive element comprises:

applying a voltage to a first row electrical interconnect connecting electrodes of the first group in series; and connecting a second row electrical interconnect to Vss, the second row electrical interconnect connecting the electrodes of the second group in series.

14. The method of claim 12, further comprising supplying energy from the CESD to a load by:

providing a circuit including the CESD and a load connected to the CESD, wherein the capacitive element is charged to the voltage V1; and applying a reversed polarization electric potential across the capacitive element for a discharge period of time, wherein the reversed polarization electric potential is less than the voltage V1 and less than a voltage that would be generated by the capacitive element in a high impedance state, thereby supplying power from the capacitive element to the load.

15. The CESD of claim 1, wherein the array comprises offset diagonal rows of electrodes in each of the one or more planes.

16. A method of making a capacitive energy storage device (CESD), comprising:

forming an array of electrodes at least partially embedded within or in contact with a dielectric material, the array of electrodes comprising n groups of electrodes arranged in a single plane, where n is an integer greater than 2, each electrode having a central axis $A_C$ perpendicular to the plane, the array comprising a grid pattern of rows of electrodes with spaces between the electrodes, each row constituting a group of electrodes, wherein the array comprises staggered rows of electrodes such that the central axis of each electrode in a row is not aligned with the central axes of electrodes in an adjacent row, or the array comprises offset diagonal rows of electrodes;

separately connecting electrodes of each group in series with a separate row electrical interconnect, each row electrical interconnect comprising an electrically conductive filament connecting electrodes of a group in series, wherein a width of the electrodes forming the array of electrodes, as viewed in a top plan view, is larger than a width of the row electrical interconnect; and connecting a terminal end of each separate row electrical interconnect to a separate edge connector, thereby forming the CESD.

17. The method of claim 16, wherein forming the array of electrodes at least partially embedded within the dielectric material comprises:

forming the array of electrodes; and disposing the dielectric material in the spaces between the electrodes.

18. The method of claim 16, wherein forming the array of electrodes comprises forming the electrodes on a substrate by nanolithography, microlithography, shadow-mask polymerization, laser marking, imprint, inkjet, gravure, flexographic, or a screen printing process.

19. The method of claim 16, wherein forming the array of electrodes embedded within the dielectric material comprises:
   forming a layer of a dielectric material on a substrate; and
   at least partially embedding the electrodes in the dielectric material or placing the electrodes in contact with the dielectric material to form the array of electrodes.

20. The method of claim 19, further comprising:
   patterning the dielectric material to form a plurality of cavities in the dielectric material; and
   filling the cavities with an electrode material, thereby at least partially embedding the electrodes in the dielectric material.

* * * * *